US007060578B2

United States Patent
Satoh et al.

(10) Patent No.: US 7,060,578 B2
(45) Date of Patent: Jun. 13, 2006

(54) SEMICONDUCTOR DEVICE AND METHOD OF FABRICATING THE SAME

(75) Inventors: Shigeo Satoh, Kawasaki (JP); Masataka Kase, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 224 days.

(21) Appl. No.: 10/648,487

(22) Filed: Aug. 27, 2003

(65) Prior Publication Data

US 2004/0041177 A1  Mar. 4, 2004

(30) Foreign Application Priority Data

Aug. 30, 2002 (JP) .................................. 2002-254672

(51) Int. Cl.
*H01L 21/336* (2006.01)

(52) U.S. Cl. .................. 438/302; 438/303; 438/525
(58) Field of Classification Search ................ 438/299, 438/302, 303, 305, 306, 307, 525
See application file for complete search history.

(56) References Cited

U.S. PATENT DOCUMENTS

| 4,962,054 | A  | * | 10/1990 | Shikata ..................... 438/525 |
| 6,194,278 | B1 | * | 2/2001  | Rengarajan ................ 438/302 |
| 6,413,843 | B1 | * | 7/2002  | Hara ......................... 438/525 |
| 6,458,665 | B1 | * | 10/2002 | Kim .......................... 438/302 |
| 6,458,666 | B1 | * | 10/2002 | Wasshuber .................. 438/302 |

* cited by examiner

*Primary Examiner*—Kevin M. Picardat
(74) *Attorney, Agent, or Firm*—Westerman, Hattori Daniels & Adrian, LLP

(57) ABSTRACT

An impurity having a conductivity type same as that contained in a source-and-drain region is implanted to an exposed surface of a gate electrode along a direction inclined to the surface of said semiconductor substrate, while using over-etched sidewalls as a mask, where the gate electrode is implanted both at the top surface and the upper portion of one side face thereof, whereas one of the source-and-drain regions is implanted with the impurity in an amount possibly attained by a single implantation, but the other portion is not implanted or only slightly implanted to a less affective degree.

18 Claims, 41 Drawing Sheets

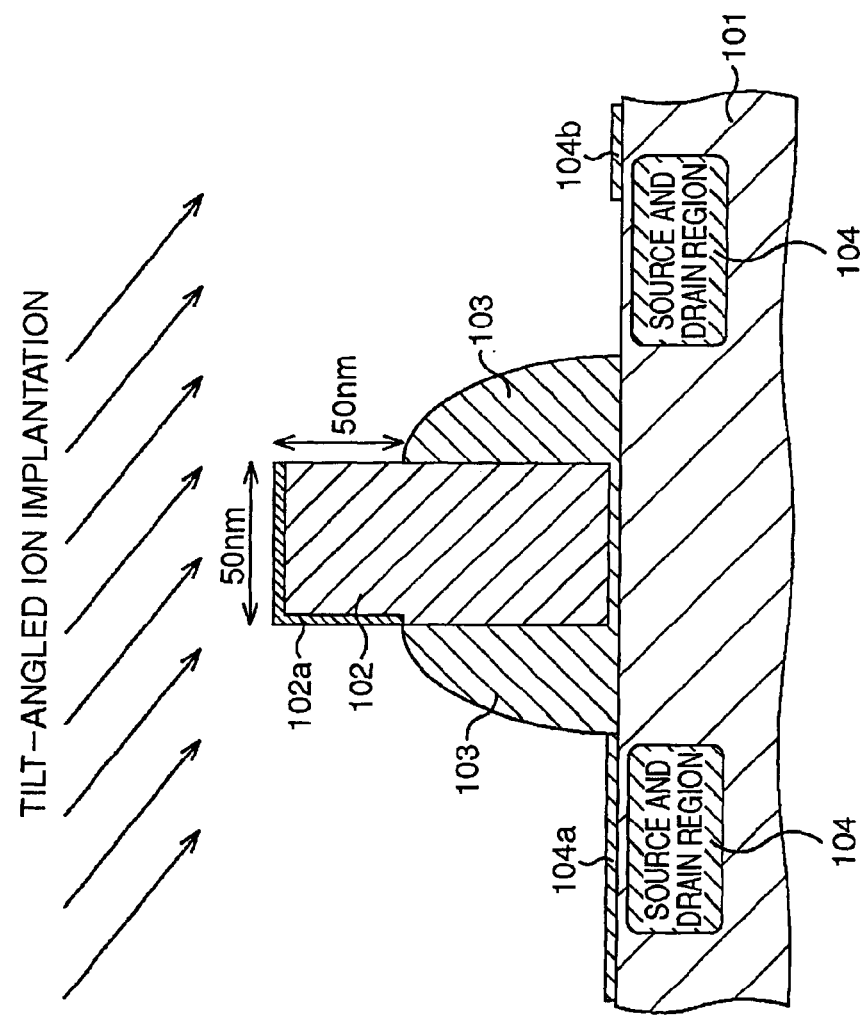

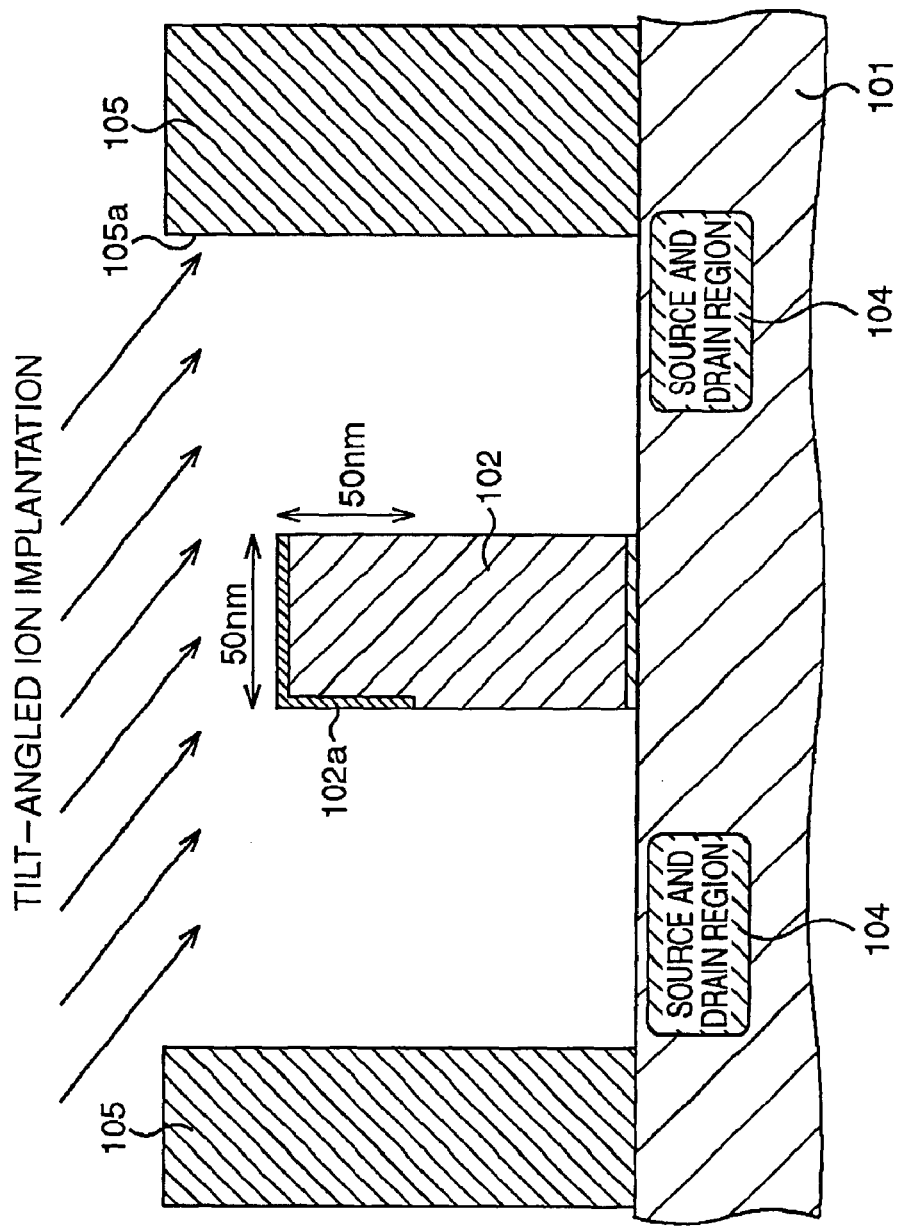

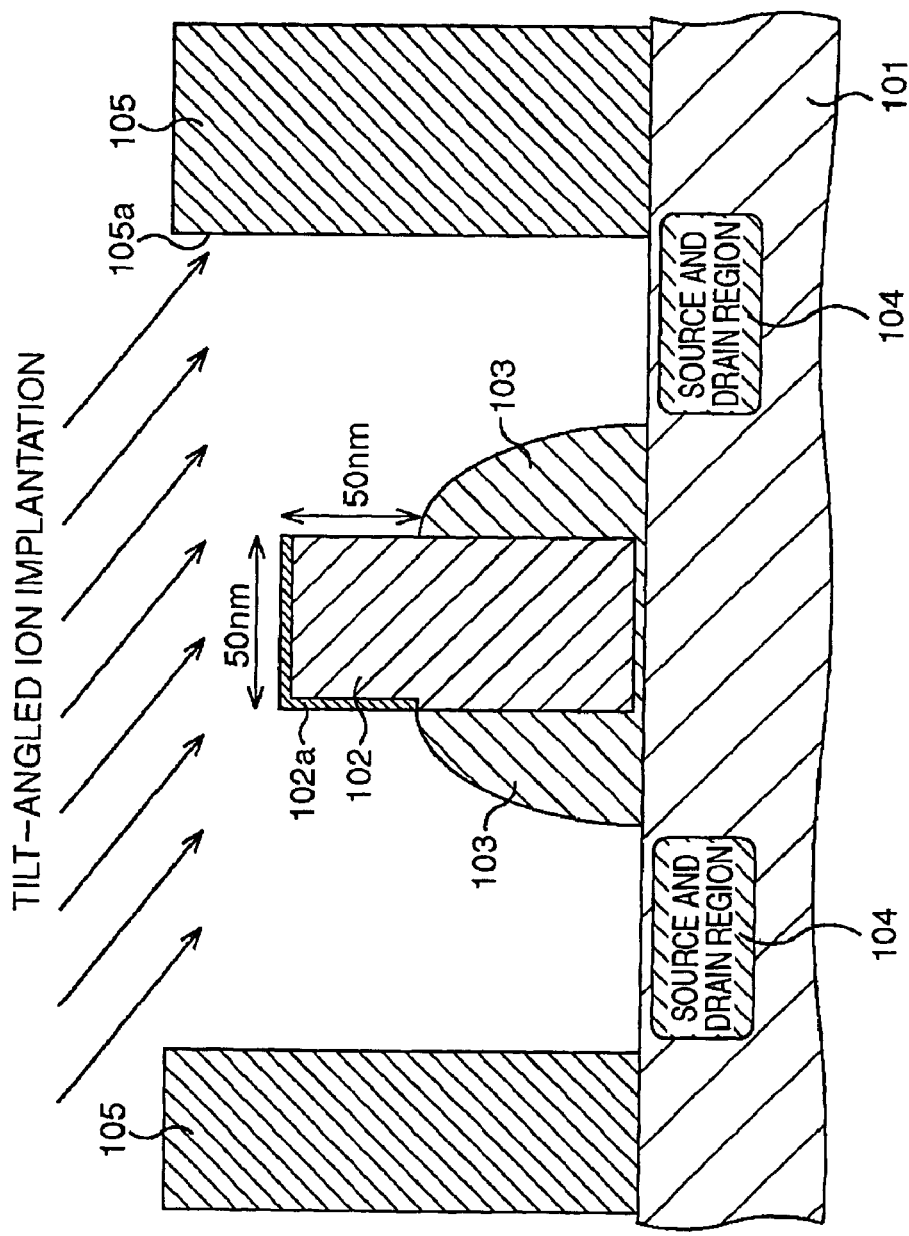

STI FORMATION nMOS WELL FORMATION, CHANNEL IMPLANTATION pMOS WELL FORMATION, CHANNEL IMPLANTATION

ANNEALING (RTA, 1,000°C, 3 sec)

GATE OXIDATION

POLYSILICON DEPOSITION

POLYSILICON ETCHING nMOS EXTENSION AND POCKET IMPLANTATIONS

PMOS EXTENSION AND POCKET IMPLANTATIONS

ANNEALING (RTA, 1,000°C, 1 sec)

SIDEWALL FORMATION nMOS S/D ION IMPLANTATION (P, 8 keV, $4.5 \times 10^{15}$, 0°)

pMOS S/D ION IMPLANTATION (B, 4 keV, $2.25 \times 10^{15}$, 0°)

SIDEWALL THINNING (DRY ETCHING, THINNED BY 50 nm)

ADDITIONAL IMPLANTATION FOR nMOS GATE (P, 4 keV, 5 × 10$^{14}$ × 4, 45°)

ADDITIONAL IMPLANTATION FOR pMOS GATE (B, 2 keV, 2.5 × 10$^{14}$ × 4, 45°)

ANNEALING (RTA, 1,030°C, 1 sec)

CoSi$_2$ FORMATION, METALLIZATION

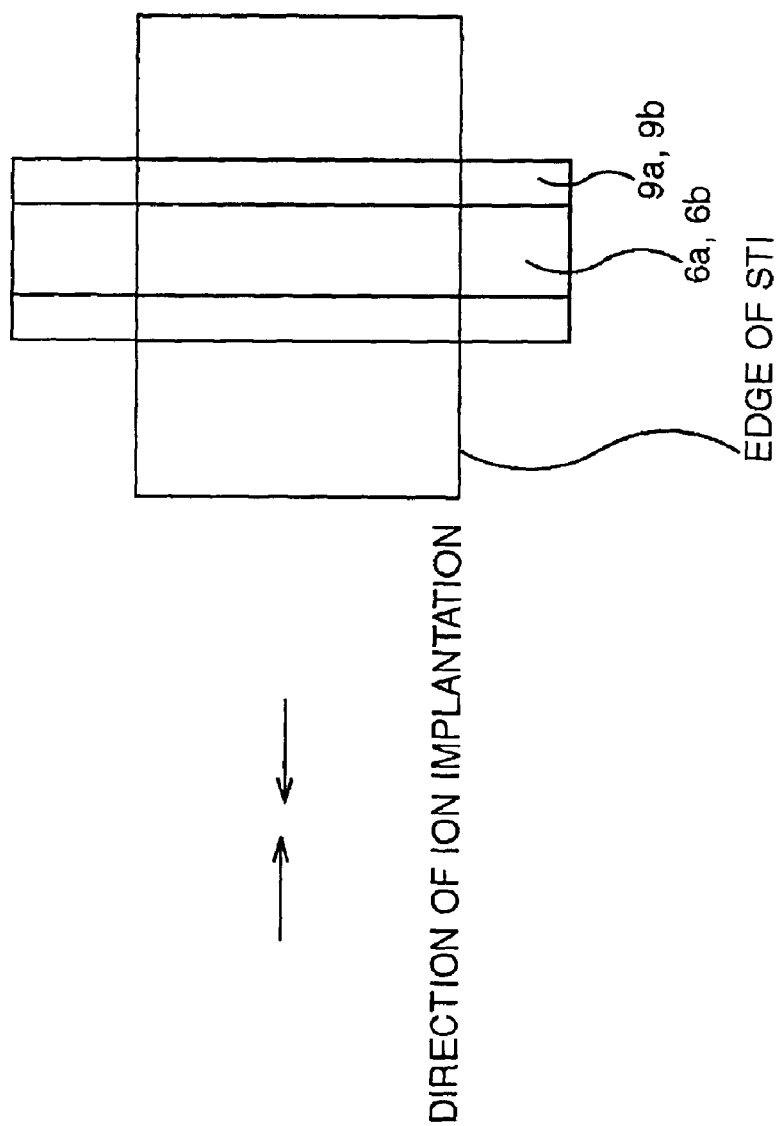

PROCESS STEPS BEFORE ANNEALING ARE SAME AS THOSE IN THE FIRST EMBODIMENT SHOWN IN FIG. 8B

ANNEALING (RTA, 1,030°C, 1 sec)

OXIDE FILM DEPOSITION

OXIDE FILM ETCH-BACK $CoSi_2$ FORMATION, METALLIZATION

PROCESS STEPS BEFORE SIDEWALL FORMATION ARE SAME AS THOSE IN THE FIRST EMBODIMENT SHOWN IN FIG. 6B

SIDEWALL FORMATION nMOS S/D ION IMPLANTATION (P, 8 keV, $5 \times 10^{15}$, 0°)

pMOS S/D ION IMPLANTATION (B, 4 keV, $2.5 \times 10^{15}$, 0°)

SIDEWALL THINNING (DRY ETCHING, THINNED BY 50 nm)

ADDITIONAL IMPLANTATION FOR nMOS GATE (P, 4 keV, $5 \times 10^{14} \times 4$, 45°)

ADDITIONAL IMPLANTATION FOR pMOS GATE (B, 2 keV, $2.5 \times 10^{14} \times 4$, 45°)

ANNEALING (RTA, 1,030°C, 1 sec)

$CoSi_2$ FORMATION, METALLIZATION

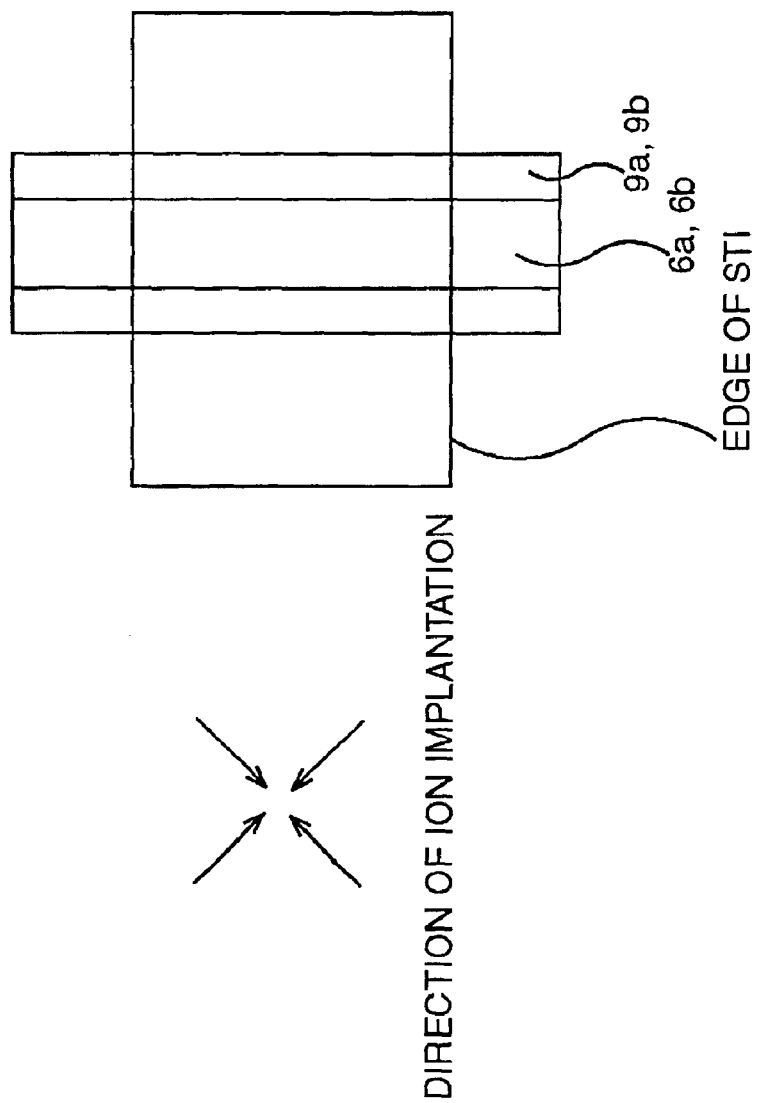

PROCESS STEPS BEFORE SIDEWALL FORMATION ARE SAME AS THOSE IN THE FIRST EMBODIMENT SHOWN IN FIG. 6B

SIDEWALL FORMATION nMOS S/D ION IMPLANTATION (P, 8 keV, $5 \times 10^{15}$, 0°)

pMOS S/D ION IMPLANTATION (B, 4 keV, $2.5 \times 10^{15}$, 0°)

SIDEWALL THINNING (DRY ETCHING, THINNED BY 50 nm)

ADDITIONAL IMPLANTATION FOR nMOS GATE (P, 4 keV, $5 \times 10^{14} \times 4$, 45°)

ADDITIONAL IMPLANTATION FOR pMOS GATE (B, 2 keV, $2.5 \times 10^{14} \times 4$, 45°)

ANNEALING (RTA, 1,030°C, 1 sec)

$CoSi_2$ FORMATION, METALLIZATION

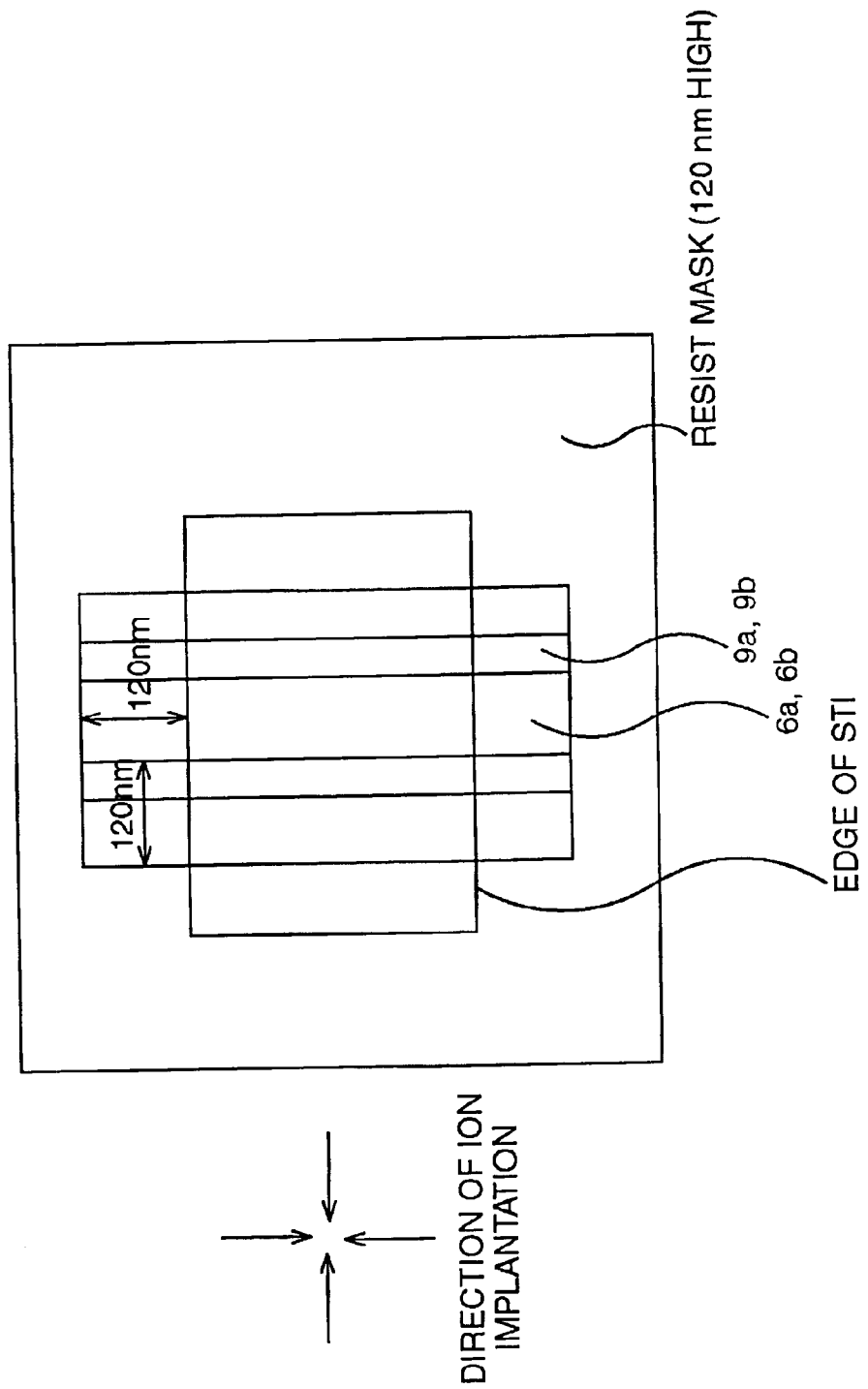

PROCESS STEPS BEFORE pMOS S/D ION IMPLANTATION ARE SAME AS THOSE IN THE FIRST EMBODIMENT SHOWN IN FIG. 6B

SIDEWALL FORMATION nMOS S/D ION IMPLANTATION (P, 8 keV, $6 \times 10^{15}$, 0°)

pMOS S/D ION IMPLANTATION (B, 4 keV, $3 \times 10^{15}$, 0°)

SIDEWALL THINNING (DRY ETCHING, THINNED BY 50 nm)

ADDITIONAL IMPLANTATION FOR nMOS GATE (P, 4 keV, $5 \times 10^{14} \times 4$, 45°)

ADDITIONAL IMPLANTATION FOR pMOS GATE (B, 2 keV, $2.5 \times 10^{14} \times 4$, 45°)

ANNEALING (RTA, 1,030°C, 1 sec)

$CoSi_2$ FORMATION, METALLIZATION

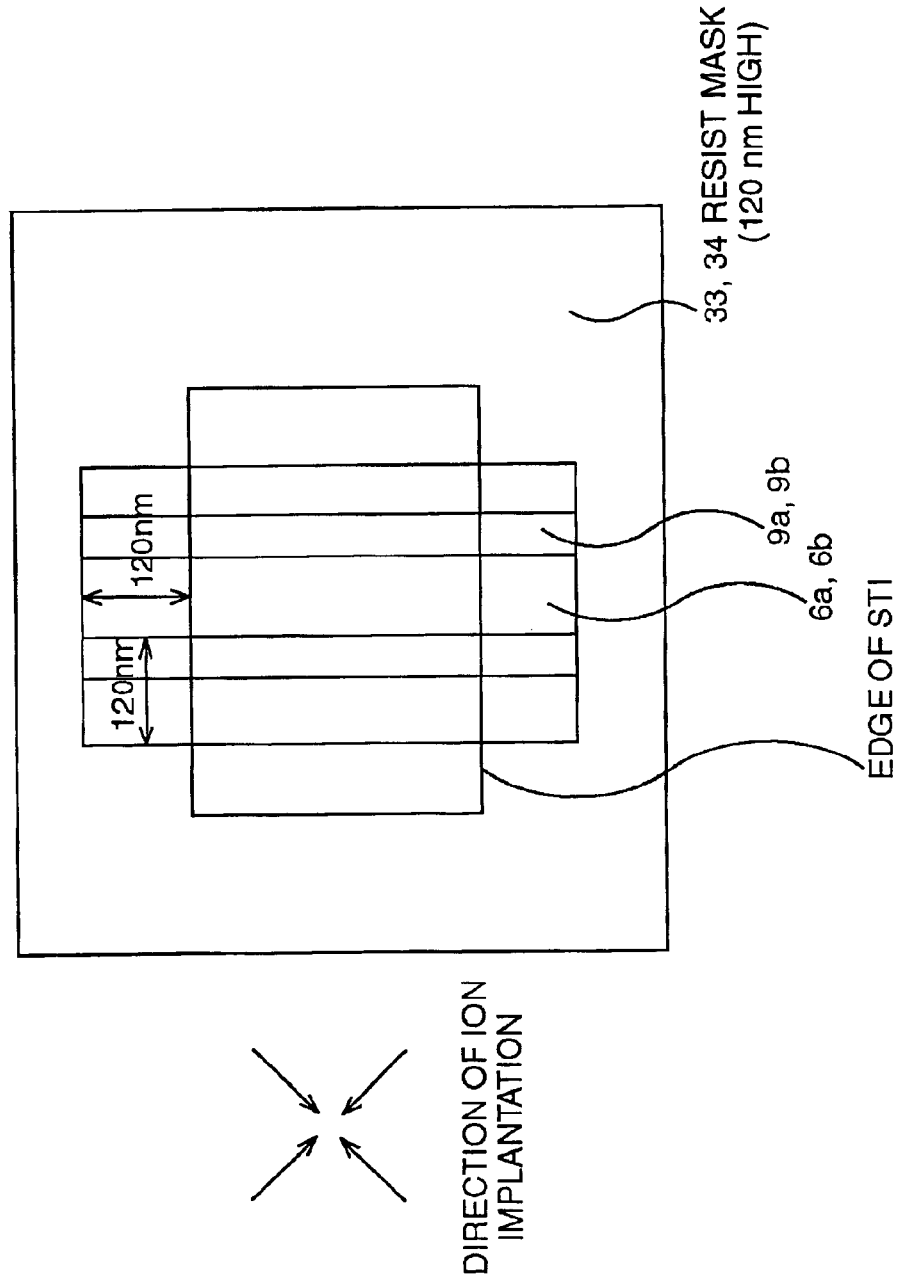

PROCESS STEPS BEFORE PLYSILICON ETCHING ARE SAME AS THOSE IN THE FIRST EMBODIMENT SHOWN IN FIG.5C

POLYSILICON ETCHING nMOS GATE IMPLANTATION (P, 4 keV, $5 \times 10^{14} \times 4$, 45°)

pMOS GATE IMPLANTATION (B, 2 keV, $2.5 \times 10^{14} \times 4$, 45°)

nMOS EXTENSION AND POCKET ION IMPLANTATION pMOS EXTENSION AND POCKET ION IMPLANTATION

ANNEALING (RTA, 1,000°C, 1 sec)

SIDEWALL FORMATION nMOS S/D ION IMPLANTATION (P, 8 keV, 6 × 10$^{15}$, 0°)

pMOS S/D ION IMPLANTATION (B, 4keV, 3×10$^{15}$, 0°)

ANNEALING (RTA, 1,030°C, 1 sec)

CoSi$_2$ FORMATION

METALLIZATION

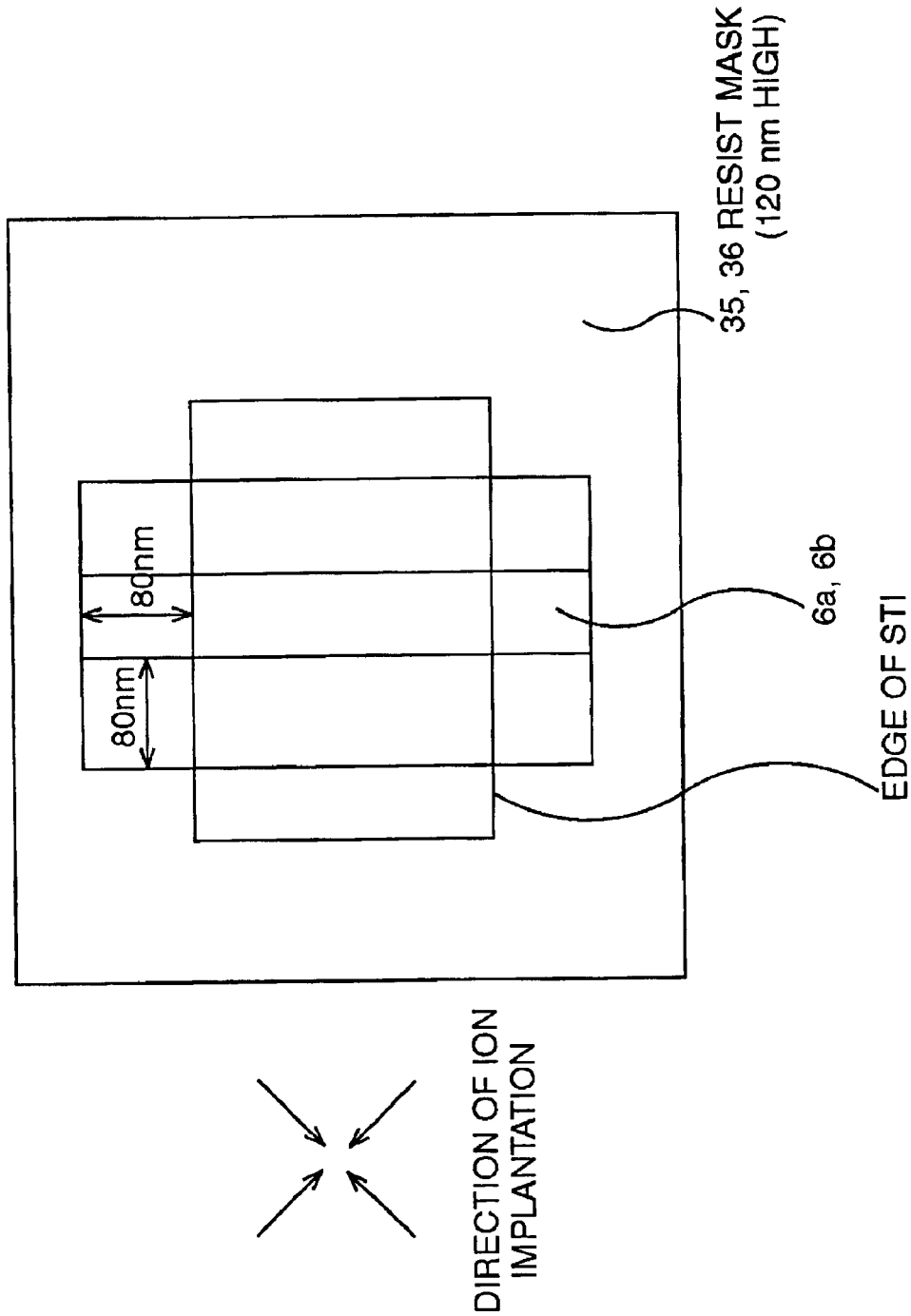

PROCESS STEPS BEFORE PLYSILICON ETCHING ARE SAME AS THOSE IN THE FIRST EMBODIMENT SHOWN IN FIG.5C nMOS GATE IMPLANTATION (P, 4 keV, $5 \times 10^{14} \times 4$, 45°)

nMOS EXTENSION IMPLANTATION (0°) AND POCKET IMPLANTATION (15°)

pMOS GATE IMPLANTATION (B, 24 keV, $2.5 \times 10^{14} \times 4$, 45°)

pMOS EXTENSION IMPLANTATION (0°) AND POCKET IMPLANTATION (15°)

ANNEALING (RTA, 1,000°C, 1 sec)

SIDEWALL FORMATION nMOS S/D ION IMPLANTATION (P, 8keV, $6.0 \times 10^{15}$, 0°)

pMOS S/D ION IMPLANTATION (B, 4keV, $3 \times 10^{15}$, 0°)

ANNEALING (RTA, 1,030°C, 1 sec)

$CoSi_2$ FORMATION

METALLIZATION

TRIMMED RESIST PREVENTS POCKET FROM BEING HIDDEN THEREWITH, AND MODERATES RESTRICTION ON ANGLE OF INCIDENCE OF POCKET IMPLANTATION.

nMOS GATE IMPLANTATION (P, 4 keV, $5 \times 10^{14} \times 4$, 45°)

RESIST TRIMMING (20 nm)

nMOS EXTENSION IMPLANTATION (0°) AND POCKET IMPLANTATION (30°)

pMOS GATE IMPLANTATION (B, 2 keV, $2.5 \times 10^{14} \times 4$, 45°)

RESIST TRIMMING (20 nm)

pMOS EXTENSION IMPLANTATION (0°)
AND POCKET IMPLANTATION (30°)

POLYSILICON ETCHING nMOS GATE IMPLANTATION (P, 4 keV, $5 \times 10^{14} \times 4$, 45°)

pMOS GATE IMPLANTATION (B, 2 keV, $2.5 \times 10^{14} \times 4$, 45°)

ANNEALING (RTA, 1,050°C, 1 sec)

nMOS EXTENSION AND POCKET ION IMPLANTATIONS pMOS EXTENSION AND POCKET ION IMPLANTATIONS

ANNEALING (RTA, 1,000°C, 1 sec)

SIDEWALL FORMATION

FIG. 32A

THE EIGHTH EMBODIMENT CAN LOWER THE ANNEALING TEMPERATURE AT THE STEP OF FIG. 32C THAN IN THE SIXTH EMBODIMENT SINCE THE SUBSTRATE IS ONCE ANNEALED IN THE STEP OF FIG. 30D, WHICH CAN SUPPRESS POCKET DIFFUSION AND SHORT-CHANNEL EFFECT.

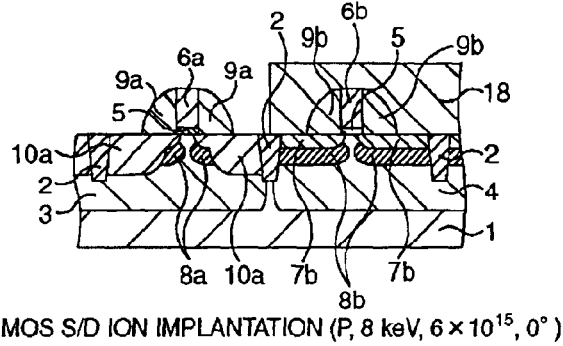

nMOS S/D ION IMPLANTATION (P, 8 keV, $6 \times 10^{15}$, 0°)

FIG. 32B

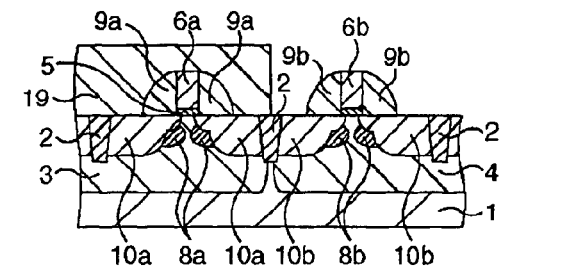

pMOS S/D ION IMPLANTATION (B, 4 keV, $3 \times 10^{15}$, 0°)

FIG. 32C

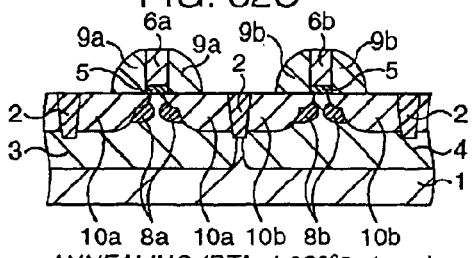

ANNEALING (RTA, 1,020°C, 1 sec)

FIG. 32D

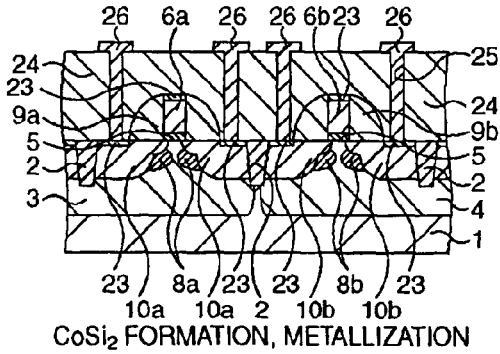

$CoSi_2$ FORMATION, METALLIZATION

FIG. 33A

THE SIXTH EMBODIMENT APPLIED TO SINGLE-DRAIN STRUCTURE.
AN ADVANTAGE RESIDES IN A LESS NUMBER OF PROCESS STEPS.

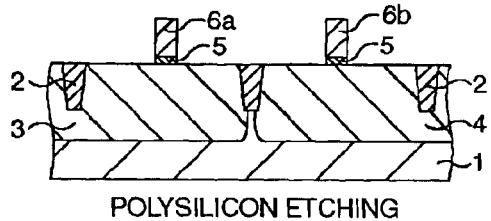

POLYSILICON ETCHING

FIG. 33B

IMPLANTED 4 TIMES
AT 45° INCIDENCE TO          AREA TO BE INTRODUCED WITH IMPURITY BY
GATE LENGTH                  ADDITIONAL IMPLANTATION (PER ONE DIRECTION)

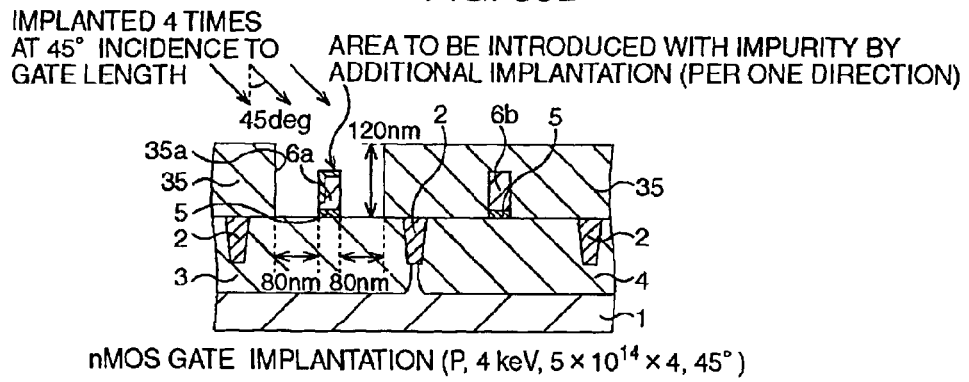

nMOS GATE IMPLANTATION (P, 4 keV, $5 \times 10^{14} \times 4$, 45°)

FIG. 33C

AREA TO BE INTRODUCED WITH IMPURITY BY
ADDITIONAL IMPLANTATION (PER ONE DIRECTION)

IMPLANTED 4 TIMES AT 45°
INCIDENCE TO GATE LENGTH

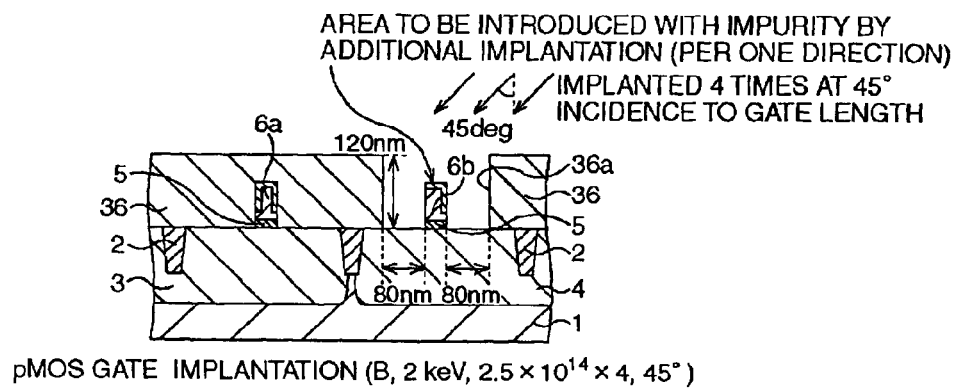

pMOS GATE IMPLANTATION (B, 2 keV, $2.5 \times 10^{14} \times 4$, 45°)

FIG. 33D

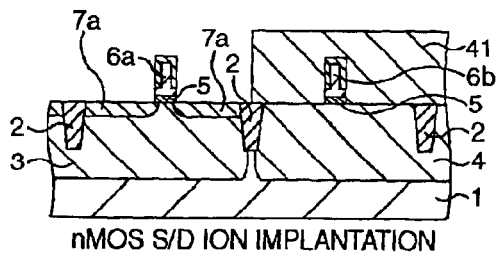

nMOS S/D ION IMPLANTATION pMOS S/D ION IMPLANTATION

ANNEALING (RTA, 1,030°C, 1 sec)

METALLIZATION

FIG. 35

RULE FOR RESIST MASK IN THE FOURTH AND FIFTH EMBODIMENTS

Rp1: LENGTH OF SIDEWALL SUFFICIENT FOR SHIELDING IMPURITY IMPLANTED ALONG A DIRECTION INCLINED
Rp2: LENGTH OF RESIST MASK SUFFICIENT FOR SHIELDING IMPURITY IMPLANTED ALONG A DIRECTION INCLINED
ΔL: ALIGNMENT ERROR BETWEEN GATE ELECTRODE AND RESIST PATTERN
L1 = MIN(L1', L1'')

RESIST−GATE DISTANCE = L1 − ΔL

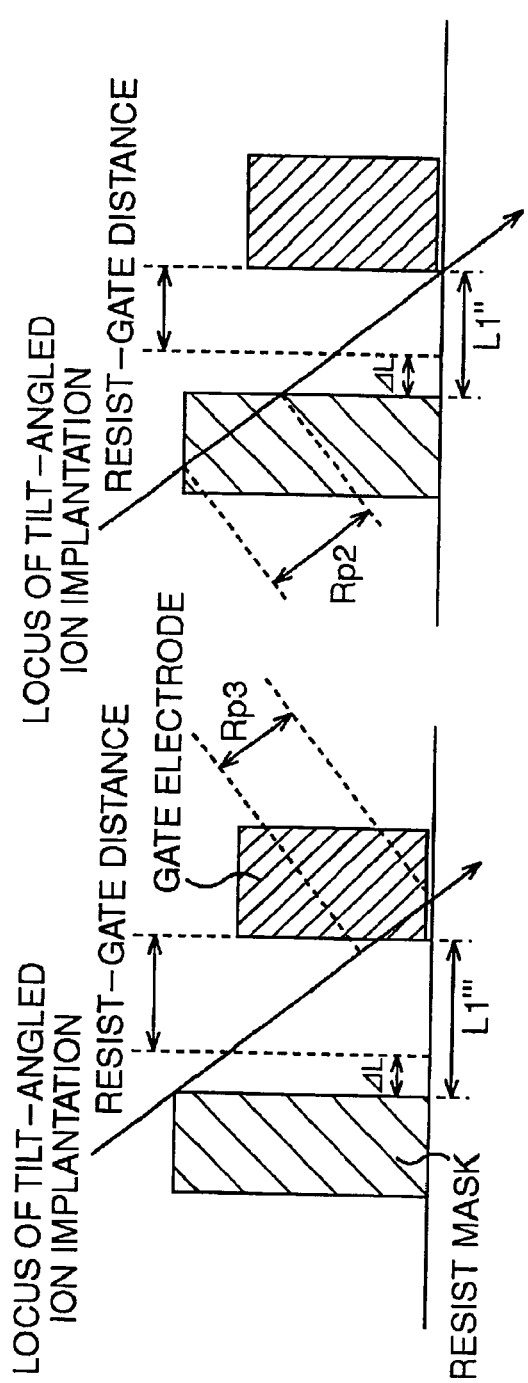

FIG. 38

RULE FOR RESIST MASK IN THE SIXTH AND EIGHTH EMBODIMENTS

Rp2: LENGTH OF RESIST MASK SUFFICIENT FOR SHIELDING IMPURITY IMPLANTED ALONG A DIRECTION INCLINED
Rp3: LENGTH OF GATE ELECTRODE SUFFICIENT FOR SHIELDING IMPURITY IMPLANTED ALONG A DIRECTION INCLINED
ΔL: ALIGNMENT ERROR BETWEEN GATE ELECTRODE AND RESIST PATTERN
L1=MIN(L1",L1''')

RESIST−GATE DISTANCE=L1−ΔL

FIG. 39
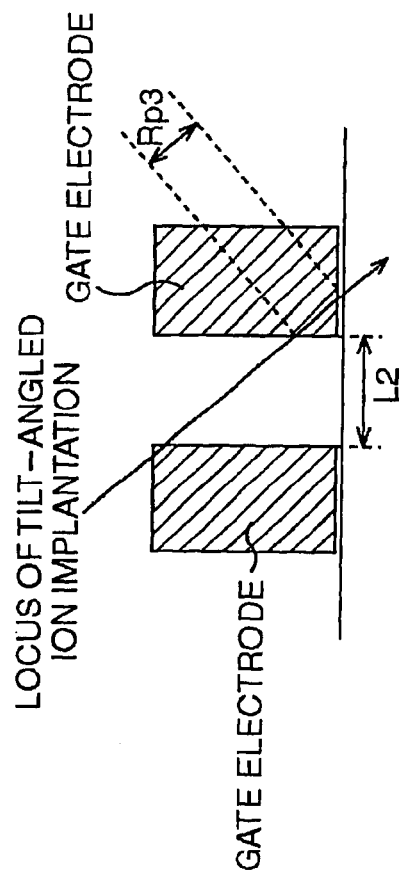
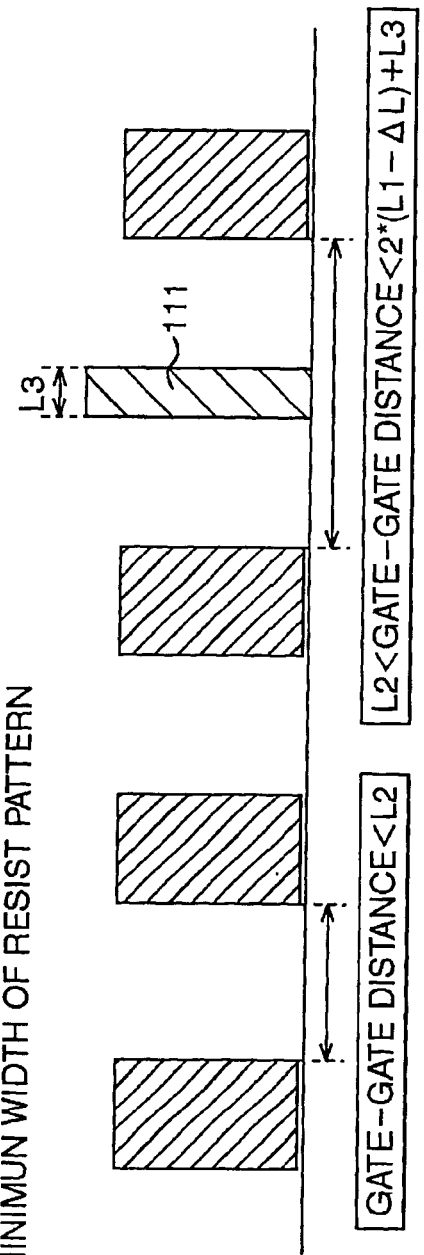
Rp3: LENGTH OF GATE ELECTRODE SUFFICIENT FOR SHIELDING IMPURITY IMPLANTED ALONG A DIRECTION INCLINED
L3: MINIMUM WIDTH OF RESIST PATTERN

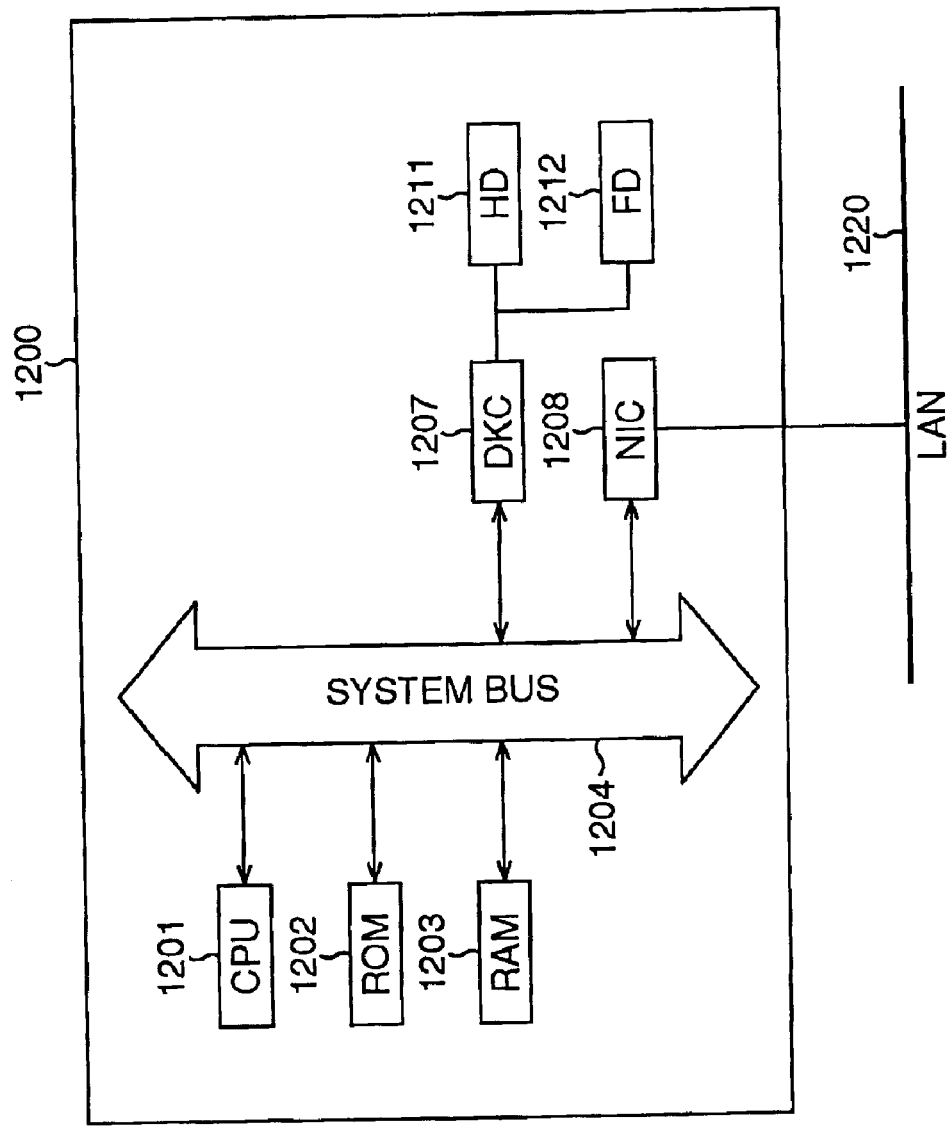

SEMICONDUCTOR DEVICE AND METHOD OF FABRICATING THE SAME

CROSS-REFERENCE TO RELATED APPLICATIONS

This application is based upon and claims the benefit of priority from the prior Japanese Patent Application No. 2002-254672, filed on Aug. 30, 2002, the entire contents of which are incorporated herein by reference.

BACKGROUND OF THE INVENTION

1. Field of the Invention

This invention relates to a semiconductor device having a gate and source-and-drain regions, and a method of fabricating thereof, which are particularly preferable when applied to a CMOS transistor.

2. Description of the Related Art

Conventional CMOS transistors generally employ a polysilicon gate electrode doped with an n-type impurity for the n-channel MOS transistor (nMOS transistor) composing thereof. This is because the threshold voltage can readily be controlled to desired values. The nMOS transistor is turned ON when applied with a positive voltage through the gate electrode, which causes bending of the energy band of polysilicon, and generates a depletion layer within the gate electrode in the vicinity of the interface with a gate insulating film. Such production of the depletion layer undesirably lowers the gate capacitance and thus reduces ON current. To suppress the lowering of the gate capacitance, it is necessary to raise concentration of the n-type impurity within the gate electrode in the vicinity of the interface with the gate insulating film.

The same will apply to the p-channel MOS transistor (pMOS transistor) which employs a polysilicon gate electrode doped with a p-type impurity, where it is also necessary to raise concentration of the p-type impurity within the gate electrode in the vicinity of the interface with the gate insulating film in order to suppress lowering of the gate capacitance during the ON status.

In a general procedure for fabricating the aforementioned nMOS and pMOS transistors, the source-and-drain regions are formed by ion implantation, where the gate electrodes which serve as masks are also concomitantly doped.

To suppress lowering in the gate capacitance, it is necessary to suppress formation of the depletion layer within the gate electrode, and it is thus necessary to raise the dose of the impurity introduced into the gate electrode, which impurity is concomitantly doped also into the source-and-drain regions. This successfully raises the impurity concentration within the gate electrode, but also raises the impurity concentration in the source-and-drain regions, which undesirably promotes lateral diffusion of the impurity in the source-and-drain regions, and results in degradation of short-channel resistance.

One known solution for addressing the problem relates to reduction in height of the gate electrode, which can substantially increase the impurity concentration even if the dose of impurity introduced to the gate electrode remains unchanged. This solution, however, raises another problem that too low height of the gate electrode may result in punch-through of the impurity introduced into the gate electrode into the channel, which undesirably varies the threshold voltage. The technique for reducing the height of gate electrode is thus limitative.

SUMMARY OF THE INVENTION

The present invention is thus to provide a highly-reliable semiconductor device and a method of fabricating thereof, both of which are aimed at raising impurity concentration within the gate electrode without increasing impurity concentration in the source-and-drain regions, and as a consequence at improving gate capacitance and short-channel resistance without anticipating fluctuation in the threshold voltage due to variation in shape of the gate electrode.

After extensive investigations and discussions, the present inventors reached the various aspects of the present invention described below.

A method of fabricating a semiconductor device according to one aspect of the present invention comprises a first step of patterning a gate electrode above a semiconductor substrate having an element isolation structure previously formed therein; a second step of forming sidewalls covering only on both side faces of the gate electrode; a third step of removing the upper portion of the sidewalls to thereby expose a part of both side faces of the gate electrode; and a fourth step for introducing an impurity into the gate electrode along a direction inclined to the surface of the semiconductor substrate.

A method of fabricating a semiconductor device according to another aspect of the present invention comprises a first step of patterning a gate electrode above a semiconductor substrate; a second step of forming a mask having an opening which allows the gate electrode to be exposed therein; and a third step of introducing an impurity into the gate electrode along a direction inclined to the surface of the semiconductor substrate, wherein in the second step, the opening of the mask is formed in a size which ensures protection of areas for forming source-and-drain regions on both sides of the gate electrode from the tilt-angle introduction of the impurity.

A semiconductor device according to one aspect of the present invention comprises a gate electrode; source-and-drain regions; sidewalls covering only the lower portion of both side faces of the gate electrode; and a silicide film formed on the exposed surface of the gate electrode, wherein the gate electrode contains an impurity having a conductivity type same as that of the impurity contained in the source-and-drain regions, and the gate electrode has an impurity concentration larger than that of the source-and-drain regions.

BRIEF DESCRIPTION OF THE DRAWINGS

FIG. 1 is a schematic sectional view showing a major principle of a first technique;

FIG. 2 is a schematic sectional view showing a major principle of a second technique;

FIG. 3 is a schematic sectional view showing an exemplary case of a combination of the first and second techniques;

FIG. 10 is a plan view for explaining a modified example of tilt-angled ion implantation in the first embodiment;

FIG. 14 is a plan view for explaining tilt-angled ion implantation;

FIG. 17 is a plan view for explaining tilt-angled ion implantation;

FIG. 20 is a plan view for explaining tilt-angled ion implantation;

FIG. 24 is a plan view for explaining tilt-angled ion implantation;

FIGS. 32A to 32D are schematic sectional views sequentially showing process steps as continued from FIG. 31D;

FIGS. 33A to 33D are schematic sectional views sequentially showing major process steps of a method of fabricating a CMOS transistor according to a ninth embodiment;

FIG. 35 is a schematic drawing for explaining a method of determining an alignment rule of a resist mask with respect to the gate electrode in the fourth and fifth embodiments;

FIG. 38 is a schematic drawing for explaining a method of determining an alignment rule of a resist mask with respect to the gate electrode in the sixth through ninth embodiments;

FIG. 39 is a schematic drawing for explaining a method of determining an alignment rule of a resist mask with respect to the aligned gate electrodes in the sixth through ninth embodiments;

FIG. 41 is a block diagram showing an internal constitution of a general personal user terminal device.

DETAILED DESCRIPTION OF THE PREFERRED EMBODIMENTS

Basic Concept of the Present Invention

Figure 4A:
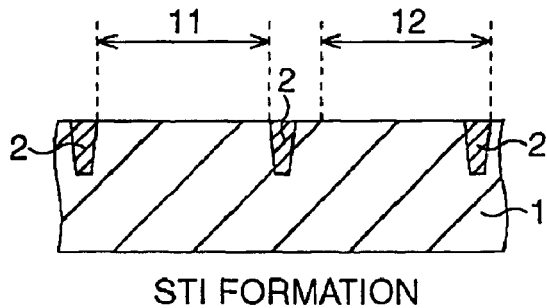
FIGS. 4A to 4D are schematic sectional views sequentially showing process steps of a method of fabricating a CMOS transistor according to a first embodiment.

First a basic concept of a major constitution of the present invention will be described.

In pursuit of solving the aforementioned problems, the present inventors reached an idea of a semiconductor device in which the gate electrode is designed to have an impurity concentration higher than that of the source-and-drain regions, and proposed, as a specific technique for realizing such semiconductor device, a method of fabricating thereof as explained below.

(First Technique)

A major principle of a first technique is shown in FIG. 1.

First, sidewalls 103 are formed on both side faces of a gate electrode 102. Portions of a semiconductor substrate 101 which fall on both sides of the gate electrode 102 and sidewalls 103 serve as source-and-drain (S/D) regions 104, respectively.

Next, the sidewalls 103 are over-etched to thereby allow the upper portion of the gate electrode 102 to be exposed. The gate electrode 102 herein is remained so as to expose an area extending from the top surface thereof to the upper portion of both side faces thereof.

Next, an impurity having a conductivity same as that doped in the source-and-drain regions is then implanted into the exposed surface of the gate electrode 102 from a direction inclined to the surface of the semiconductor substrate 101.

The gate electrode 102 herein is doped with the impurity in its top surface and in the upper portion of one side face (indicated with reference numeral 102a in the figure). Since the impurity can rapidly diffuse in polysilicon, the impurity rapidly diffuses during the later annealing to thereby attain a uniform distribution. That is, carrying out of the tilt-angled ion implantation is nearly worth ion implantation repeated twice, and can raise the impurity concentration at the interface with the gate insulating film as compared with that attainable by vertical ion implantation.

On the contrary, either of the source-and-drain regions 104 is introduced with the impurity only in a dose corresponding to a single implantation (indicated with reference numeral 104a in the figure), where the other region is not introduced at all, or only slightly introduced (indicated with reference numeral 104b) although being almost not influential.

Therefore by repeating the tilt-angled ion implantation in a plural number of times, the impurity concentration of the gate electrode 102 can be raised to a desired degree as compared with that of the source-and-drain regions 104, while varying the direction of implantation [typically once each in the directions opposed along the width of the gate electrode 102 (referred to as a direction normal to the gate length, hereinafter) and once each in the directions opposed along the length of the gate electrode (referred to as a direction parallel to the gate length)].

(Second Technique)

A major principle of a second technique is shown in FIG. 2.

In this technique, a resist mask 105 having an opening 105a, which is formed in a size allowing the gate electrode 102 to expose therein and allowing the source-and-drain regions 104 to be protected (prevented) from the tilt-angled ion implantation, is formed, and the tilt-angled ion implantation is carried out in this situation. Also in this case, the tilt-angled ion implantation is carried out in a plural number of times while varying the direction of implantation.

The gate electrode 102 herein is doped with the impurity in its top surface and in the upper portion of one side face (indicated with reference numeral 102a in the figure). Since the impurity can rapidly diffuse in polysilicon, the impurity rapidly diffuses during the later annealing to thereby attain a uniform distribution. That is, a single tilt-angled ion implantation is nearly worth ion implantation repeated twice, and can raise the impurity concentration at the interface with the gate insulating film as compared with that attainable by vertical ion implantation.

On the contrary, a pair of source-and-drain regions 104 protected by the resist mask 105 are prevented from being introduced with the impurity.

Since increase in the impurity concentration in the gate electrode 102 does not affect or increase the impurity concentration of the source-and-drain regions 104 as described in the above, short-channel effect is certainly prevented from being worsened.

It is to be noted now that it is also allowable, as shown in FIG. 3, to over-etch the sidewalls 103 so as to expose the upper portion of both side faces of the gate electrode 102 as described in the first technique, and then to form the resist mask 105 having the opening 105a formed in a size which ensures protection (prevention) of the source-and-drain regions 104 from the tilt-angled ion implantation as described in the second technique, and to carry out the tilt-angled ion implantation in this situation. This ensures introduction of the impurity only into the gate electrode 102 in a more precise manner.

Specific Embodiments

Based on the basic concept of the present invention described in the above, specific embodiments whereby the present invention is applied to a CMOS transistor will be explained with reference to the attached drawings.

(First Embodiment)

FIGS. 4A through 8D are schematic sectional views sequentially showing process steps of a method of fabricating a CMOS transistor.

First as shown in FIG. 4A, trenches are formed in an element isolation region of a semiconductor substrate 1, filled with an insulating material such as silicon oxide, and the surface thereof is planarized typically by CMP (chemical mechanical polishing) to thereby form a STI-type (shallow trench isolation-type) element isolation structures 2. This partitions element active regions on the semiconductor substrate 1, which are an nMOS region 11 and a pMOS region 12.

Figure 4B:
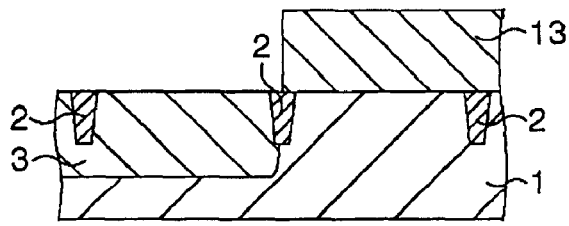

Next, as shown in FIG. 4B, a resist mask 13 is formed so as to cover the pMOS region 12, and a p-type impurity is introduced by ion implantation into the nMOS region 11, to thereby form a p-well 3, and a channel stopper layer (not shown) in the surficial portion of the substrate.

Figure 4C:
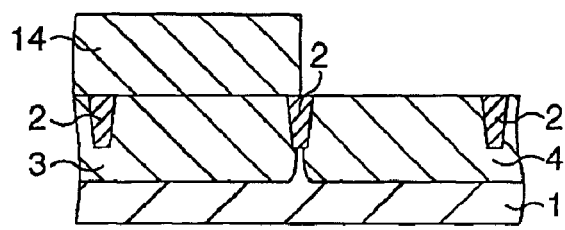

Next, the resist mask 13 is removed typically by ashing, a resist mask 14 is formed so as to cover the nMOS region 11 as shown in FIG. 4C, and an n-type impurity is introduced by ion implantation into the pMOS region 12, to thereby form an n-well 4, and a channel stopper layer (not shown) in the surficial portion of the substrate.

Figure 4D:
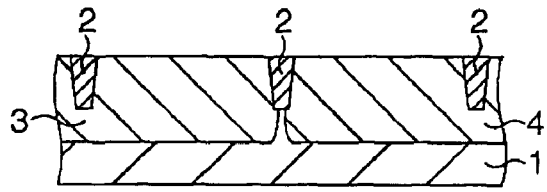

Next, the resist mask 14 is removed typically by ashing, and, as shown in FIG. 4D, the semiconductor substrate 1 is then annealed by RTA (rapid thermal annealing) at 1,000° C. for 3 seconds to thereby restore the substrate from damage caused by introduction of the impurities into the wells 3, 4 and channel stopper layers.

Figure 5A:
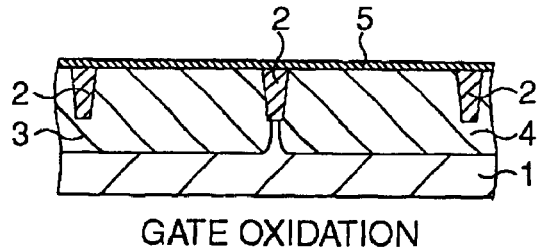
FIGS. 5A to 5D are schematic sectional views sequentially showing process steps as continued from FIG. 4D.
Figure 5B:
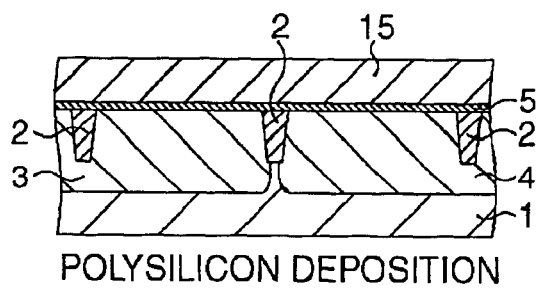

Next, as shown in FIG. 5A, a thin gate insulating film 5 is formed on the surface of the semiconductor substrate 1 by thermal oxidation, and further thereon, a non-doped polysilicon film 15 is deposited by the CVD process as shown in FIG. 5B.

Figure 5C:
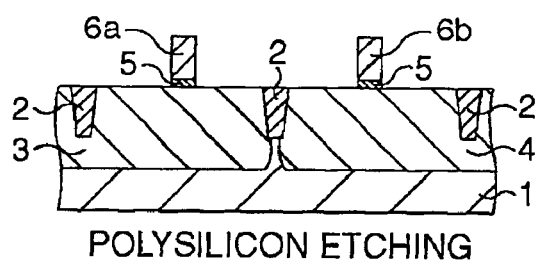

Next, the polysilicon film 15 and the gate insulating film 5 are patterned by photolithography and succeeding dry etching to thereby form gate electrodes 6a, 6b of approx. 100 nm high and approx. 50 nm wide on the gate insulating film 5 in the nMOS and pMOS regions 11, 12, respectively, as shown in FIG. 5C. In this process, the polysilicon film 15 has no impurity previously introduced therein, because polysilicon doped with an n-type impurity and that doped with a p-type impurity generally differ in the etchrate, which makes it difficult to form respective gate electrodes of nMOS transistor and pMOS transistor at a same time.

Figure 5D:
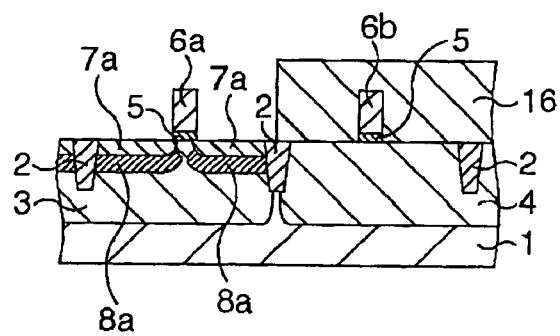

Next, as shown in FIG. 5D, a resist mask 16 is formed so as to cover the pMOS region 12, and an n-type impurity, which is arsenic (As) herein, is introduced by vertical ion implanted into the nMOS region 11 at an ion acceleration energy of 5 keV and a dose of $6 \times 10^{14}/cm^2$, and also a p-type impurity, which is boron (B) herein, is introduced by ion implantation at an ion acceleration energy of 10 keV, a dose of $8 \times 10^{12}/cm^2$, and an angle of incidence of 30° from four directions, to thereby form n-type extension layers 7a and p-type pocket layers 8a, respectively.

Figure 6A:
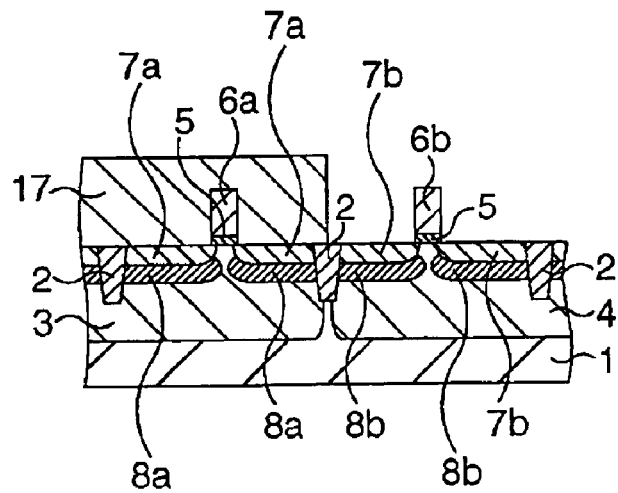
FIGS. 6A and 6B are schematic sectional views sequentially showing process steps as continued from FIG. 5D.

Next, the resist mask 16 is removed typically by ashing, a resist mask 17 is formed so as to cover the nMOS region 11 as shown in FIG. 6A, and a p-type impurity, which is boron (B) herein, is introduced by vertical ion implantation into the pMOS region 12 at an ion acceleration energy of 0.5 keV and a dose of $6 \times 10^{14}/cm^2$, and also an n-type impurity, which is arsenic (As) herein, is introduced by ion implantation at an ion acceleration energy of 50 keV, a dose of $6 \times 10^{12}/cm^2$, and an angle of incidence of 30° from four directions, to thereby form p-type extension layers 7b and n-type pocket layers 8a, respectively.

Figure 6B:
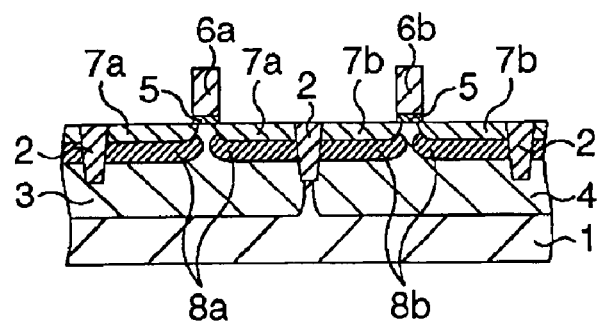

Next, as shown in FIG. 6B, the resist mask 17 is removed typically by ashing, and, as shown in FIG. 6B, the semiconductor substrate 1 is then annealed by RTA (rapid thermal annealing) at 1,000° C. for one second to thereby restore the substrate from damage generated by introduction of the impurities into the extension layers 7a, 7b and pocket layers 8a, 8b.

Figure 7A:
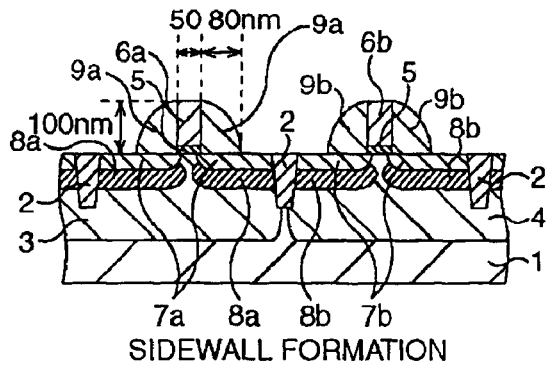
FIGS. 7A to 7D are schematic sectional views sequentially showing process steps as continued from FIG. 6B.

Next, a silicon oxide film (not shown) is deposited on the entire surface by the CVD process, and the film is then anisotropically etched back so as to allow the film to remain only on both side faces of the gate electrodes 6a, 6b, to thereby form sidewalls 9a, 9b having a maximum width of 80 nm or around, as shown in FIG. 7A.

Figure 7B:
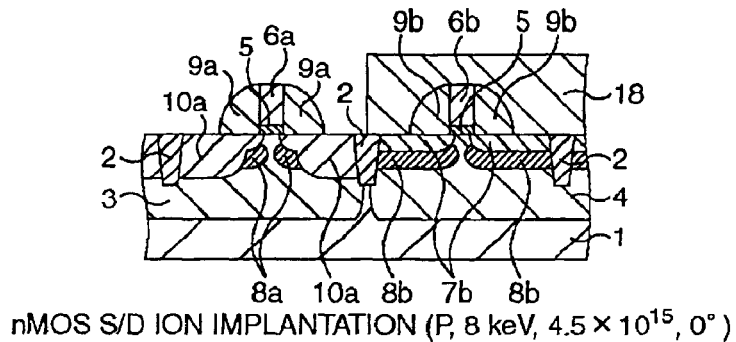

Next, a resist mask 18 is formed so as to cover the pMOS region 12 as shown in FIG. 7B, and an n-type impurity, which is phosphorus (P) herein, is introduced by ion implantation into the nMOS region 11 at an ion acceleration energy of 8 keV, a dose of $4.5 \times 10^{15}/cm^2$, and an angle of incidence of 0° (that is, normal to the surface of the substrate), to thereby form the n-type, source-and-drain regions 10a. Phosphorus herein is also implanted into the gate electrode 6a. The dose of phosphorus in this process is controlled to a smaller value ($6 \times 10^{15}/cm^2$, for example) than that in general formation process of n-type, source-and-drain regions.

Figure 7C:
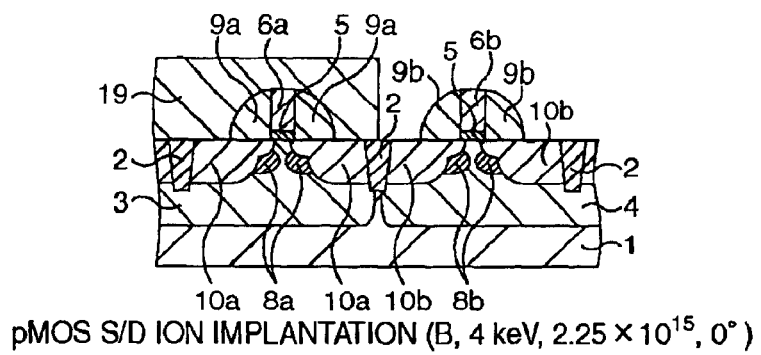

Next, the resist mask 18 is removed typically by ashing, a resist mask 19 is formed so as to cover the nMOS region 11 as shown in FIG. 7C, and a p-type impurity, which is boron (B) herein, is introduced by ion implantation into the PMOS region 12 at an ion acceleration energy of 4 keV, a dose of $2.25 \times 10^{15}/cm^2$ and an angle of incidence of 0°, to thereby form the p-type, source-and-drain regions 10b. Boron herein is also implanted into the gate electrode 6b. The dose of boron in this process is controlled to a smaller value ($3 \times 10^{15}/cm^2$, for example) than that in general formation process of p-type, source-and-drain regions.

Figure 7D:
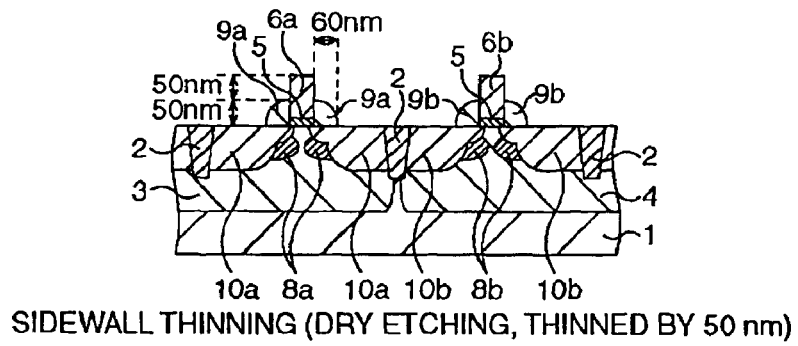

Next, the resist mask 19 is removed typically by ashing, and the sidewalls 9a, 9b are dry-etched (over-etched) to thereby allow the upper portion of both side faces of the gate electrodes 6a, 6b to expose as much as 50 nm or around as shown in FIG. 7D. The gate electrodes 6a, 6b herein are remained so as to expose an area extending from the top surface thereof to the upper portion of both side faces thereof, and the sidewalls 9a, 9b are adjusted so as to have a height of 50 nm or around.

Considering now that the gate electrodes 6a, 6b are subjected to tilt-angled ion implantation described later, the more the sidewalls 9a, 9b are etched, the more the gate electrodes 6a, 6b will have an impurity incorporated therein. Too much amount of etching of the sidewalls 9a, 9b may, however, result in excessive diffusion of the incorporated impurities in the source-and-drain regions 10a, 10b towards the channel, or may raise a risk of short-circuiting between silicides, which are formed later on the source-and-drain regions 10a, 10b and on the gate electrodes 6a, 6b. Thus there is an appropriate range for the amount of etching of the sidewalls 9a, 9b, and 50 nm is one exemplary amount falls within such range.

To prevent the STI-type element isolation structure 2 from being etched together with the sidewalls 9a, 9b, it is preferable to use different materials to form the sidewalls 9a, 9b and STI-type element isolation structure 2 so that the sidewalls 9a, 9b will have a higher etchrate than that of the element isolation structure 2. One preferable example is such that using a plasma oxide film formed in an HDP (high density plasma) apparatus for the STI-type element isolation structure 2 and using an oxide film formed using TEOS (tetraethoxysilane) for the sidewalls 9a, 9b.

Figure 8A:
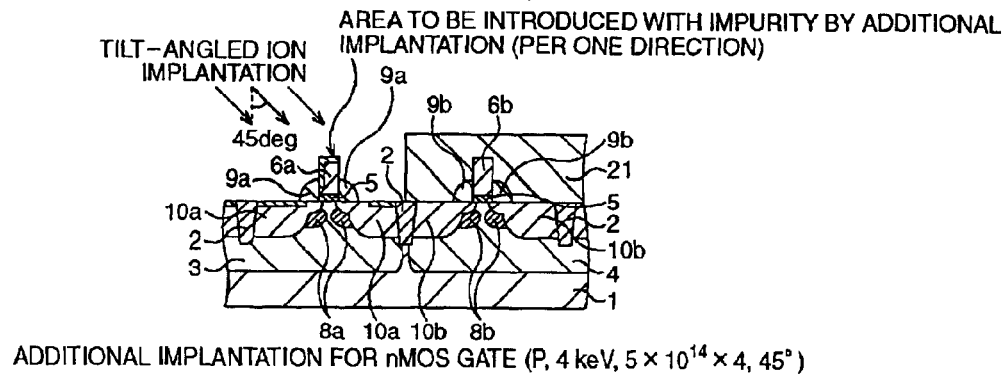
FIGS. 8A to 8D are schematic sectional views sequentially showing process steps as continued from FIG. 7D.

Next, as shown in FIG. 8A, an n-type impurity is implanted along a direction inclined into the nMOS region 11 to thereby introduce the impurity to the exposed surface of the gate electrode 6a (the top surface of 50 nm wide and both side faces of 50 nm high exposed from the sidewall 9a).

Figure 9:
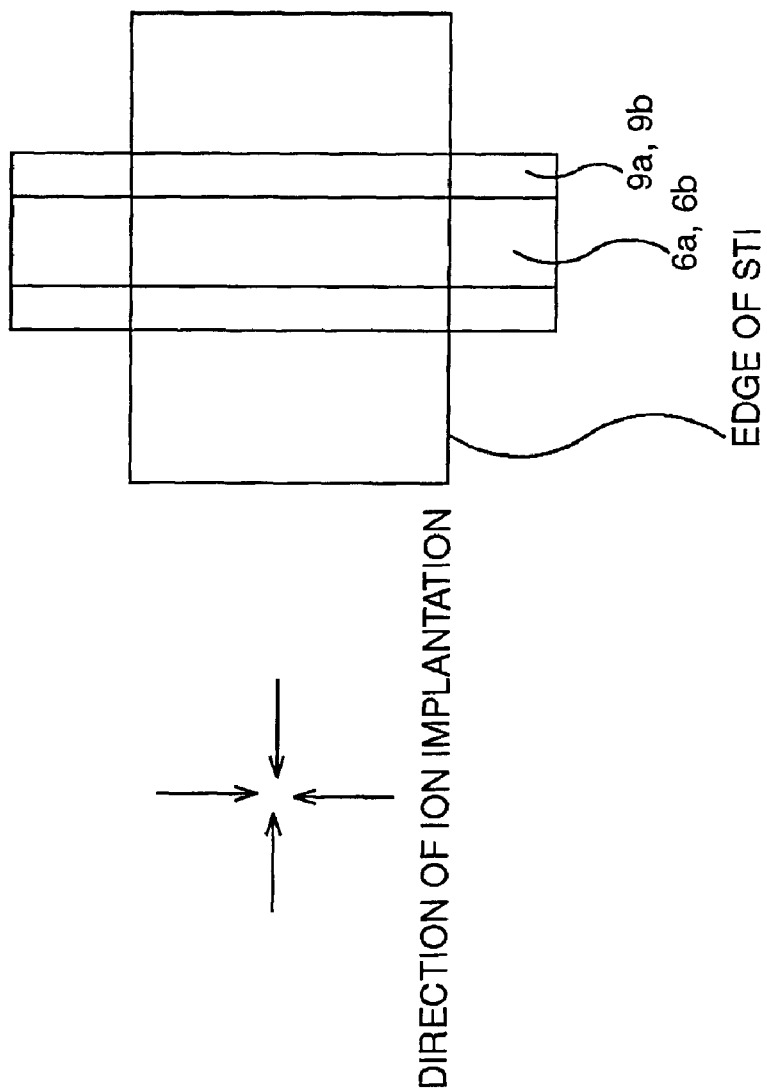
FIG. 9 is a plan view for explaining tilt-angled ion implantation.

More specifically, a resist mask 21 is formed so as to cover the pMOS region 12, and an n-type impurity, which is phosphorus (P) herein, is implanted at an ion acceleration energy of 4 keV, a dose of $5 \times 10^{14}/cm^2$, and an angle of incidence of 45°. The implantation is repeated four times (twice in two opposing directions parallel to the gate length and twice in two opposing directions normal thereto). The ion implantation repeated four times is shown in a schematic plan view in FIG. 9.

FIG. 8A shows an exemplary ion implantation effected along a direction parallel to the gate length and at an angle of incidence of 45°. Since the top surface and the upper portion of one side face of the gate electrode 6a herein have almost equivalent exposed areas, a single ion implantation according to the above conditions results in introduction of the impurity over the area extending from the top surface to the upper portion of one side face of the gate electrode 6a in an amount equivalent to that possibly attained by ion implantations at an angle of incidence of 0° repeated twice, and also results in introduction of the impurity into one n-type, source-and-drain region 10a in an amount equivalent to that possibly attained by a single ion implantation at an angle of incidence of 0°. Another n-type, source-and-drain region 10a, which is shadowed by the gate electrode 6a, is not introduced with the impurity, or introduced only in a less affective amount.

Although not being illustrated for convenience, a single ion implantation normal to the gate length at an angle of incidence of 45° results in introduction of the impurity into the gate electrode 6a in an amount equivalent to that possibly attained by a single ion implantation at an angle of incidence of 0°, and also results in introduction of the impurity into both n-type, source-and-drain regions 10a in an amount again equivalent to that possibly attained by a single ion implantation at an angle of incidence of 0°.

By the aforementioned ion implantation repeated four times, as shown later in Table 1, the gate electrode 6a will have introduced therein the impurity in an amount equivalent to that possibly attained by ion implantations at an angle of incidence of 0° ($5 \times 10^{14}/cm^2$) repeated six times, in addition to a dose of $4.5 \times 10^{15}/cm^2$ which has previously been attained, and thus will have a total dose of phosphorus of $7.5 \times 10^{15}/cm^2$. On the contrary, each n-type, source-and-drain region 10a will have introduced therein the impurity in an amount equivalent to that possibly attained by ion implantations at an angle of incidence of 0° repeated three times, in addition to a dose of $4.5 \times 10^{15}/cm^2$ which has previously been attained, and thus will have a total dose of phosphorus of $6 \times 10^{15}/cm^2$ (same level with that of general source-and-drain region).

In the aforementioned process for forming the n-type, source-and-drain region 10a, the first ion implantation (at an angle of incidence of 0°) was carried out at an ion acceleration energy of 8 keV, whereas the successive tilt-angled ion implantation was carried at an ion acceleration energy reduced to as low as 4 keV. The energy was thus reduced because it was necessary to prevent the impurity from laterally penetrating the gate electrode 6a, to prevent the impurity from penetrating the sidewall 10a and gate electrode 6a and intruding into the semiconductor substrate 1, and to prevent the impurity implanted into the n-type, source-and-drain region 10a from diffusing toward the channel.

Figure 8B:
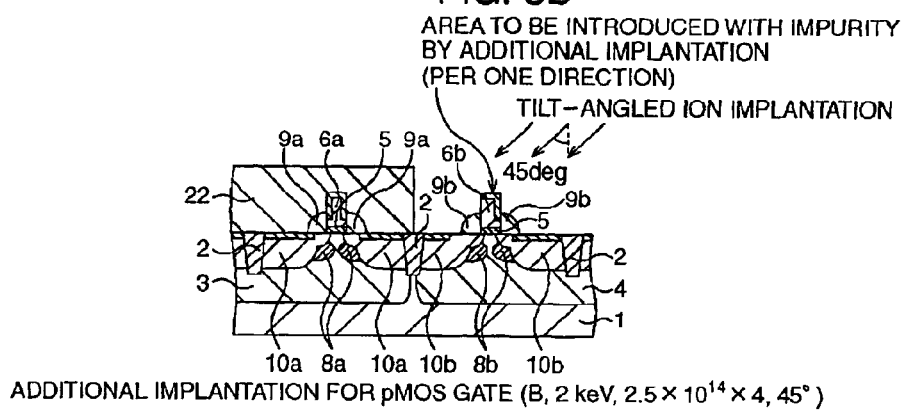

Next, as shown in FIG. 8B, a p-type impurity is implanted into the pMOS region 12 to thereby introduce the impurity to the exposed surface of the gate electrode 6b (the top surface of 50 nm wide and both side faces of 50 nm high exposed from the sidewall 9b).

More specifically, a resist mask 21 is removed typically by ashing, and a resist mask 22 is formed so as to cover the nMOS region 11, and a p-type impurity, which is boron (B) herein, is implanted at an ion acceleration energy of 2 keV, a dose of $2.5 \times 10^{14}/cm^2$, and an angle of incidence of 45°. The implantation is repeated four times (twice in two opposing directions parallel to the gate length and twice in two opposing directions normal thereto).

FIG. 8B shows an exemplary ion implantation effected along a direction parallel to the gate length and at an angle of incidence of 45°. Since the top surface and the upper portion of one side face of the gate electrode 6b herein have almost equivalent exposed areas, a single ion implantation according to the above conditions results in introduction of the impurity over the area extending from the top surface to the upper portion of one side face of the gate electrode 6b in an amount equivalent to that possibly attained by ion implantations at an angle of incidence of 0° repeated twice, and also results in introduction of the impurity into one p-type, source-and-drain region 10b in an amount equivalent to that possibly attained by a single ion implantation at an angle of incidence of 0°. Another p-type, source-and-drain region 10b, which is shadowed by the gate electrode 6b, is not introduced with the impurity, or introduced only in a less affective amount.

Although not being illustrated for convenience, a single ion implantation normal to the gate length at an angle of incidence of 45° results in introduction of the impurity into the gate electrode 6b in an amount equivalent to that possibly attained by a single ion implantation at an angle of incidence of 0°, and also results in introduction of the impurity into both p-type, source-and-drain regions 10b in an amount again equivalent to that possibly attained by a single ion implantation at an angle of incidence of 0°.

By the aforementioned ion implantation repeated four times, as shown later in Table 1, the gate electrode 6b will have introduced therein the impurity in an amount equivalent to that possibly attained by ion implantations at an angle of incidence of 0° ($2.5 \times 10^{14}/cm^2$) repeated six times, in addition to a dose of $2.25 \times 10^{15}/cm^2$ which has previously been attained, and thus will have a total dose of boron of $3.75 \times 10^{15}/cm^2$. On the contrary, each p-type, source-and-drain region 10b will have introduced therein the impurity in an amount equivalent to that possibly attained by ion implantations at an angle of incidence of 0° repeated three times, in addition to a dose of $2.25 \times 10^{15}/cm^2$ which has previously been attained, and thus will have a total dose of boron of $3 \times 10^{15}/cm^2$ (same level with that of general source-and-drain region).

In the aforementioned process for forming the p-type, source-and-drain region 10b, the first ion implantation (at an angle of incidence of 0°) was carried out at an ion acceleration energy of 4 keV, whereas the successive tilt-angled ion implantation was carried at an ion acceleration energy reduced to as low as 2 keV. The energy was thus reduced because it was necessary to prevent the impurity from laterally penetrating the gate electrode 6b, to prevent the impurity from penetrating the sidewall 10b and gate electrode 6b and intruding into the semiconductor substrate 1, and to prevent the impurity implanted into the p-type, source-and-drain region 10b from diffusing toward the channel.

Figure 8C:
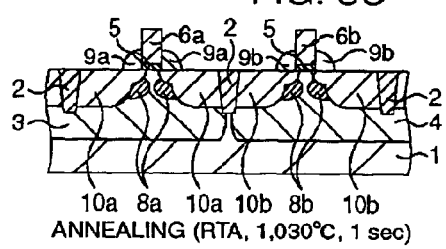

Next, the resist mask 22 is removed typically by ashing, and, as shown in FIG. 8C, the semiconductor substrate 1 is then annealed by RTA (rapid thermal annealing) at 1,030° C. for one second to thereby restore it from damage caused by ion implantation into the gate electrodes 6a, 6b and source-and-drain regions 10a, 10b, and to thereby activate the impurities.

Figure 8D:
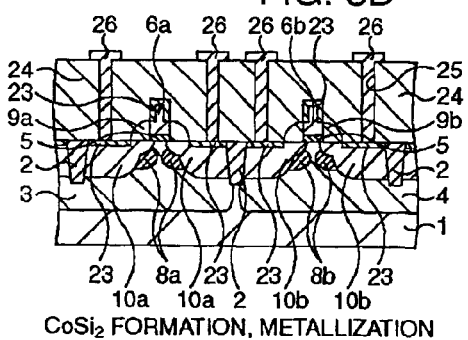

Next, a silicide-forming metal, which is cobalt (Co) herein, is deposited over the entire surface, annealed so as to proceed silicidation, and unreacted Co is removed, to thereby form $CoSi_2$ layers 23 on the exposed surface of the gate electrodes 6a, 6b and on the surface of the source-and-drain region 10a, 10b as shown in FIG. 8D.

An interlayer insulating film 24 is deposited over the entire surface, wirings 26 are formed so as to make contact through contact holes 25, and a CMOS transistor is completed after some additional post-processes.

As has been described in the above, the first embodiment is successful in controlling the impurity concentration of the gate electrodes 6a, 6b higher than that of the source-and-drain regions 10a, 10b by forming the sidewalls 9a, 9a so as to expose the upper portion of the gate electrodes 6a, 6b, and by carrying out the ion implantation at an angle of incidence of 45°. In the first embodiment, the impurity concentration of the gate electrodes 6a, 6b becomes higher than that of the source-and-drain regions 10a, 10b by approx. 25%, where the impurity concentration of the gate electrodes 6a, 6b can be raised while keeping the general impurity concentration of the source-and-drain regions 10a, 10b unchanged. The present embodiment is thus to provide a highly-reliable CMOS transistor having an improved gate capacitance and short-channel resistance without anticipating fluctuation in the threshold voltage due to variation in shape of the gate electrode.

(Modified Example)

A modified example of the present embodiment will be described.

The present invention is by no means limited to mode of the ion implantation in the first embodiment described in the above, where conditions for the first ion implantation for forming the source-and-drain regions or successive tilt-angled ion implantations can properly be selected provided that the impurity concentration of the gate electrodes can be raised without increasing the impurity concentration of the source-and-drain regions.

For example, in this modified example, as shown in FIG. 10, the first ion implantation of phosphorus for forming the n-type, source-and-drain region 10a is carried out at an ion acceleration energy of 8 keV, a dose of $5.5 \times 10^{15}/cm^2$ and an angle of incidence of 0°, and the tilt-angled ion implantation of phosphorus is carried out twice along the direction parallel to the gate length respectively at an ion acceleration energy of 4 keV, a dose of $5 \times 10^{14}/cm^2$ and an angle of incidence of 45°.

By the ion implantation repeated twice, as shown later in Table 1, the gate electrode 6a will have introduced therein the impurity in an amount equivalent to that possibly attained by ion implantations at an angle of incidence of 0° ($5 \times 10^{14}/cm^2$) repeated four times, in addition to a dose of $5.5 \times 10^{15}/cm^2$ which has previously been attained, and thus will have a total dose of phosphorus of $7.5 \times 10^{15}/cm^2$. On the contrary, each n-type, source-and-drain region 10a will have introduced therein the impurity in an amount equivalent to that possibly attained by a single ion implantation at an angle of incidence of 0°, in addition to a dose of $5.5 \times 10^{15}/cm^2$ which has previously been attained, and thus will have a total dose of phosphorus of $6 \times 10^{15}/cm^2$ (same level with that of general source-and-drain region).

Similarly to the above, the first ion implantation of boron for forming the p-type, source-and-drain region 10b is carried out at an ion acceleration energy of 4 keV, a dose of $2.75 \times 10^{15}/cm^2$ and an angle of incidence of 0°, and the tilt-angled ion implantation of phosphorus is carried out twice along the direction parallel to the gate length individually at an ion acceleration energy of 2 keV, a dose of $2.5 \times 10^{14}/cm^2$ and an angle of incidence of 45°.

By the ion implantation repeated twice, as shown later in Table 1, the gate electrode 6b will have introduced therein the impurity in an amount equivalent to that possibly attained by ion implantations at an angle of incidence of 0° $(2.5 \times 10^{14}/cm^2)$ repeated four times, in addition to a dose of $2.75 \times 10^{15}/cm^2$ which has previously been attained, and thus will have a total dose of boron of $3.75 \times 10^{15}/cm^2$. On the contrary, each p-type, source-and-drain region 10b will have introduced therein the impurity in an amount equivalent to that possibly attained by a single ion implantation at an angle of incidence of 0°, in addition to a dose of $2.75 \times 10^{15}/cm^2$ which has previously been attained, and thus will have a total dose of boron of $3 \times 10^{15}/cm^2$ (same level with that of general source-and-drain region).

(Second Embodiment)

FIGS. 11A to 11D are schematic sectional views sequentially showing major process steps of a method of fabricating a CMOS transistor according to a second embodiment.

Figure 11A:
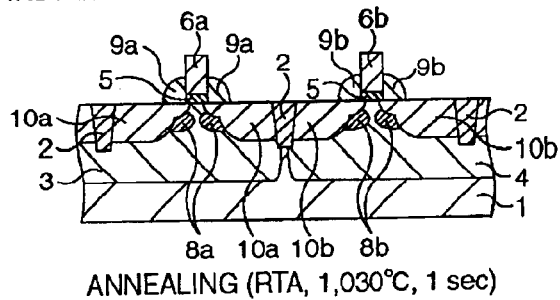
FIGS. 11A to 11D are schematic sectional views sequentially showing major process steps of a method of fabricating a CMOS transistor according to a second embodiment.

In the second embodiment, the individual process steps previously shown in FIGS. 4A through 8B are executed to thereby control the dose of phosphorus to $7.5 \times 10^{15}/cm^2$ for the gate electrode 6a and $6 \times 10^{15}/cm^2$ for the n-type, source-and-drain region 10a in the nMOS region 11, and the dose of boron to $3.75 \times 10^{15}/cm^2$ for the gate electrode 6b and $3 \times 10^{15}/cm^2$ for the p-type, source-and-drain region 10b in the pMOS region 12. The semiconductor substrate 1 is then annealed by RTA at 1,030° C. for 1 second (FIG. 11A).

Figure 11B:
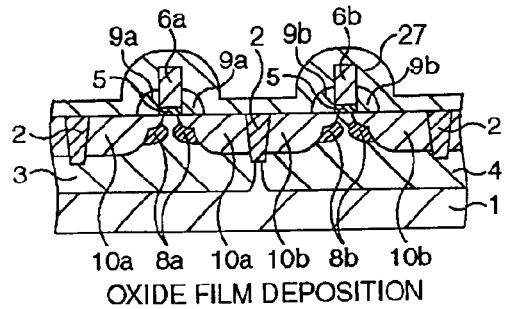
Figure 11C:
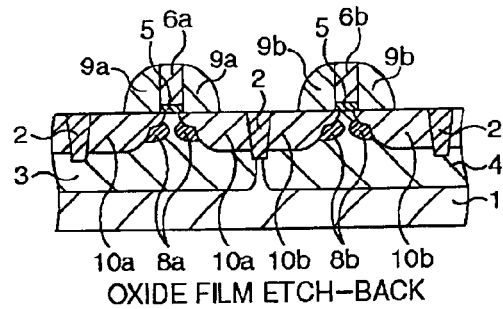

Next, as shown in FIG. 11B, a silicon oxide film 27 is formed over the entire surface by the CVD process, and then as shown in FIG. 1C, the silicon oxide film 27 is then anisotropically etched back so as to allow the film to remain only on both side faces of the gate electrodes 6a, 6b, to thereby form sidewalls 9a, 9b. That is, the sidewalls 9a, 9b now recover the status previously shown in FIG. 7A.

Figure 11D:
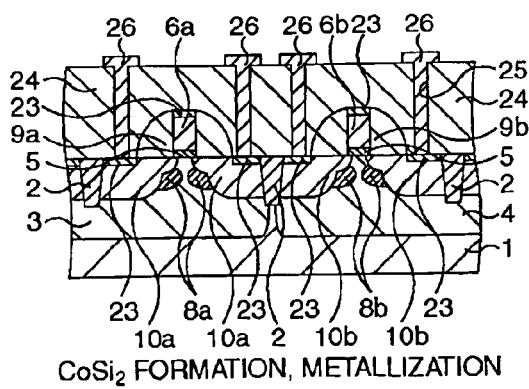

Next, a silicide-forming metal, which is cobalt (Co) herein, is deposited over the entire surface, annealed so as to proceed silicidation, and unreacted Co is removed, to thereby form $CoSi_2$ layers 23 on the exposed surface of the gate electrodes 6a, 6b and on the surface of the source-and-drain region 10a, 10b as shown in FIG. 11D.

An interlayer insulating film 24 is deposited over the entire surface, wirings 26 are formed so as to make contact through contact holes 25, and a CMOS transistor is completed after some additional post-processes.

As has been described in the above, the second embodiment is successful in controlling the impurity concentration of the gate electrodes 6a, 6b higher than that of the source-and-drain regions 10a, 10b by forming the sidewalls 9a, 9a so as to expose the upper portion of the gate electrodes 6a, 6b, and by carrying out the ion implantation at an angle of incidence of 45°. In the second embodiment, the impurity concentration of the gate electrodes 6a, 6b becomes higher than that of the source-and-drain regions 10a, 10b by approx. 25%, where the impurity concentration of the gate electrodes 6a, 6b can be raised while keeping the general impurity concentration of the source-and-drain regions 10a, 10b unchanged. The present embodiment is thus to provide a highly-reliable CMOS transistor having an improved gate capacitance and short-channel resistance without anticipating fluctuation in the threshold voltage due to variation in shape of the gate electrode.

The second embodiment is also successful in certainly prevent short-circuiting between $CoSi_2$ formed on the source-and-drain regions 10a, 10b and $CoSi_2$ formed on the gate electrodes 6a, 6b, since the sidewalls 9a, 9b recover their initial form almost completely covering the side faces of the gate electrodes before the $CoSi_2$ layer 23 is formed. Thus the sidewalls 9a, 9b can thoroughly be over-etched in preparation for the tilt-angled ion implantation without anticipating the short-circuiting. It is therefore also preferable to raise the amount of over-etching larger than that in the first embodiment (50%), to thereby further increase dose of implanted ion in the gate electrodes 6a, 6b.

Also in the second embodiment, similarly to the modified example of the first embodiment, conditions for the first ion implantation for forming the source-and-drain regions or successive tilt-angled ion implantations can properly be selected provided that the impurity concentration of the gate electrodes can be raised without increasing the impurity concentration of the source-and-drain regions.

For example, the first ion implantation of phosphorus for forming the n-type, source-and-drain region 10a is carried out at an ion acceleration energy of 8 keV, a dose of $5.5 \times 10^{15}/cm^2$ and an angle of incidence of 0°, and the tilt-angled ion implantation of phosphorus is carried out twice along the direction parallel to the gate length respectively at an ion acceleration energy of 4 keV, a dose of $5 \times 10^{14}/cm^2$ and an angle of incidence of 45°.

By the ion implantation repeated twice, as shown later in Table 1, the gate electrode 6a will have introduced therein the impurity in an amount equivalent to that possibly attained by ion implantations at an angle of incidence of 0° $(5 \times 10^{14}/cm^2)$ repeated four times, in addition to a dose of $5.5 \times 10^{15}/cm^2$ which has previously been attained, and thus will have a total dose of phosphorus of $7.5 \times 10^{15}/cm^2$. On the contrary, each n-type, source-and-drain region 10a will have introduced therein the impurity in an amount equivalent to that possibly attained by a single ion implantation at an angle of incidence of 0°, in addition to a dose of $5.5 \times 10^{15}/cm^2$ which has previously been attained, and thus will have a total dose of phosphorus of $6 \times 10^{15}/cm^2$ (same level with that of general source-and-drain region).

Similarly to the above, the first ion implantation of boron for forming the p-type, source-and-drain region 10b is carried out at an ion acceleration energy of 4 keV, a dose of $2.75 \times 10^{15}/cm^2$ and an angle of incidence of 0°, and the tilt-angled ion implantation of boron is carried out twice along the direction parallel to the gate length respectively at an ion acceleration energy of 2 keV, a dose of $2.5 \times 10^{14}/cm^2$ and an angle of incidence of 45°.

By the ion implantation repeated twice, as shown later in Table 1, the gate electrode 6b will have introduced therein the impurity in an amount equivalent to that possibly attained by ion implantations at an angle of incidence of 0° $(2.5 \times 10^{14}/cm^2)$ repeated four times, in addition to a dose of $2.75 \times 10^{15}/cm^2$ which has previously been attained, and thus will have a total dose of boron of $3.75 \times 10^{15}/cm^2$. On the contrary, each p-type, source-and-drain region 10b will have introduced therein the impurity in an amount equivalent to that possibly attained by a single ion implantation at an angle of incidence of 0°, in addition to a dose of $2.75 \times 10^{15}/cm^2$ which has previously been attained, and thus will have a total dose of boron of $3 \times 10^{15}/cm^2$ (same level with that of general source-and-drain region).

(Third Embodiment)

FIGS. 12A through 13D are schematic sectional views sequentially showing major process steps of a method of fabricating a CMOS transistor according to a third embodiment.

Figure 12A:
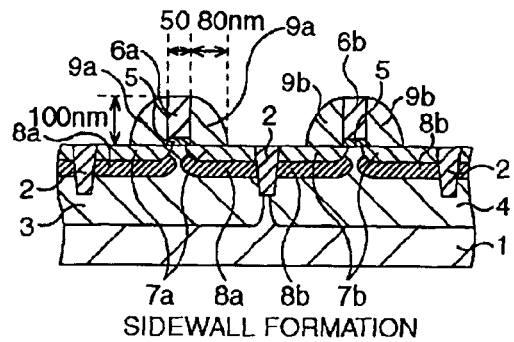
FIGS. 12A to 12D are sequentially showing major process steps of a method of fabricating a CMOS transistor according to a third embodiment.

In the third embodiment, the individual process steps previously shown in FIGS. 4A through 6B are executed to thereby form the sidewalls 9a, 9b which cover both side faces of the gate electrodes 6a, 6b and having a maximum width of 80 nm or around (FIG. 12A).

Figure 12B:
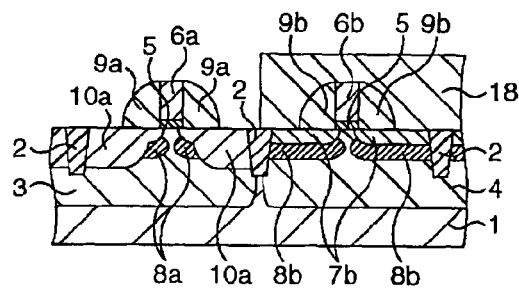

Next, as shown in FIG. 12B, the resist mask 18 is formed so as to cover the pMOS region 12, and an n-type impurity, which is phosphorus (P) herein, is introduced by ion implantation into the nMOS region 11 at an ion acceleration energy of 8 keV, a dose of $5\times10^{15}/cm^2$, and an angle of incidence of 0°, to thereby form the n-type, source-and-drain regions 10a. Phosphorus herein is also implanted into the gate electrode 6a. The dose of phosphorus in this process is controlled to a smaller value ($6\times10^{15}/cm^2$, for example) than that in general formation process of n-type, source-and-drain regions.

Figure 12C:
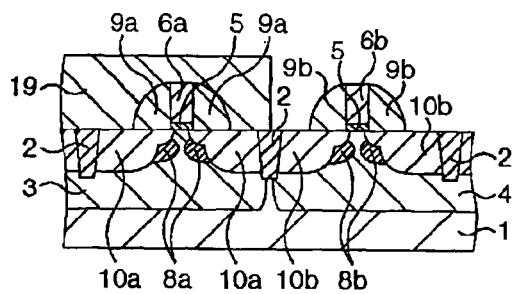

Next, the resist mask 18 is removed typically by ashing, the resist mask 19 is formed so as to cover the nMOS region 11 as shown in FIG. 12C, and a p-type impurity, which is boron (B) herein, is introduced by ion implantation into the pMOS region 12 at an ion acceleration energy of 4 keV, a dose of $2.5\times10^{15}/cm^2$ and an angle of incidence of 0°, to thereby form the p-type, source-and-drain regions 10b. Boron herein is also implanted into the gate electrode 6b. The dose of boron in this process is controlled to a smaller value ($3\times10^{15}/cm^2$, for example) than that in general formation process of p-type, source-and-drain regions.

Figure 12D:
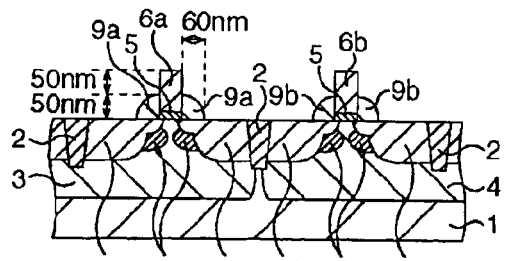

Next, the resist mask 19 is removed typically by ashing, and the sidewalls 9a, 9b are dry-etched (over-etched) to thereby allow the upper portion of both side faces of the gate electrodes 6a, 6b to expose as much as 50 nm or around as shown in FIG. 12D. The gate electrodes 6a, 6b herein are remained so as to expose an area extending from the top surface thereof to the upper portion of both side faces thereof, and the sidewalls 9a, 9b are adjusted so as to have a height of 50 nm or around.

Considering now that the gate electrodes 6a, 6b are subjected to tilt-angled ion implantation described later, the more the sidewalls 9a, 9b are etched, the more the gate electrodes 6a, 6b will have an impurity incorporated therein. Too much amount of etching of the sidewalls 9a, 9b may, however, result in excessive diffusion of the incorporated impurity in the source-and-drain regions 10a, 10b towards the channel, or may raise a risk of short-circuiting between silicides, which are formed later on the source-and-drain regions 10a, 10b and on the gate electrodes 6a, 6b. Thus there is an appropriate range for the amount of etching of the sidewalls 9a, 9b, and 50 nm is one exemplary amount falls within such range.

To prevent the STI-type element isolation structure 2 from being etched together with the sidewalls 9a, 9b, it is preferable to use different materials to form the sidewalls 9a, 9b and STI-type element isolation structure 2 so that the sidewalls 9a, 9b will have a higher etchrate than that of the element isolation structure 2. One preferable example is such that using a plasma oxide film formed in an HDP (high density plasma) apparatus for the STI-type element isolation structure 2 and using an oxide film formed using TEOS (tetraethoxysilane) for the sidewalls 9a, 9b.

Figure 13A:
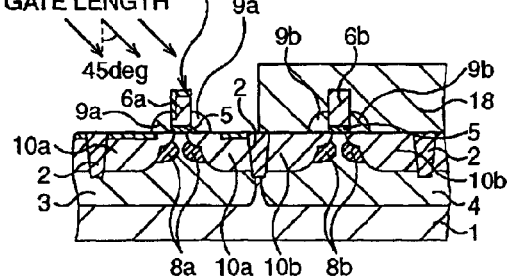
FIGS. 13A to 13D are schematic sectional views sequentially showing process steps as continued from FIG. 12D.

Next, as shown in FIG. 13A, an n-type impurity is implanted along a direction inclined into the nMOS region 11 to thereby introduce the impurity to the exposed surface of the gate electrode 6a (the top surface of 50 nm wide and both side faces of 50 nm high exposed from the sidewall 9a).

More specifically, the resist mask 21 is formed so as to cover the pMOS region 12, and an n-type impurity, which is phosphorus (P) herein, is implanted at an ion acceleration energy of 4 keV, a dose of $5\times10^{14}/cm^2$, and an angle of incidence of 45°. The implantation is repeated four times from directions differing from each other (four different directions inclined by 45° away from the direction of gate length). The ion implantation repeated four times is shown in a schematic plan view in FIG. 14.

Since the top surface and the upper portion of one side face of the gate electrode 6a herein have almost equivalent exposed areas, a single ion implantation according to the above conditions results in introduction of the impurity over the area extending from the top surface to the upper portion of one side face of the gate electrode 6a in an amount equivalent to that possibly attained by ion implantations at an angle of incidence of 0° repeated twice, and also results in introduction of the impurity into one n-type, source-and-drain region 10a in an amount equivalent to that possibly attained by a single ion implantation at an angle of incidence of 0°. Another n-type, source-and-drain region 10a, which is shadowed by the gate electrode 6a, is not introduced with the impurity, or introduced only in a less affective amount.

By the aforementioned ion implantation repeated four times, as shown later in Table 1, the gate electrode 6a will have introduced therein the impurity in an amount equivalent to that possibly attained by ion implantations at an angle of incidence of 0° ($5\times10^{14}/cm^2$) repeated eight times, in addition to a dose of $5\times10^{15}/cm^2$ which has previously been attained, and thus will have a total dose of phosphorus of $9\times10^{15}/cm^2$. On the contrary, each n-type, source-and-drain region 10a will have introduced therein the impurity in an amount equivalent to that possibly attained by ion implantations at an angle of incidence of 0° repeated twice, in addition to a dose of $5\times10^{15}/cm^2$ which has previously been attained, and thus will have a total dose of phosphorus of $6\times10^{15}/cm^2$ (same level with that of general source-and-drain region).

In the aforementioned process for forming the n-type, source-and-drain region 10a, the first ion implantation (at an angle of incidence of 0°) was carried out at an ion acceleration energy of 8 keV, whereas the successive tilt-angled ion implantation was carried at an ion acceleration energy reduced to as low as 4 keV. The energy was thus reduced because it was necessary to prevent the impurity from laterally penetrating the gate electrode 6a, to prevent the impurity from penetrating the sidewall 10a and gate electrode 6a and intruding into the semiconductor substrate 1, and to prevent the impurity implanted into the n-type, source-and-drain region 10a from diffusing toward the channel.

Figure 13B:
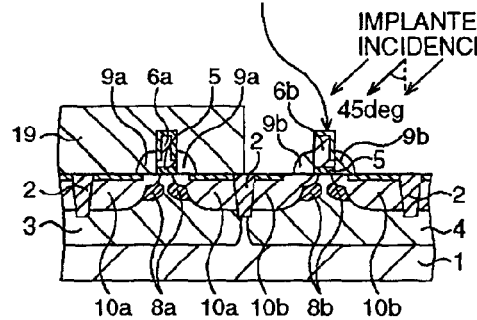

Next, as shown in FIG. 13B, a p-type impurity is implanted into the pMOS region 12 to thereby introduce the impurity to the exposed surface of the gate electrode 6b (the top surface of 50 nm wide and both side faces of 50 nm high exposed from the sidewall 9b).

More specifically, the resist mask 21 is removed typically by ashing, and the resist mask 22 is formed so as to cover the nMOS region 11, and a p-type impurity, which is boron (B) herein, is implanted at an ion acceleration energy of 2 keV, a dose of $2.5\times10^{14}/cm^2$, and an angle of incidence of 45°. The implantation is repeated four times from directions differing from each other (four different directions inclined by 45° away from the direction of gate length).

Since the top surface and the upper portion of one side face of the gate electrode 6b herein have almost equivalent exposed areas, a single ion implantation according to the above conditions results in introduction of the impurity over the area extending from the top surface to the upper portion of one side face of the gate electrode 6b in an amount equivalent to that possibly attained by ion implantations at an angle of incidence of 0° repeated twice, and also results in introduction of the impurity into one p-type, source-and-drain region 10b in an amount equivalent to that possibly attained by a single ion implantation at an angle of incidence of 0°. Another p-type, source-and-drain region 10b, which is shadowed by the gate electrode 6b, is not introduced with the impurity, or introduced only in a less affective amount.

By the aforementioned ion implantation repeated four times, as shown later in Table 1, the gate electrode 6b will have introduced therein the impurity in an amount equivalent to that possibly attained by ion implantations at an angle of incidence of 0° ($2.5 \times 10^{14}/cm^2$) repeated eight times, in addition to a dose of $2.5 \times 10^{15}/cm^2$ which has previously been attained, and thus will have a total dose of boron of $4.5 \times 10^{15}/cm^2$. On the contrary, each p-type, source-and-drain region 10b will have introduced therein the impurity in an amount equivalent to that possibly attained by ion implantations at an angle of incidence of 0° repeated twice, in addition to a dose of $2.5 \times 10^{15}/cm^2$ which has previously been attained, and thus will have a total dose of boron of $3 \times 10^{15}/cm^2$ (same level with that of general source-and-drain region).

In the aforementioned process for forming the p-type, source-and-drain region 10b, the first ion implantation (at an angle of incidence of 0°) was carried out at an ion acceleration energy of 4 keV, whereas the successive tilt-angled ion implantation was carried at an ion acceleration energy reduced to as low as 2 keV. The energy was thus reduced because it was necessary to prevent the impurity from laterally penetrating the gate electrode 6b, to prevent the impurity from penetrating the sidewall 10b and gate electrode 6b and intruding into the semiconductor substrate 1, and to prevent the impurity implanted into the p-type, source-and-drain region 10b from diffusing toward the channel.

Figure 13C:
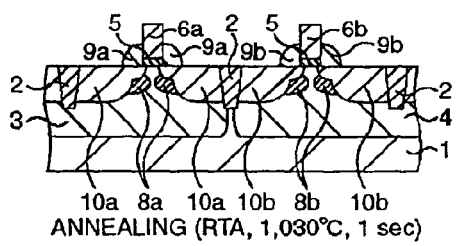

Next, the resist mask 22 is removed typically by ashing, and, as shown in FIG. 13C, the semiconductor substrate 1 is then annealed by RTA (rapid thermal annealing) at 1,030° C. for one second to thereby restore it from damage caused by ion implantation into the gate electrodes 6a, 6b and source-and-drain regions 10a, 10b, and to thereby activate the impurities.

Figure 13D:
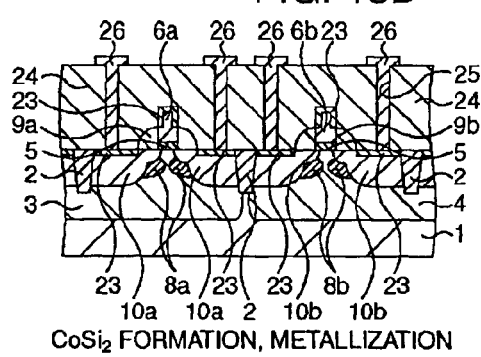

Next, a silicide-forming metal, which is cobalt (Co) herein, is deposited over the entire surface, annealed so as to proceed silicidation, and unreacted Co is removed, to thereby form $CoSi_2$ layers 23 on the exposed surface of the gate electrodes 6a, 6b and on the surface of the source-and-drain region 10a, 10b as shown in FIG. 13D.

An interlayer insulating film 24 is deposited over the entire surface, wirings 26 are formed so as to make contact through contact holes 25, and a CMOS transistor is completed after some additional post-processes.

As has been described in the above, the third embodiment is successful in controlling the impurity concentration of the gate electrodes 6a, 6b higher than that of the source-and-drain regions 10a, 10b by forming the sidewalls 9a, 9a so as to expose the upper portion of the gate electrodes 6a, 6b, and by carrying out the ion implantation from four inclined directions at an angle of incidence of 45°. In the third embodiment, the impurity concentration of the gate electrodes 6a, 6b becomes higher than that of the source-and-drain regions 10a, 10b by approx. 50%, where the impurity concentration of the gate electrodes 6a, 6b can be raised while keeping the general impurity concentration of the source-and-drain regions 10a, 10b unchanged. The third embodiment is thus to provide a highly-reliable CMOS transistor having an improved gate capacitance and short-channel resistance without anticipating fluctuation in the threshold voltage due to variation in shape of the gate electrode.

(Fourth Embodiment)

FIGS. 15A through 16D are schematic sectional views sequentially showing major process steps of a method of fabricating a CMOS transistor according to a fourth embodiment.

Figure 15A:
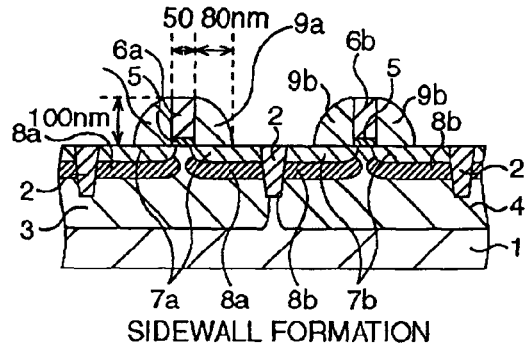
FIGS. 15A to 15D are schematic sectional views sequentially showing major process steps of a method of fabricating a CMOS transistor according to a fourth embodiment.

In the fourth embodiment, the individual process steps previously shown in FIGS. 4A through 6B are executed to thereby form the sidewalls 9a, 9b which cover both side faces of the gate electrodes 6a, 6b and having a maximum width of 80 nm or around (FIG. 15A).

Figure 15B:
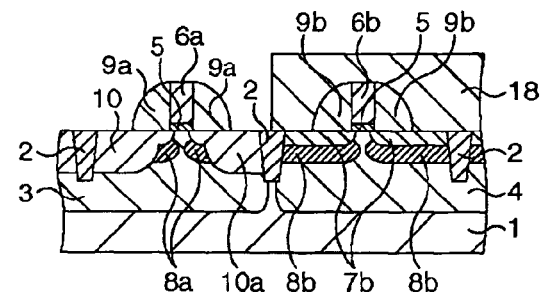

Next, as shown in FIG. 15B, the resist mask 18 is formed so as to cover the pMOS region 12, and an n-type impurity, which is phosphorus (P) herein, is introduced by ion implantation into the nMOS region 11 at an ion acceleration energy of 8 keV, a dose of $5 \times 10^{15}/cm^2$, and an angle of incidence of 0°, to thereby form the n-type, source-and-drain regions 10a. Phosphorus herein is also implanted into the gate electrode 6a. The dose of phosphorus in this process is controlled to a smaller value ($6 \times 10^{15}/cm^2$, for example) than that in general formation process of n-type, source-and-drain regions.

Figure 15C:
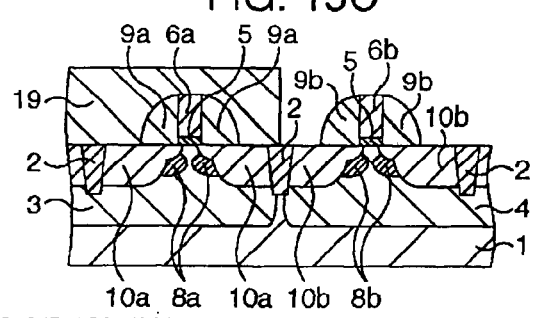

Next, the resist mask 18 is removed typically by ashing, the resist mask 19 is formed so as to cover the nMOS region 11 as shown in FIG. 15C, and a p-type impurity, which is boron (B) herein, is introduced by ion implantation into the pMOS region 12 at an ion acceleration energy of 4 keV, a dose of $2.5 \times 10^{15}/cm^2$ and an angle of incidence of 0°, to thereby form the p-type, source-and-drain regions 10b. Boron herein is also implanted into the gate electrode 6b. The dose of boron in this process is controlled to a smaller value ($3 \times 10^{15}/cm^2$, for example) than that in general formation process of p-type, source-and-drain regions.

Figure 15D:
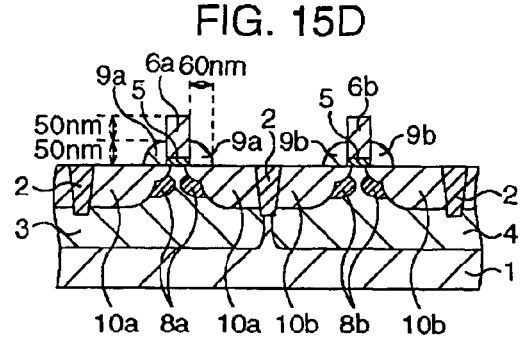

Next, the resist mask 19 is removed typically by ashing, and the sidewalls 9a, 9b are dry-etched (over-etched) to thereby allow the upper portion of both side faces of the gate electrodes 6a, 6b to expose as much as 50 nm or around as shown in FIG. 15D. The gate electrodes 6a, 6b herein are remained so as to expose an area extending from the top surface thereof to the upper portion of both side faces thereof, and the sidewalls 9a, 9b are adjusted so as to have a height of 50 nm or around.

Considering now that the gate electrodes 6a, 6b are subjected to tilt-angled ion implantation described later, the more the sidewalls 9a, 9b are etched, the more the gate electrodes 6a, 6b will have an impurity incorporated therein. Too much amount of etching of the sidewalls 9a, 9b may, however, result in excessive diffusion of the incorporated impurity in the source-and-drain regions 10a, 10b towards the channel, or may raise a risk of short-circuiting between silicides, which are formed later on the source-and-drain regions 10a, 10b and on the gate electrodes 6a, 6b. Thus there is an appropriate range for the amount of etching of the sidewalls 9a, 9b, and 50 nm is one exemplary amount falls within such range.

To prevent the STI-type element isolation structure 2 from being etched together with the sidewalls 9a, 9b, it is preferable to use different materials to form the sidewalls 9a, 9b and STI-type element isolation structure 2 so that the sidewalls 9a, 9b will have a higher etchrate than that of the element isolation structure 2. One preferable example is such that using a plasma oxide film formed in an HDP (high density plasma) apparatus for the STI-type element isolation structure 2 and using an oxide film formed using TEOS (tetraethoxysilane) for the sidewalls 9a, 9b.

Figure 16A:
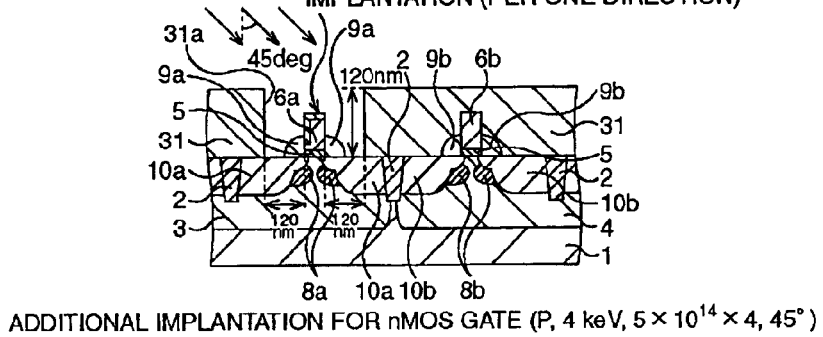
FIGS. 16A to 16D are schematic sectional views sequentially showing process steps as continued from FIG. 15D.

Next, as shown in FIG. 16A, an n-type impurity is implanted along a direction inclined into the nMOS region 11 to thereby introduce the impurity to the exposed surface of the gate electrode 6a (the top surface of 50 nm wide and both side faces of 50 nm high exposed from the sidewall 9a).

More specifically, a resist mask 31 is formed so as to cover the PMOS region 12, which mask 31 having an opening 31a formed in a size capable of protecting the n-type, source-and-drain regions 10a from the tilt-angled ion implantation. The resist mask 31 herein is approx. 120 nm high, and the opening 31a has an edge 120 nm away from the edge of the gate electrode 6a. In alignment of a reticle for forming the opening 31a by photolithography, employing the gate electrode as an alignment mark, in place of a mark formed in the STI process, can successfully reduce mis-alignment. An n-type impurity, which is phosphorus (P) herein, is implanted into the nMOS region 11 at an ion acceleration energy of 4 keV, a dose of $5 \times 10^{14}/cm^2$, and an angle of incidence of 45°. The implantation is repeated four times from four directions differing from each other (twice in two opposing directions parallel to the gate length and twice in two opposing directions normal thereto). The ion implantation repeated four times is shown in a schematic plan view in FIG. 17.

FIG. 16A shows an exemplary ion implantation effected along a direction parallel to the gate length and at an angle of incidence of 45°. Since the top surface and the upper portion of one side face of the gate electrode 6a herein have almost equivalent exposed areas, a single ion implantation according to the above conditions results in introduction of the impurity over the area extending from the top surface to the upper portion of one side face of the gate electrode 6a in an amount equivalent to that possibly attained by ion implantations at an angle of incidence of 0° repeated twice. On the other hand, a pair of n-type, source-and-drain regions 10a are protected by the resist mask 31 against the ion implantation, and are thus prevented from being implanted with the impurity.

Although not being illustrated for convenience, a single ion implantation normal to the gate length at an angle of incidence of 45° results in introduction of the impurity into the gate electrode 6a in an amount equivalent to that possibly attained by a single ion implantation at an angle of incidence of 0°, and also results in introduction of the impurity into both n-type, source-and-drain regions 10a in an amount again equivalent to that possibly attained by a single ion implantation at an angle of incidence of 0°.

By the aforementioned ion implantation repeated four times, as shown later in Table 1, the gate electrode 6a will have introduced therein the impurity in an amount equivalent to that possibly attained by ion implantations at an angle of incidence of 0° ($5 \times 10^{14}/cm^2$) repeated six times, in addition to a dose of $5 \times 10^{15}/cm^2$ which has previously been attained, and thus will have a total dose of phosphorus of $8 \times 10^{15}/cm^2$. On the contrary, each n-type, source-and-drain region 10a will have introduced therein the impurity in an amount equivalent to that possibly attained by ion implantations at an angle of incidence of 0° repeated twice, in addition to a dose of $5 \times 10^{15}/cm^2$ which has previously been attained, and thus will have a total dose of phosphorus of $6 \times 10^{15}/cm^2$ (same level with that of general source-and-drain region).

In the aforementioned process for forming the n-type, source-and-drain region 10a, the first ion implantation (at an angle of incidence of 0°) was carried out at an ion acceleration energy of 8 keV, whereas the successive tilt-angled ion implantation was carried at an ion acceleration energy reduced to as low as 4 keV. The energy was thus reduced because it was necessary to prevent the impurity from laterally penetrating the gate electrode 6a, to prevent the impurity from penetrating the sidewall 10a and gate electrode 6a and intruding into the semiconductor substrate 1, and to prevent the impurity implanted into the n-type, source-and-drain region 10a from diffusing toward the channel.

Figure 16B:
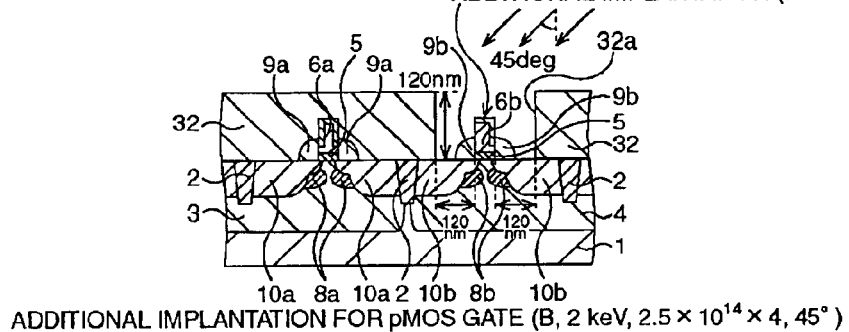

Next, as shown in FIG. 16B, a p-type impurity is implanted along a direction inclined into the pMOS region 12 to thereby introduce the impurity to the exposed surface of the gate electrode 6b (the top surface of 50 nm wide and both side faces of 50 nm high exposed from the sidewall 9b).

More specifically, the resist mask 31 is removed typically by ashing, and a resist mask 32 is formed so as to cover the nMOS region 11, which mask 32 having an opening 32a formed in a size capable of protecting the p-type, source-and-drain regions 10b from the tilt-angled ion implantation. The resist mask 32 herein is approx. 120 nm high, and the opening 32a has an edge 120 nm away from the edge of the gate electrode 6b. In alignment of a reticle for forming the opening 31a by photolithography, employing the gate electrode as an alignment mark, in place of a mark formed in the STI process, can successfully reduce mis-alignment. A p-type impurity, which is boron (B) herein, is implanted into the pMOS region 12 at an ion acceleration energy of 2 keV, a dose of $2.5 \times 10^{14}/cm^2$, and an angle of incidence of 45°. The implantation is repeated four times from four directions differing from each other (twice in two opposing directions parallel to the gate length and twice in two opposing directions normal thereto).

FIG. 16B shows an exemplary ion implantation effected along a direction parallel to the gate length and at an angle of incidence of 45°. Since the top surface and the upper portion of one side face of the gate electrode 6b herein have almost equivalent exposed areas, a single ion implantation according to the above conditions results in introduction of the impurity over the area extending from the top surface to the upper portion of one side face of the gate electrode 6b in an amount equivalent to that possibly attained by ion implantations at an angle of incidence of 0° repeated twice. On the other hand, a pair of p-type, source-and-drain regions 10b are protected by the resist mask 32 against the ion implantation, and are thus prevented from being implanted with the impurity.

Although not being illustrated for convenience, a single ion implantation normal to the gate length at an angle of incidence of 45° results in introduction of the impurity into the gate electrode 6b in an amount equivalent to that possibly attained by a single ion implantation at an angle of incidence of 0°, and also results in introduction of the impurity into both p-type, source-and-drain regions 10b in an amount again equivalent to that possibly attained by a single ion implantation at an angle of incidence of 0°.

By the aforementioned ion implantation repeated four times, as shown later in Table 1, the gate electrode 6b will have introduced therein the impurity in an amount equivalent to that possibly attained by ion implantations at an angle of incidence of 0° ($2.5 \times 10^{14}/cm^2$) repeated six times, in addition to a dose of $2.5 \times 10^{15}/cm^2$ which has previously been attained, and thus will have a total dose of boron of $4 \times 10^{15}/cm^2$. On the contrary, each p-type, source-and-drain region 10b will have introduced therein the impurity in an amount equivalent to that possibly attained by ion implantations at an angle of incidence of 0° repeated twice, in addition to a dose of $2.5 \times 10^{15}/cm^2$ which has previously been attained, and thus will have a total dose of boron of $3 \times 10^{15}/cm^2$ (same level with that of general source-and-drain region).

In the aforementioned process for forming the p-type, source-and-drain region 10b, the first ion implantation (at an angle of incidence of 0°) was carried out at an ion acceleration energy of 4 keV, whereas the successive tilt-angled ion implantation was carried at an ion acceleration energy reduced to as low as 2 keV. The energy was thus reduced because it was necessary to prevent the impurity from laterally penetrating the gate electrode 6b, to prevent the impurity from penetrating the sidewall 10b and gate electrode 6b and intruding into the semiconductor substrate 1, and to prevent the impurity implanted into the p-type, source-and-drain region 10b from diffusing toward the channel.

Figure 16C:
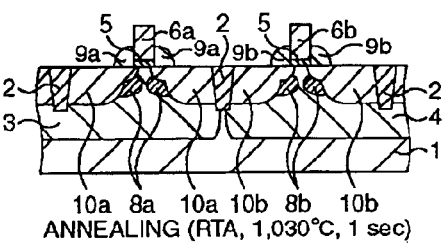

Next, the resist mask 32 is removed typically by ashing, and, as shown in FIG. 16C, the semiconductor substrate 1 is then annealed by RTA (rapid thermal annealing) at 1,030° C. for one second to thereby restore it from damage caused by ion implantation into the gate electrodes 6a, 6b and source-and-drain regions 10a, 10b, and to thereby activate the impurities.

Figure 16D:
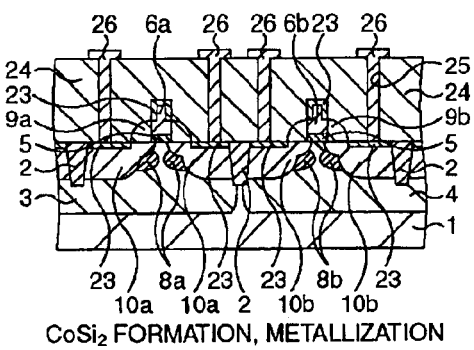

Next, a silicide-forming metal, which is cobalt (Co) herein, is deposited over the entire surface, annealed so as to proceed silicidation, and unreacted Co is removed, to thereby form $CoSi_2$ layers 23 on the exposed surface of the gate electrodes 6a, 6b and on the surface of the source-and-drain region 10a, 10b as shown in FIG. 16D.

An interlayer insulating film 24 is deposited over the entire surface, wirings 26 are formed so as to make contact through contact holes 25, and a CMOS transistor is completed after some additional post-processes.

As has been described in the above, the fourth embodiment is successful in controlling the impurity concentration of the gate electrodes 6a, 6b higher than that of the source-and-drain regions 10a, 10b by forming the sidewalls 9a, 9a so as to expose the upper portion of the gate electrodes 6a, 6b, and by carrying out the ion implantation from four inclined directions at an angle of incidence of 45°. In the fourth embodiment, the impurity concentration of the gate electrodes 6a, 6b becomes higher than that of the source-and-drain regions 10a, 10b by approx. 33%, where the impurity concentration of the gate electrodes 6a, 6b can be raised while keeping the general impurity concentration of the source-and-drain regions 10a, 10b unchanged. The fourth embodiment is thus to provide a highly-reliable CMOS transistor having an improved gate capacitance and short-channel resistance without anticipating fluctuation in the threshold voltage due to variation in shape of the gate electrode.

Moreover in the tilt-angled ion implantation, the source-and-drain regions 10a, 10b are successfully prevented from being implanted with the impurities by virtue of the resist masks 31, 32, and only the gate electrodes 6a, 6b are implanted with impurity ions. This strongly ensures the gate electrodes 6a, 6b to have a higher impurity concentration than the source-and-drain regions 10a, 10b have.

(Modified Example)

Also in the fourth embodiment, similarly to the modified example of the first embodiment, conditions for the first ion implantation for forming the source-and-drain regions or successive tilt-angled ion implantations can properly be selected provided that the impurity concentration of the gate electrodes can be raised without increasing the impurity concentration of the source-and-drain regions.

For example, the first ion implantation of phosphorus for forming the n-type, source-and-drain region 10a is carried out at an ion acceleration energy of 8 keV, a dose of $6\times10^{15}/cm^2$ and an angle of incidence of 0°, and the tilt-angled ion implantation of phosphorus is carried out twice along the direction parallel to the gate length respectively at an ion acceleration energy of 4 keV, a dose of $5\times10^{14}/cm^2$ and an angle of incidence of 45°.

By the ion implantation repeated twice, as shown later in Table 1, the gate electrode 6a will have introduced therein the impurity in an amount equivalent to that possibly attained by ion implantations at an angle of incidence of 0° ($5\times10^{14}/cm^2$) repeated four times, in addition to a dose of $6\times10^{15}/cm^2$ which has previously been attained, and thus will have a total dose of phosphorus of $8\times10^{15}/cm^2$. On the contrary, each n-type, source-and-drain region 10a will contain the impurity only in an amount of $6\times10^{15}/cm^2$ which has initially been attained, which will be at the same level with that of general source-and-drain region.

Similarly to the above, the first ion implantation of boron for forming the p-type, source-and-drain region 10b is carried out at an ion acceleration energy of 4 keV, a dose of $3\times10^{15}/cm^2$ and an angle of incidence of 0°, and the tilt-angled ion implantation of boron is carried out twice along the direction parallel to the gate length respectively at an ion acceleration energy of 2 keV, a dose of $2.5\times10^{14}/cm^2$ and an angle of incidence of 45°.

By the ion implantation repeated twice, as shown later in Table 1, the gate electrode 6b will have introduced therein the impurity in an amount equivalent to that possibly attained by ion implantations at an angle of incidence of 0° ($2.5\times10^{14}/cm^2$) repeated four times, in addition to a dose of $3\times10^{15}/cm^2$ which has previously been attained, and thus will have a total dose of boron of $4\times10^{15}/cm^2$. On the contrary, each p-type, source-and-drain region 10b will contain the impurity only in an amount of $3\times10^{15}/cm^2$ which has initially been attained, which will be at the same level with that of general source-and-drain region.

(Fifth Embodiment)

FIGS. 18A through 19D are schematic sectional views sequentially showing major process steps of a method of fabricating a CMOS transistor according to a fifth embodiment.

Figure 18A:
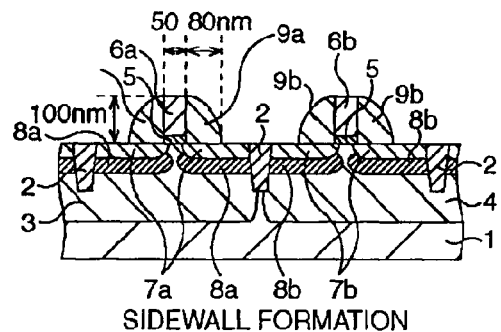
FIGS. 18A to 18D are schematic sectional views sequentially showing major process steps of a method of fabricating a CMOS transistor according to a fifth embodiment.

In the fifth embodiment, the individual process steps previously shown in FIGS. 4A through 6B are executed to thereby form the sidewalls 9a, 9b which cover both side faces of the gate electrodes 6a, 6b and having a maximum width of 80 nm or around (FIG. 18A).

Figure 18B:
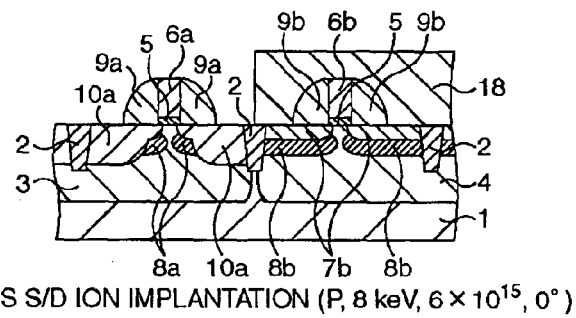

Next, as shown in FIG. 18B, the resist mask 18 is formed so as to cover the pMOS region 12, and an n-type impurity, which is phosphorus (P) herein, is introduced by ion implantation into the nMOS region 11 at an ion acceleration energy of 8 keV, a dose of $6\times10^{15}/cm^2$, and an angle of incidence of 0°, to thereby form the n-type, source-and-drain regions 10a. Phosphorus herein is also implanted into the gate electrode 6a.

Figure 18C:
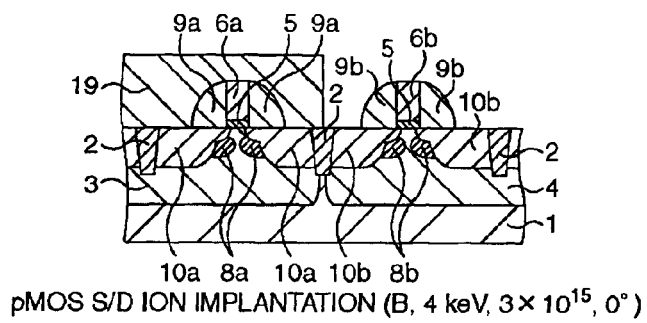

Next, the resist mask 18 is removed typically by ashing, the resist mask 19 is formed so as to cover the nMOS region 11 as shown in FIG. 18C, and a p-type impurity, which is boron (B) herein, is introduced by ion implantation into the pMOS region 12 at an ion acceleration energy of 4 keV, a dose of $3\times10^{15}/cm^2$ and an angle of incidence of 0°, to thereby form the p-type, source-and-drain regions 10b. Boron herein is also implanted into the gate electrode 6b.

Figure 18D:
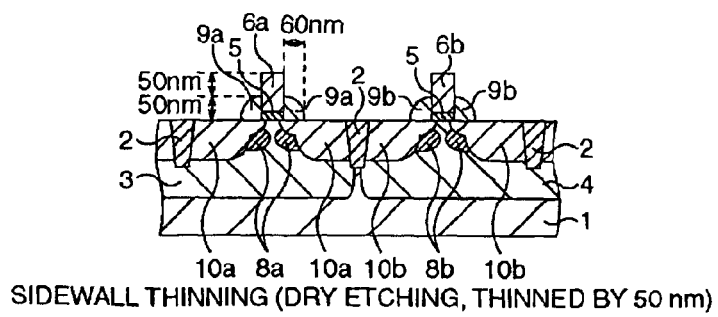

Next, the resist mask 19 is removed typically by ashing, and the sidewalls 9a, 9b are dry-etched (over-etched) to thereby allow the upper portion of both side faces of the gate electrodes 6a, 6b to expose as much as 50 nm or around as shown in FIG. 18D. The gate electrodes 6a, 6b herein are remained so as to expose an area extending from the top surface thereof to the upper portion of both side faces thereof, and the sidewalls 9a, 9b are adjusted so as to have a height of 50 nm or around.

Considering now that the gate electrodes 6a, 6b are subjected to tilt-angled ion implantation described later, the more the sidewalls 9a, 9b are etched, the more the gate electrodes 6a, 6b will have an impurity incorporated therein. Too much amount of etching of the sidewalls 9a, 9b may, however, result in excessive diffusion of the incorporated impurity in the source-and-drain regions 10a, 10b towards the channel, or may raise a risk of short-circuiting between silicides, which are formed later on the source-and-drain regions 10a, 10b and on the gate electrodes 6a, 6b. Thus there is an appropriate range for the amount of etching of the sidewalls 9a, 9b, and 50 nm is one exemplary amount falls within such range.

To prevent the STI-type element isolation structure 2 from being etched together with the sidewalls 9a, 9b, it is preferable to use different materials to form the sidewalls 9a, 9b and STI-type element isolation structure 2 so that the sidewalls 9a, 9b will have a higher etchrate than that of the element isolation structure 2. One preferable example is such that using a plasma oxide film formed in an HDP (high density plasma) apparatus for the STI-type element isolation structure 2 and using an oxide film formed using TEOS (tetraethoxysilane) for the sidewalls 9a, 9b.

Figure 19A:
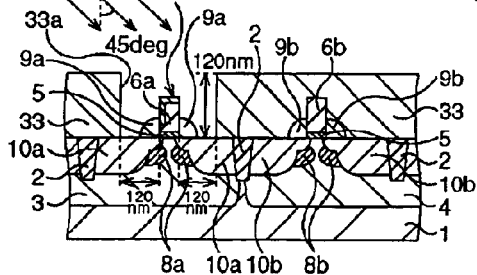
FIGS. 19A to 19D are schematic sectional views sequentially showing process steps as continued from FIG. 18D.

Next, as shown in FIG. 19A, an n-type impurity is implanted along a direction inclined into the nMOS region 11 to thereby introduce the impurity to the exposed surface of the gate electrode 6a (the top surface of 50 nm wide and both side faces of 50 nm high exposed from the sidewall 9a).

More specifically, a resist mask 33 is formed so as to cover the pMOS region 12, which mask 33 having an opening 33a formed in a size capable of protecting the n-type, source-and-drain regions 10a from the tilt-angled ion implantation. The resist mask 33 herein is approx. 120 nm high, and the opening 33a has an edge 120 nm away from the edge of the gate electrode 6a. In alignment of a reticle for forming the opening 33a by photolithography, employing the gate electrode as an alignment mark, in place of a mark formed in the STI process, can successfully reduce mis-alignment. An n-type impurity, which is phosphorus (P) herein, is implanted into the nMOS region 11 at an ion acceleration energy of 4 keV, a dose of $5 \times 10^{14}/cm^2$, and an angle of incidence of 45°. The implantation is repeated four times from directions differing from each other (four different directions inclined by 45° away from the direction of gate length). The ion implantation repeated four times is shown in a schematic plan view in FIG. 20.

A single ion implantation according to the above conditions results in introduction of the impurity over the area extending from the top surface to the upper portion of one side face of the gate electrode 6a in an amount equivalent to that possibly attained by ion implantations at an angle of incidence of 0° repeated twice. On the other hand, a pair of n-type, source-and-drain regions 10a are protected by the resist mask 33 against the ion implantation, and are thus prevented from being implanted with the impurity.

By the aforementioned ion implantation repeated four times, as shown later in Table 1, the gate electrode 6a will have introduced therein the impurity in an amount equivalent to that possibly attained by ion implantations at an angle of incidence of 0° ($5 \times 10^{14}/cm^2$) repeated eight times, in addition to a dose of $6 \times 10^{15}/cm^2$ which has previously been attained, and thus will have a total dose of phosphorus of $1 \times 10^{16}/cm^2$. On the contrary, each n-type, source-and-drain region 10a will contain the impurity only in an amount of $6 \times 10^{15}/cm^2$ which has initially been attained, which will be at the same level with that of general source-and-drain region.

In the aforementioned process for forming the n-type, source-and-drain region 10a, the first ion implantation (at an angle of incidence of 0°) was carried out at an ion acceleration energy of 8 keV, whereas the successive tilt-angled ion implantation was carried at an ion acceleration energy reduced to as low as 4 keV. The energy was thus reduced because it was necessary to prevent the impurity from laterally penetrating the gate electrode 6a, to prevent the impurity from penetrating the sidewall 10a and gate electrode 6a and intruding into the semiconductor substrate 1, and to prevent the impurity implanted into the n-type, source-and-drain region 10a from diffusing toward the channel.

Figure 19B:
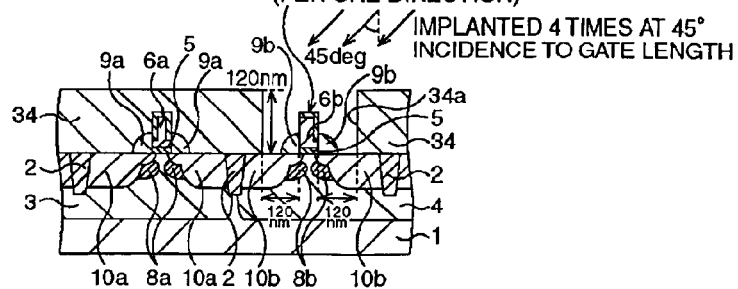

Next, as shown in FIG. 19B, a p-type impurity is implanted into the pMOS region 12 to thereby introduce the impurity to the exposed surface of the gate electrode 6b (the top surface of 50 nm wide and both side faces of 50 nm high exposed from the sidewall 9b).

More specifically, the resist mask 33 is removed typically by ashing, and a resist mask 34 is formed so as to cover the nMOS region 11, which mask 34 having an opening 34a formed in a size capable of protecting the p-type, source-and-drain regions 10b from the tilt-angled ion implantation. The resist mask 34 herein is approx. 120 nm high, and the opening 34a has an edge 120 nm away from the edge of the gate electrode 6b. In alignment of a reticle for forming the opening 31a by photolithography, employing the gate electrode as an alignment mark, in place of a mark formed in the STI process, can successfully reduce mis-alignment. A p-type impurity, which is boron (B) herein, is implanted into the pMOS region 12 at an ion acceleration energy of 2 keV, a dose of $2.5 \times 10^{14}/cm^2$, and an angle of incidence of 45°. The implantation is repeated four times from directions differing from each other (four different directions inclined by 45° away from the direction of gate length).

A single ion implantation according to the above conditions results in introduction of the impurity over the area extending from the top surface to the upper portion of one side face of the gate electrode 6b in an amount equivalent to that possibly attained by ion implantations at an angle of incidence of 0° repeated twice. On the other hand, a pair of p-type, source-and-drain regions 10b are protected by the resist mask 34 against the ion implantation, and are thus prevented from being implanted with the impurity.

By the aforementioned ion implantation repeated four times, as shown later in Table 1, the gate electrode 6b will have introduced therein the impurity in an amount equivalent to that possibly attained by ion implantations at an angle of incidence of 0° ($2.5 \times 10^{14}/cm^2$) repeated eight times, in addition to a dose of $3 \times 10^{15}/cm^2$ which has previously been attained, and thus will have a total dose of boron of $5 \times 10^{15}/cm^2$. On the contrary, each p-type, source-and-drain region 10b will contain the impurity only in an amount of $3 \times 10^{15}/cm^2$ which has initially been attained, which will be at the same level with that of general source-and-drain region.

In the aforementioned process for forming the p-type, source-and-drain region 10b, the first ion implantation (at an angle of incidence of 0°) was carried out at an ion acceleration energy of 4 keV, whereas the successive tilt-angled ion implantation was carried at an ion acceleration energy reduced to as low as 2 keV. The energy was thus reduced because it was necessary to prevent the impurity from laterally penetrating the gate electrode 6b, to prevent the impurity from penetrating the sidewall 10b and gate electrode 6b and intruding into the semiconductor substrate 1, and to prevent the impurity implanted into the n-type, source-and-drain region 10b from diffusing toward the channel.

Figure 19C:
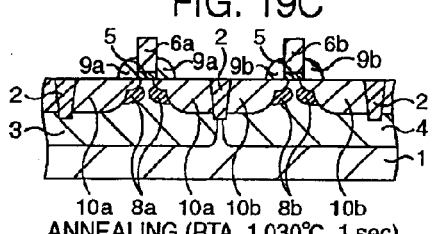

Next, the resist mask 34 is removed typically by ashing, and, as shown in FIG. 19C, the semiconductor substrate 1 is then annealed by RTA (rapid thermal annealing) at 1,030° C. for one second to thereby restore it from damage caused by ion implantation into the gate electrodes 6a, 6b and source-and-drain regions 10a, 10b, and to thereby activate the impurities.

Figure 19D:
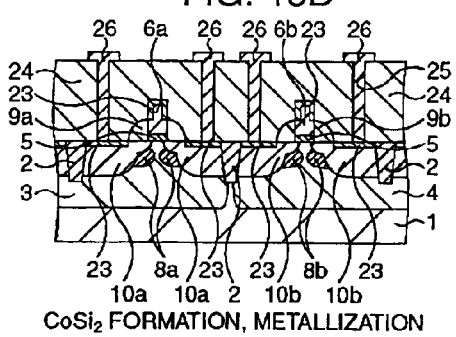

Next, a silicide-forming metal, which is cobalt (Co) herein, is deposited over the entire surface, annealed so as to proceed silicidation, and unreacted Co is removed, to thereby form $CoSi_2$ layers 23 on the exposed surface of the gate electrodes 6a, 6b and on the surface of the source-and-drain region 10a, 10b as shown in FIG. 19D.

An interlayer insulating film 24 is deposited over the entire surface, wirings 26 are formed so as to make contact through contact holes 25, and a CMOS transistor is completed after some additional post-processes.

As has been described in the above, the fifth embodiment is successful in controlling the impurity concentration of the gate electrodes 6a, 6b higher than that of the source-and-drain regions 10a, 10b by forming the sidewalls 9a, 9a so as to expose the upper portion of the gate electrodes 6a, 6b, and by carrying out the ion implantation from four inclined directions at an angle of incidence of 45°. In the fifth embodiment, the impurity concentration of the gate electrodes 6a, 6b becomes higher than that of the source-and-drain regions 10a, 10b by approx. 66%, where the impurity concentration of the gate electrodes 6a, 6b can be raised while keeping the general impurity concentration of the source-and-drain regions 10a, 10b unchanged. The fifth embodiment is thus to provide a highly-reliable CMOS transistor having an improved gate capacitance and short-channel resistance without anticipating fluctuation in the threshold voltage due to variation in shape of the gate electrode.

In addition, the source-and-drain regions 10a, 10b are successfully prevented from being implanted with the impurities by virtue of the resist masks 33, 34, and only the gate electrodes 6a, 6b are implanted with impurity ions. This strongly ensures the gate electrodes 6a, 6b to have a higher impurity concentration than the source-and-drain regions 10a, 10b have.

Short-circuiting between the silicides formed on the source-and-drain regions 10a, 10b and the silicides formed on the gate electrodes 6a, 6b can be prevented by combining the fifth embodiment and second embodiment. This desirably increases the amount of etching of the sidewalls 9a, 9b than that in the fifth embodiment, and makes it possible to further increase the dose of impurities incorporated into the gate electrodes 6a, 6b. It is even allowable to completely remove the sidewalls 9a, 9b by over-etching, because the introduction of impurities into the source-and-drain regions 10a, 10b can be prevented by the resist masks 33, 34 even in the absence of the sidewalls 9a, 9b.

(Sixth Embodiment)

FIGS. 21A through 23D are schematic sectional views sequentially showing major process steps of a method of fabricating a CMOS transistor according to a sixth embodiment.

Figure 21A:
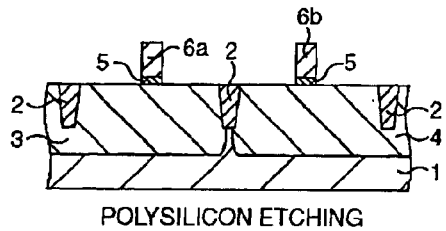
FIGS. 21A to 21D are schematic sectional views sequentially showing major process steps of a method of fabricating a CMOS transistor according to a sixth embodiment.

In the sixth embodiment, the individual process steps previously shown in FIGS. 4A through 5C are executed similarly to as described in the first embodiment, to thereby pattern the gate electrodes 6a, 6b (FIG. 21A).

Figure 21B:
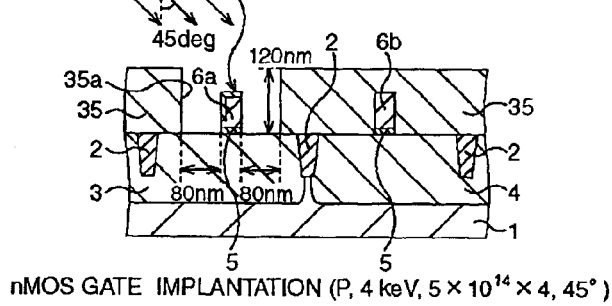

Next, as shown in FIG. 21B, an n-type impurity is implanted along a direction inclined into the nMOS region 11 to thereby introduce the impurity to the exposed surface of the gate electrode 6a (the top surface of 50 nm wide).

More specifically, a resist mask 35 is formed so as to cover the pMOS region 12, which mask 35 having an opening 35a formed in a size capable of protecting the n-type, source-and-drain regions 10a from the tilt-angled ion implantation. The resist mask 35 herein is approx. 120 nm high, and the opening 35a has an edge 80 nm away from the edge of the gate electrode 6a. In alignment of a reticle for forming the opening 35a by photolithography, employing the gate electrode as an alignment mark, in place of a mark formed in the STI process, can successfully reduce mis-alignment. An n-type impurity, which is phosphorus (P) herein, is implanted into the nMOS region 11 at an ion acceleration energy of 4 keV, a dose of $5 \times 10^{14}/cm^2$, and an angle of incidence of 45°. The implantation is repeated four times from directions differing from each other (four different directions inclined by 45° away from the direction of gate length). The ion implantation repeated four times is shown in a schematic plan view in FIG. 24.

Since the top surface and the upper portion of one side face of the gate electrode 6a herein have almost equivalent exposed areas, a single ion implantation according to the above conditions results in introduction of the impurity over the area extending from the top surface to the upper portion of one side face of the gate electrode 6a in an amount equivalent to that possibly attained by ion implantations at an angle of incidence of 0° repeated twice. On the other hand, a pair of n-type, source-and-drain regions 10a are protected by the resist mask 35 against the ion implantation, and are thus prevented from being implanted with the impurity.

Figure 21C:
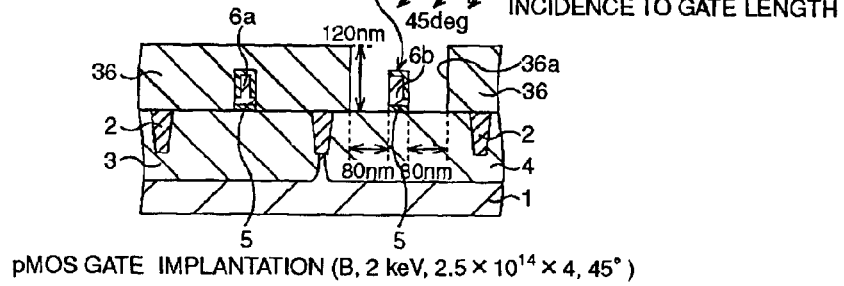

Next, as shown in FIG. 21C, a p-type impurity is implanted along a direction inclined into the pMOS region 12 to thereby introduce the impurity to the exposed surface of the gate electrode 6b (the top surface of 50 nm wide).

More specifically, the resist mask 35 is removed typically by ashing, and a resist mask 36 is formed so as to cover the nMOS region 11, which mask 36 having an opening 36a formed in a size capable of protecting the p-type, source-and-drain regions 10b from the tilt-angled ion implantation. The resist mask 36 herein is approx. 120 nm high, and the opening 36a has an edge 80 nm away from the edge of the gate electrode 6b. In alignment of a reticle for forming the opening 36a by photolithography, employing the gate electrode as an alignment mark, in place of a mark formed in the STI process, can successfully reduce mis-alignment. A p-type impurity, which is boron (B) herein, is implanted into the pMOS region 12 at an ion acceleration energy of 2 keV, a dose of $2.5 \times 10^{14}/cm^2$, and an angle of incidence of 45°. The implantation is repeated four times from directions differing from each other (four different directions inclined by 45° away from the direction of gate length).

A single ion implantation according to the above conditions results in introduction of the impurity over the area extending from the top surface to the upper portion of one side face of the gate electrode 6b in an amount equivalent to that possibly attained by ion implantations at an angle of incidence of 0° repeated twice. On the other hand, a pair of p-type, source-and-drain regions 10b are protected by the resist mask 36 against the ion implantation, and are thus prevented from being implanted with the impurity.

Figure 21D:
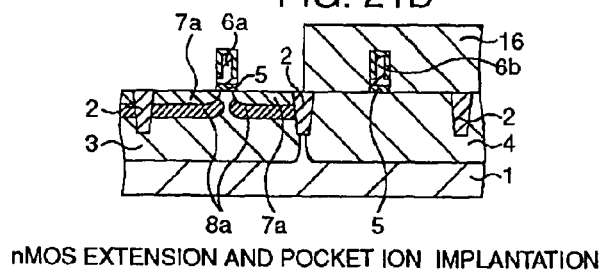

Next, the resist mask 36 is removed typically by ashing, the resist mask 16 is formed so as to cover the pMOS region 12 as shown in FIG. 21D, and an n-type impurity, which is arsenic (As) herein, is introduced by vertical ion implantation into the nMOS region 11 at an ion acceleration energy of 5 keV and a dose of $6 \times 10^{14}/cm^2$; and a p-type impurity, which is boron (B) herein, is also introduced by ion implantation at an ion acceleration energy of 10 keV, a dose of $8\times10^{12}/cm^2$ and at an angle of incidence of 30° from four directions to thereby form n-type extension layers 7a and p-type pocket layers 8a, respectively.

Figure 22A:
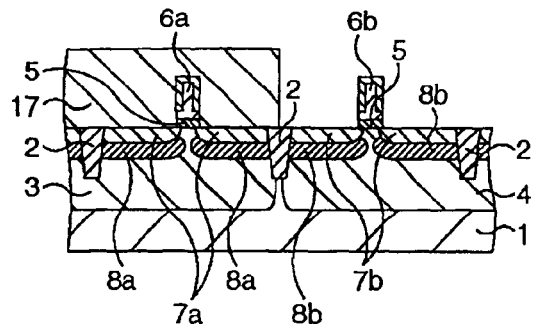
FIGS. 22A to 22D are schematic sectional views sequentially showing process steps as continued from FIG. 21D.

Next, the resist mask 16 is removed typically by ashing, the resist mask 17 is formed so as to cover the nMOS region 11 as shown in FIG. 22A, and a p-type impurity, which is boron (B) herein, is introduced by vertical ion implantation into the pMOS region 12 at an ion acceleration energy of 0.5 keV and a dose of $6\times10^{14}/cm^2$; and an n-type impurity, which is arsenic (As) herein, is also introduced by ion implantation at an ion acceleration energy of 50 keV, a dose of $6\times10^{12}/cm^2$ and at an angle of incidence of 30° from four directions to thereby form p-type extension layers 7b and n-type pocket layers 8b, respectively.

It is to be noted now that the individual process steps shown in FIGS. 21B through 22A can be executed in an arbitrary order.

Figure 22B:
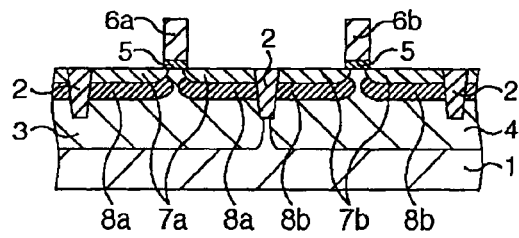

Next, the resist mask 17 is removed typically by ashing, and, as shown in FIG. 22B, the semiconductor substrate 1 is then annealed by RTA (rapid thermal annealing) at 1,000° C. for one second to thereby restore it from damage caused by the ion implantation into the extension layers 7a, 7b and pocket layers 8a, 8b.

Figure 22C:
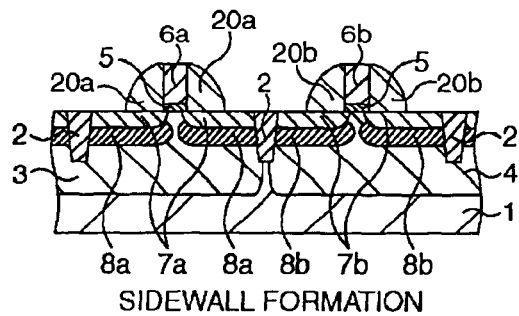

Next, a silicon oxide film (not shown) is deposited on the entire surface by the CVD process, and the film is then anisotropically etched back so as to allow the film to remain only on both side faces of the gate electrodes 6a, 6b, to thereby form sidewalls 20a, 20b having a maximum width of 80 nm or around, as shown in FIG. 22C.

Figure 22D:
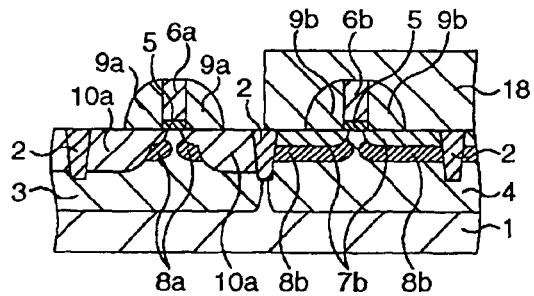

Next, a resist mask 18 is formed so as to cover the pMOS region 12 as shown in FIG. 22D, and an n-type impurity, which is phosphorus (P) herein, is introduced by ion implantation into the nMOS region 11 at an ion acceleration energy of 8 keV, a dose of $6\times10^{15}/cm^2$, and an angle of incidence of 0° (that is, normal to the surface of the substrate), to thereby form the n-type, source-and-drain regions 10a. Phosphorus herein is also implanted into the gate electrode 6a.

In this case, the gate electrode 6a is subjected to four times of the aforementioned tilt-angled ion implantation and a single ion implantation at an angle of incidence of 0°, which results in introduction of the impurity in an amount equivalent to eight times of $5\times10^{14}/cm^2$ plus $6\times10^{15}/cm^2$, total $1\times10^{16}/cm^2$ of phosphorus. On the contrary, each n-type, source-and-drain region 10a will have introduced therein the impurity only in an amount of $6\times10^{15}/cm^2$, which will be at the same level with that of general source-and-drain region.

Figure 23A:
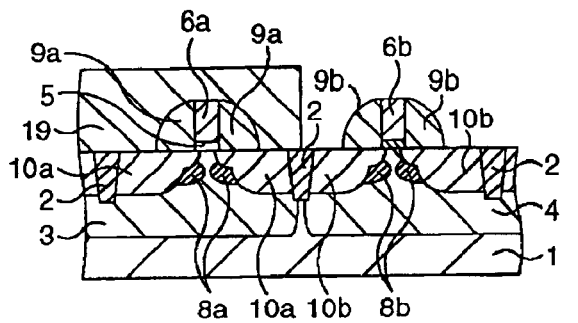
FIGS. 23A to 23D are schematic sectional views sequentially showing process steps as continued from FIG. 22D.

Next, a resist mask 18 is removed typically by ashing, and the resist mask 19 is formed so as to cover the nMOS region 11 as shown in FIG. 23A, and a p-type impurity, which is boron (B) herein, is introduced by ion implantation into the pMOS region 12 at an ion acceleration energy of 4 keV, a dose of $3\times10^{15}/cm^2$, and an angle of incidence of 0°, to thereby form the p-type, source-and-drain regions 10b. Boron herein is also implanted into the gate electrode 6b.

In this case, the gate electrode 6b is subjected to four times of the aforementioned tilt-angled ion implantation and a single ion implantation at an angle of incidence of 0°, which results in introduction of the impurity in an amount equivalent to eight times of $2.5\times10^{14}/cm^2$ plus $3\times10^{15}/cm^2$, total $5\times10^{15}/cm^2$ of boron. On the contrary, each p-type, source-and-drain region 10b will have introduced therein the impurity only in an amount of $3\times10^{15}/cm^2$, which will be at the same level with that of general source-and-drain region.

Figure 23B:
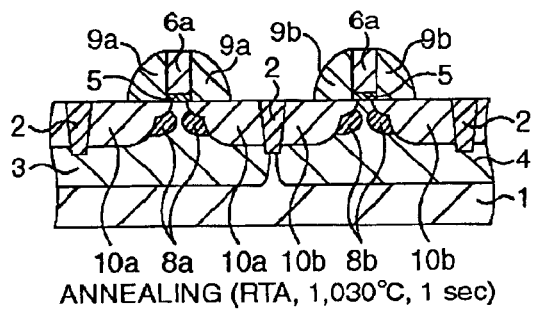

Next, the resist mask 19 is removed typically by ashing, and, as shown in FIG. 23B, the semiconductor substrate 1 is then annealed by RTA (rapid thermal annealing) at 1,030° C. for one second to thereby restore it from damage caused by ion implantation into the gate electrodes 6a, 6b and source-and-drain regions 10a, 10b, and to thereby activate the impurities.

Figure 23C:
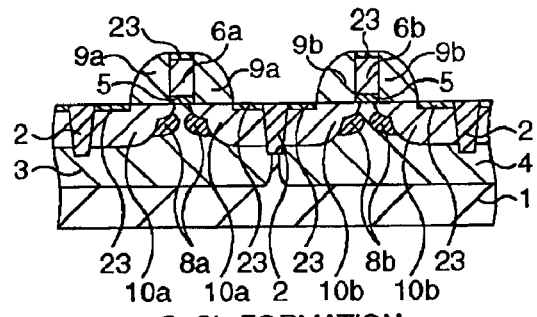

Next, a silicide-forming metal, which is cobalt (Co) herein, is deposited over the entire surface, annealed so as to proceed silicidation, and unreacted Co is removed, to thereby form $CoSi_2$ layers 23 on the exposed surface of the gate electrodes 6a, 6b and on the surface of the source-and-drain region 10a, 10b as shown in FIG. 23C.

Figure 23D:
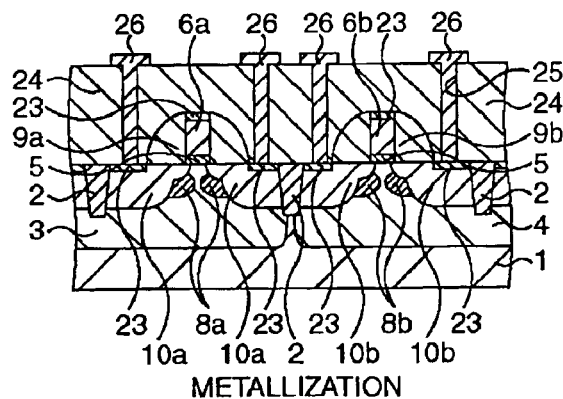

An interlayer insulating film 24 is deposited over the entire surface, wirings 26 are formed so as to make contact through contact holes 25, and a CMOS transistor is completed after some additional post-processes as shown in FIG. 23D.

As has been described in the above, the sixth embodiment is successful in controlling the impurity concentration of the gate electrodes 6a, 6b higher than that of the source-and-drain regions 10a, 10b by carrying out the ion implantation from four inclined directions at an angle of incidence of 45°. In the sixth embodiment, the impurity concentration of the gate electrodes 6a, 6b becomes higher than that of the source-and-drain regions 10a, 10b by approx. 66%, where the impurity concentration of the gate electrodes 6a, 6b can be raised while keeping the general impurity concentration of the source-and-drain regions 10a, 10b unchanged. The sixth embodiment is thus to provide a highly-reliable CMOS transistor having an improved gate capacitance and short-channel resistance without anticipating fluctuation in the threshold voltage due to variation in shape of the gate electrode.

Moreover, in the tilt-angled ion implantation, the source-and-drain regions 10a, 10b are successfully prevented from being implanted with the impurities by virtue of the resist masks 35, 36, and only the gate electrodes 6a, 6b are implanted with impurity ions. This strongly ensures the gate electrodes 6a, 6b to have a higher impurity concentration than the source-and-drain regions 10a, 10b have.

The sixth embodiment is also advantageous in reducing the production cost of CMOS transistor, since a process step of thinning the sidewalls 20a, 20b by over-etching is omissible, although the amounts of dose of impurities in the source-and-drain regions 10a, 10b and gate electrodes 6a, 6b are attainable at the same level with those in the fifth embodiment.

(Seventh Embodiment)

FIGS. 25A through 27D are schematic sectional views sequentially showing major process steps of a method of fabricating a CMOS transistor according to a seventh embodiment.

In the sixth embodiment, the individual process steps previously shown in FIGS. 4A through 5C are executed similarly to as described in the first embodiment, to thereby pattern the gate electrodes 6a, 6b.

Figure 25A:
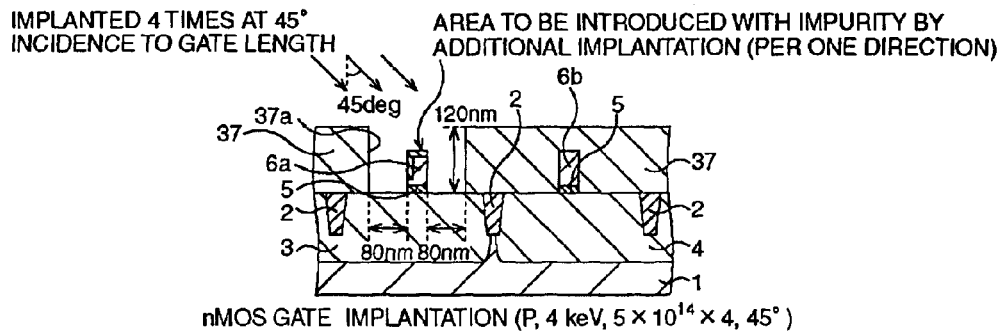
FIGS. 25A to 25D are schematic sectional views sequentially showing major process steps of a method of fabricating a CMOS transistor according to a seventh embodiment.

Next, as shown in FIG. 25A, an n-type impurity is implanted along a direction inclined into the nMOS region 11 to thereby introduce the impurity to the exposed surface of the gate electrode 6a (the top surface of 50 nm wide).

More specifically, a resist mask 37 is formed so as to cover the pMOS region 12, which mask 37 having an opening 37a formed in a size capable of protecting the n-type, source-and-drain regions 10a from the tilt-angled ion implantation. The resist mask 37 herein is approx. 120 nm high, and the opening 37a has an edge 80 nm away from the edge of the gate electrode 6a. In alignment of a reticle for forming the opening 37a by photolithography, employing the gate electrode as an alignment mark, in place of a mark formed in the STI process, can successfully reduce mis-alignment. An n-type impurity, which is phosphorus (P) herein, is implanted into the nMOS region 11 at an ion acceleration energy of 4 keV, a dose of $5 \times 10^{14}/cm^2$, and an angle of incidence of 45°. The implantation is repeated four times from directions differing from each other (four different directions inclined by 45° away from the direction of gate length).

Since the top surface and the upper portion of one side face of the gate electrode 6a herein have almost equivalent exposed areas, a single ion implantation according to the above conditions results in introduction of the impurity over the area extending from the top surface to the upper portion of one side face of the gate electrode 6a in an amount equivalent to that possibly attained by ion implantations at an angle of incidence of 0° repeated twice. On the other hand, a pair of n-type, source-and-drain regions 10a are protected by the resist mask 37 against the ion implantation, and are thus prevented from being implanted with the impurity.

Figure 25B:
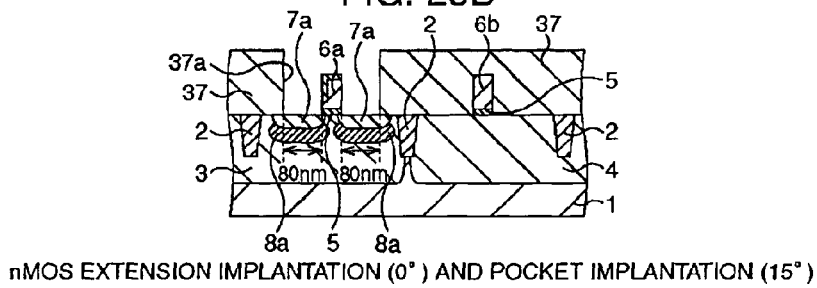

Next, as shown in FIG. 25B, in the presence of the resist mask 37 remained unremoved, an n-type impurity, which is arsenic (As) herein, is vertically implanted into the nMOS region 11 at an ion acceleration energy of 5 keV and a dose of $6 \times 10^{14}/cm^2$; and a p-type impurity, which is boron (B) herein, is also introduced by ion implantation at an ion acceleration energy of 10 keV, a dose of $8 \times 10^{12}/cm^2$ and at an angle of incidence of 15° from four directions to thereby form n-type extension layers 7a and p-type pocket layers 8a, respectively.

Figure 25C:
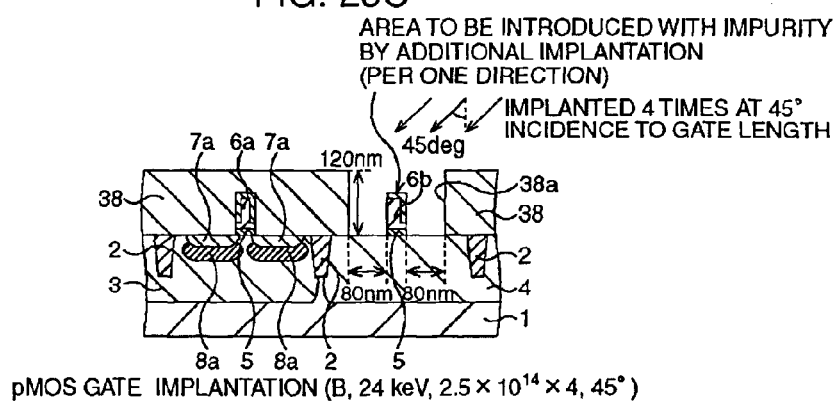

Next, as shown in FIG. 25C, a p-type impurity is implanted along a direction inclined into the pMOS region 12 to thereby introduce the impurity to the exposed surface of the gate electrode 6b (the top surface of 50 nm wide).

More specifically, the resist mask 37 is removed typically by ashing, and a resist mask 38 is formed so as to cover the nMOS region 11, which mask 38 having an opening 38a formed in a size capable of protecting the p-type, source-and-drain regions 10b from the tilt-angled ion implantation. The resist mask 38 herein is approx. 120 nm high, and the opening 38a has an edge 80 nm away from the edge of the gate electrode 6b. In alignment of a reticle for forming the opening 38a by photolithography, employing the gate electrode as an alignment mark, in place of a mark formed in the STI process, can successfully reduce mis-alignment. A p-type impurity, which is boron (B) herein, is implanted into the pMOS region 12 at an ion acceleration energy of 2 keV, a dose of $2.5 \times 10^{14}/cm^2$, and an angle of incidence of 45°. The implantation is repeated four times from directions differing from each other (four different directions inclined by 45° away from the direction of gate length).

A single ion implantation according to the above conditions results in introduction of the impurity over the area extending from the top surface to the upper portion of one side face of the gate electrode 6b in an amount equivalent to that possibly attained by ion implantations at an angle of incidence of 0° repeated twice. On the other hand, a pair of p-type, source-and-drain regions 10b are protected by the resist mask 38 against the ion implantation, and are thus prevented from being implanted with the impurity.

Figure 25D:
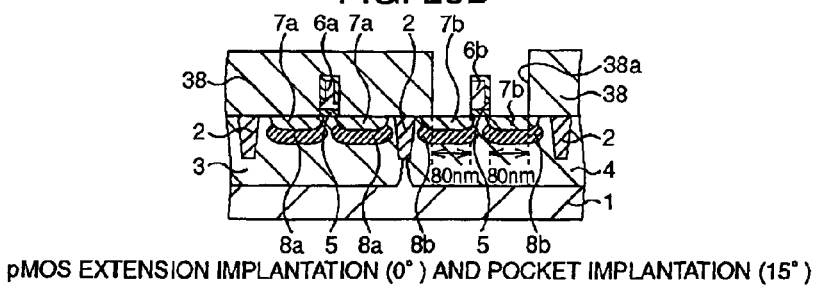

Next, as shown in FIG. 25D, in the presence of the resist mask 38 remained unremoved, a p-type impurity, which is boron (B) herein, is vertically implanted into the pMOS region 12 at an ion acceleration energy of 0.5 keV and a dose of $6 \times 10^{14}/cm^2$; and an n-type impurity, which is arsenic (As) herein, is also introduced by ion implantation at an ion acceleration energy of 50 keV, a dose of $6 \times 10^{12}/cm^2$ and at an angle of incidence of 15° from four directions to thereby form p-type extension layers 7b and n-type pocket layers 8b, respectively.

Figure 26A:
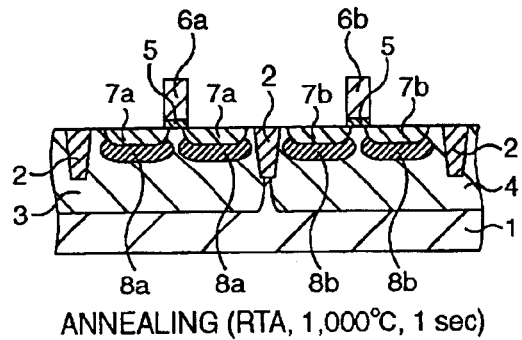
FIGS. 26A to 26D are schematic sectional views sequentially showing process steps as continued from FIG. 25D.

Next, the resist mask 38 is removed typically by ashing, and, as shown in FIG. 26A, the semiconductor substrate 1 is then annealed by RTA (rapid thermal annealing) at 1,000° C. for one second to thereby restore it from damage caused by the ion implantation into the extension layers 7a, 7b and pocket layers 8a, 8b.

Figure 26B:
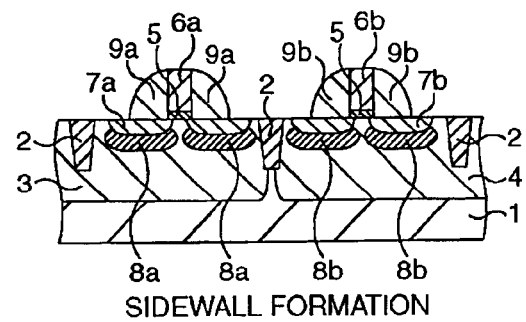

Next, a silicon oxide film (not shown) is deposited on the entire surface by the CVD process, and the film is then anisotropically etched back so as to allow the film to remain only on both side faces of the gate electrodes 6a, 6b, to thereby form sidewalls 9a, 9b having a maximum width of 80 nm or around, as shown in FIG. 26B.

Figure 26C:
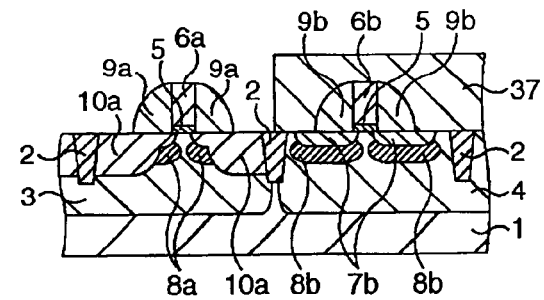

Next, a resist mask 18 is formed so as to cover the pMOS region 12 as shown in FIG. 26C, and an n-type impurity, which is phosphorus (P) herein, is introduced by ion implantation into the nMOS region 11 at an ion acceleration energy of 8 keV, a dose of $6 \times 10^{15}/cm^2$, and an angle of incidence of 0° (that is, normal to the surface of the substrate), to thereby form the n-type, source-and-drain regions 10a. Phosphorus herein is also implanted into the gate electrode 6a.

In this case, the gate electrode 6a is subjected to four times of the aforementioned tilt-angled ion implantation and a single ion implantation at an angle of incidence of 0°, which results in introduction of the impurity in an amount equivalent to eight times of $5 \times 10^{14}/cm^2$ plus $6 \times 10^{15}/cm^2$, total $1 \times 10^{16}/cm^2$ of phosphorus. On the contrary, each n-type, source-and-drain region 10a will have introduced therein the impurity only in an amount of $6 \times 10^{15}/cm^2$, which will be at the same level with that of general source-and-drain region.

Figure 26D:
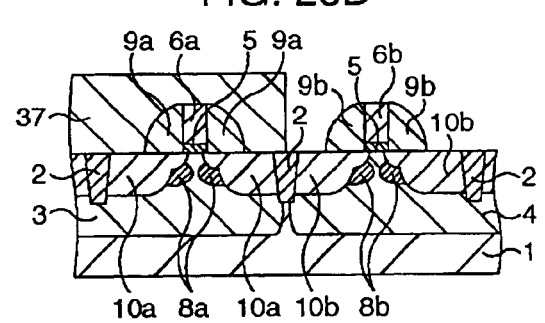

Next, a resist mask 18 is removed typically by ashing, and the resist mask 19 is formed so as to cover the nMOS region 11 as shown in FIG. 26D, and a p-type impurity, which is boron (B) herein, is introduced by ion implantation into the pMOS region 12 at an ion acceleration energy of 4 keV, a dose of $3 \times 10^{15}/cm^2$, and an angle of incidence of 0°, to thereby form the p-type, source-and-drain regions 10b. Boron herein is also implanted into the gate electrode 6b.

In this case, the gate electrode 6b is subjected to four times of the aforementioned tilt-angled ion implantation and a single ion implantation at an angle of incidence of 0°, which results in introduction of the impurity in an amount equivalent to eight times of $2.5 \times 10^{14}/cm^2$ plus $3 \times 10^{15}/cm^2$, total $5 \times 10^{15}/cm^2$ of boron. On the contrary, each p-type, source-and-drain region 10b will have introduced therein the impurity only in an amount of $3 \times 10^{15}/cm^2$, which will be at the same level with that of general source-and-drain region.

Figure 27A:
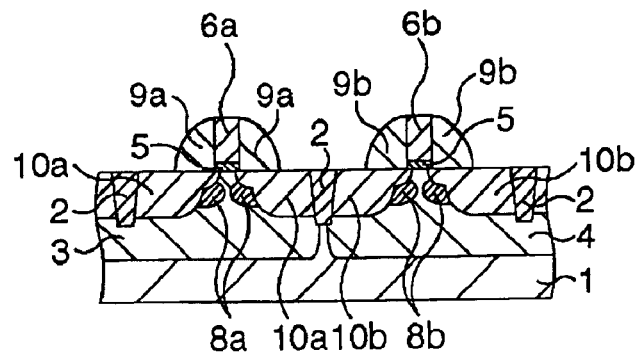
FIGS. 27A to 27C are schematic sectional views sequentially showing process steps as continued from FIG. 26D.

Next, the resist mask 19 is removed typically by ashing, and, as shown in FIG. 27A, the semiconductor substrate 1 is then annealed by RTA (rapid thermal annealing) at 1,030° C. for one second to thereby restore it from damage caused by ion implantation into the gate electrodes 6a, 6b and source-and-drain regions 10a, 10b, and to thereby activate the impurities.

Figure 27B:
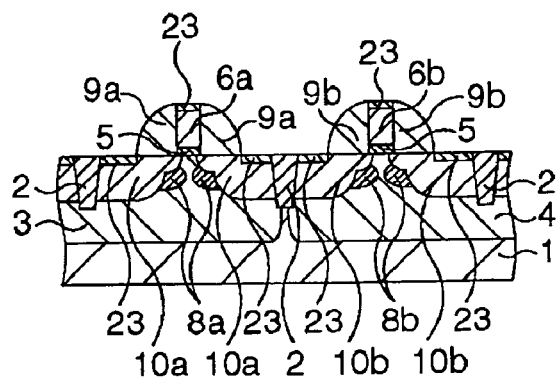

Next, a silicide-forming metal, which is cobalt (Co) herein, is deposited over the entire surface, annealed so as to proceed silicidation, and unreacted Co is removed, to thereby form $CoSi_2$ layers 23 on the exposed surface of the gate electrodes 6a, 6b and on the surface of the source-and-drain region 10a, 10b as shown in FIG. 27B.

Figure 27C:
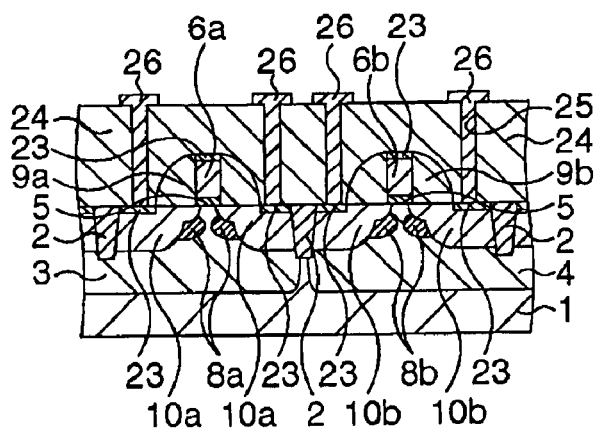

An interlayer insulating film 24 is deposited over the entire surface, wirings 26 are formed so as to make contact through contact holes 25, and a CMOS transistor is completed after some additional post-processes as shown in FIG. 27C.

As has been described in the above, the seventh embodiment is successful in controlling the impurity concentration of the gate electrodes 6a, 6b higher than that of the source-and-drain regions 10a, 10b by carrying out the ion implantation from four inclined directions at an angle of incidence of 45°. In the seventh embodiment, the impurity concentration of the gate electrodes 6a, 6b becomes higher than that of the source-and-drain regions 10a, 10b by approx. 66%, where the impurity concentration of the gate electrodes 6a, 6b can be raised while keeping the general impurity concentration of the source-and-drain regions 10a, 10b unchanged. The seventh embodiment is thus to provide a highly-reliable CMOS transistor having an improved gate capacitance and short-channel resistance without anticipating fluctuation in the threshold voltage due to variation in shape of the gate electrode.

Moreover, in the tilt-angled ion implantation, the source-and-drain regions 10a, 10b are successfully prevented from being implanted with the impurities by virtue of the resist masks 37, 38, and only the gate electrodes 6a, 6b are implanted with impurity ions. This strongly ensures the gate electrodes 6a, 6b to have a higher impurity concentration than the source-and-drain regions 10a, 10b have.

The seventh embodiment is also advantageous in further reducing the production cost of CMOS transistor, since a process step of thinning the sidewalls 20a, 20b by over-etching is omissible, and since a process step of photolithography for forming the extension layers 7a, 7b and pocket layers 8a, 8b is omissible, although the amounts of dose of impurities in the source-and-drain regions 10a, 10b and gate electrodes 6a, 6b are attainable at the same level with those in the fifth embodiment.
(Modified Example)

A modified example of the seventh embodiment will be described.

FIGS. 28A through 29C are schematic sectional views sequentially showing major process steps of a method of fabricating a CMOS transistor according to a modified example of the seventh embodiment.

Figure 28A:
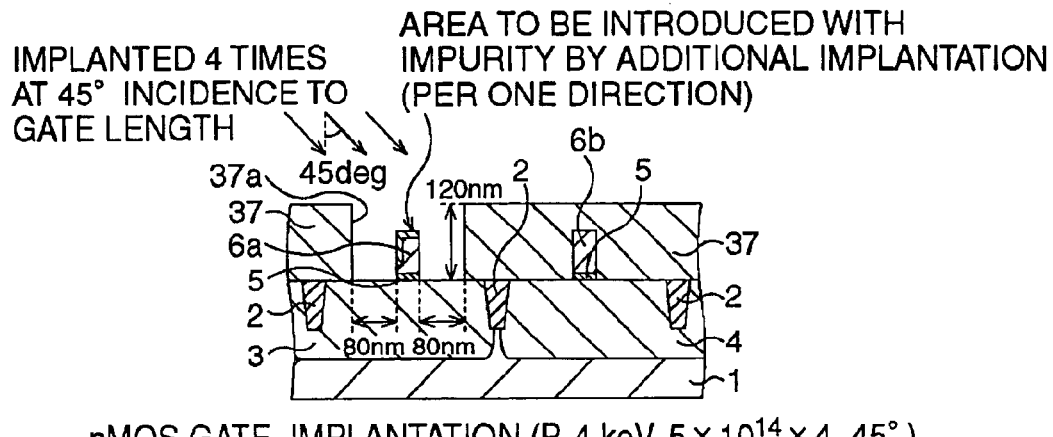
FIGS. 28A to 28C are schematic sectional views sequentially showing process steps of a method of fabricating a CMOS transistor according to a modified example of the seventh embodiment.

In this modified example, similarly to as previously shown in FIG. 25B, the gate electrode 6a is subjected to the tilt-angled ion implantation in the presence of the resist mask 37 (FIG. 28A).

Figure 28B:
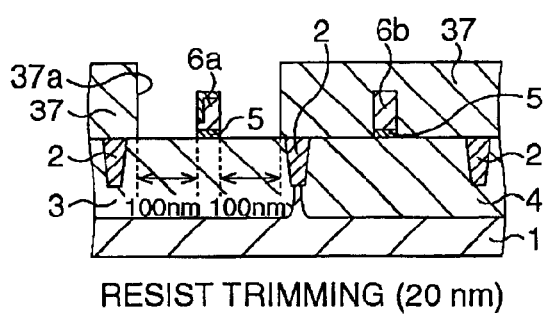

Next, as shown in FIG. 28B, the resist mask 37 is trimmed so that the opening 37a is widened to have an edge recessed by 100 nm from the edge of the gate electrode 6a.

Figure 28C:
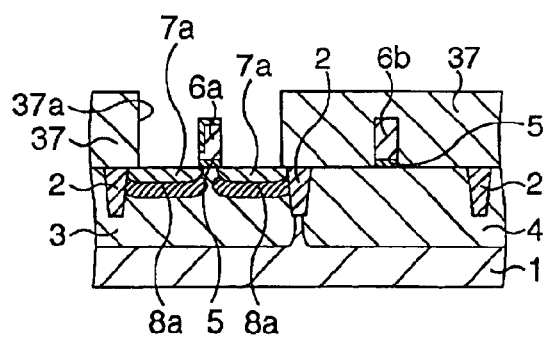

In this status, as shown in FIG. 28C, an n-type impurity, which is arsenic (As) herein, is vertically implanted into the nMOS region 11 at an ion acceleration energy of 5 keV and a dose of $6\times10^{14}/cm^2$; and a p-type impurity, which is boron (B) herein, is also introduced by ion implantation at an ion acceleration energy of 10 keV, a dose of $8\times10^{12}/cm^2$ and at an angle of incidence of 30° from four directions to thereby form the n-type extension layers 7a and p-type pocket layers 8a, respectively.

Figure 29A:
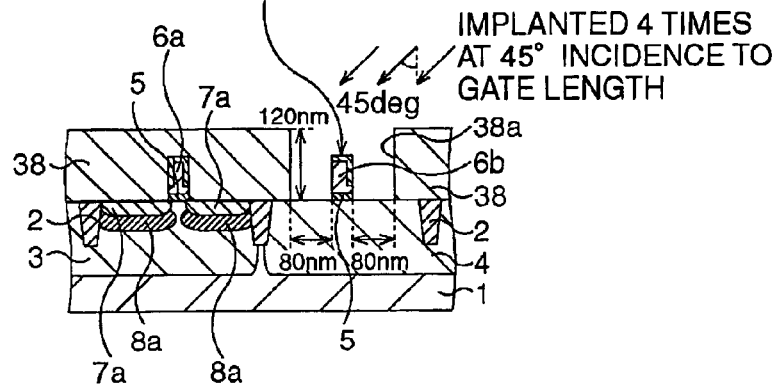
FIGS. 29A to 29C are schematic sectional views sequentially showing process steps as continued from FIG. 28C.

Next, the resist mask 37 is removed typically by ashing, and then similarly to as previously shown in FIG. 25C, the gate electrode 6b is subjected to the tilt-angled ion implantation in the presence of the resist mask 38 (FIG. 29A).

Figure 29B:
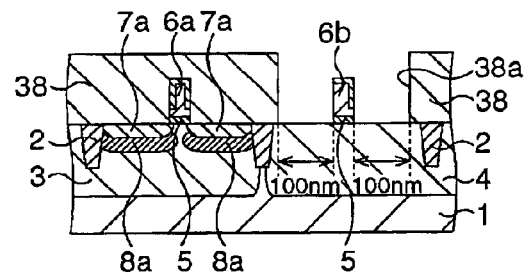
Figure 29C:
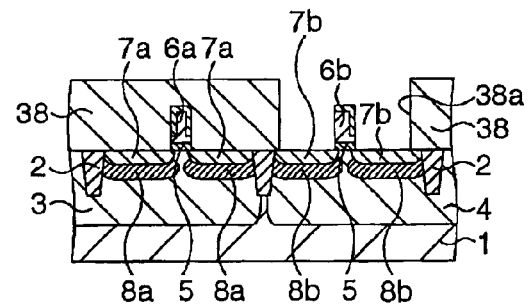

Next, as shown in FIG. 29B, the resist mask 38 is trimmed so that the opening 38a is widened to have an edge recessed by 100 nm from the edge of the gate electrode 6b.

In this status, a p-type impurity, which is boron (B) herein, is vertically implanted into the pMOS region 12 at an ion acceleration energy of 0.5 keV and a dose of $6\times10^{14}/cm^2$; and an n-type impurity, which is arsenic (As) herein, is also introduced by ion implantation at an ion acceleration energy of 50 keV, a dose of $6\times10^{12}/cm^2$ and at an angle of incidence of 30° from four directions to thereby form the p-type extension layers 7b and n-type pocket layers 8b, respectively.

The resist mask 38 is then removed typically by ashing, and a CMOS transistor is completed after executing various process steps similarly to those in the seventh embodiment as shown in FIGS. 26A to 27C.

In addition to various effects obtainable from the seventh embodiment, this modified example makes it possible to form the extension layers 7a, 7b and pocket layers 8a, 8b expanded to desired dimensions at a high degree of freedom by trimming the resist masks 37, 38, without limiting dimensions of the extension layers 7a, 7b and pocket layers 8a, 8b in view of preventing the tilt-angled ion implantation.
(Eighth Embodiment)

FIGS. 30A through 32D are schematic sectional views sequentially showing major process steps of a method of fabricating a CMOS transistor according to a eighth embodiment.

Figure 30A:
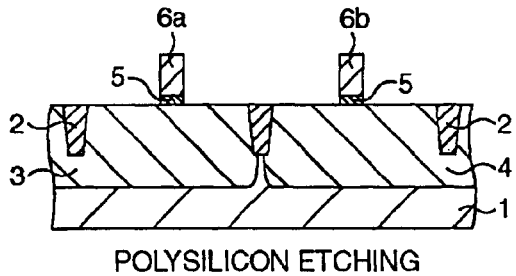
FIGS. 30A to 30D are schematic sectional views sequentially showing major process steps of a method of fabricating a CMOS transistor according to a eighth embodiment.

In the eighth embodiment, the individual process steps previously shown in FIGS. 4A through 5C are executed similarly to as described in the first embodiment, to thereby pattern the gate electrodes 6a, 6b (FIG. 30A).

Figure 30B:
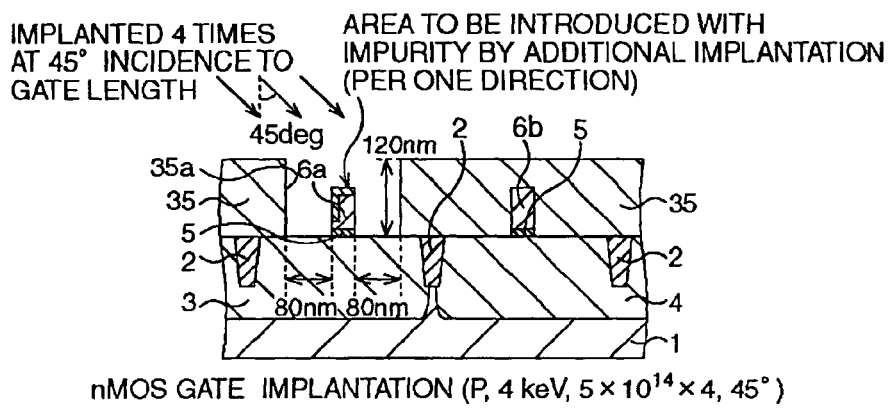

Next, as shown in FIG. 30B, an n-type impurity is implanted along a direction inclined into the nMOS region 11 to thereby introduce the impurity to the exposed surface of the gate electrode 6a (the top surface of 50 nm wide).

More specifically, the resist mask 35 is formed so as to cover the pMOS region 12, which mask 35 having the opening 35a formed in a size capable of protecting the n-type, source-and-drain regions 10a from the tilt-angled ion implantation. The resist mask 35 herein is approx. 120 nm high, and the opening 35a has an edge 80 nm away from the edge of the gate electrode 6a. In alignment of a reticle for forming the opening 35a by photolithography, employing the gate electrode as an alignment mark, in place of a mark formed in the STI process, can successfully reduce misalignment. An n-type impurity, which is phosphorus (P) herein, is implanted into the nMOS region 11 at an ion acceleration energy of 4 keV, a dose of $5\times10^{14}/cm^2$, and an angle of incidence of 45°. The implantation is repeated four times from directions differing from each other (four different directions inclined by 45° away from the direction of gate length).

Since the top surface and the upper portion of one side face of the gate electrode 6a herein have almost equivalent exposed areas, a single ion implantation according to the above conditions results in introduction of the impurity over the area extending from the top surface to the upper portion of one side face of the gate electrode 6a in an amount equivalent to that possibly attained by ion implantations at an angle of incidence of 0° repeated twice. On the other hand, a pair of n-type, source-and-drain regions 10a are protected by the resist mask 35 against the ion implantation, and are thus prevented from being implanted with the impurity.

Figure 30C:
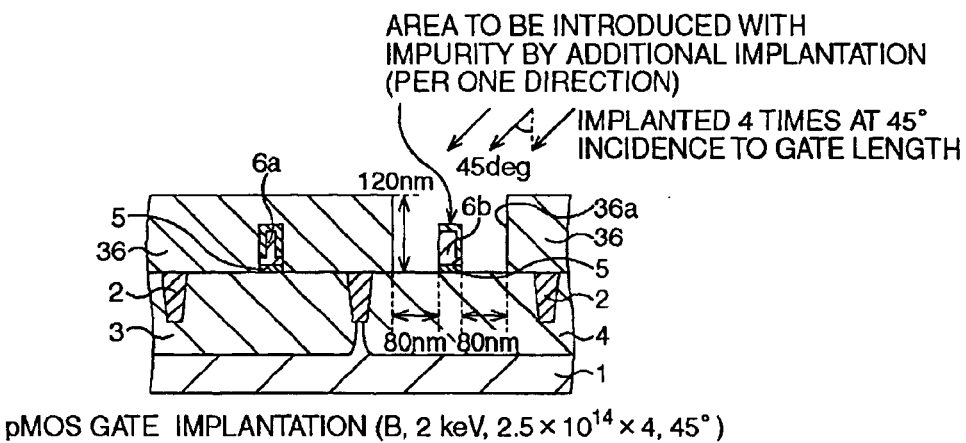

Next, as shown in FIG. 30C, a p-type impurity is implanted along a direction inclined into the pMOS region 12 to thereby introduce the impurity to the exposed surface of the gate electrode 6b (the top surface of 50 nm wide).

More specifically, the resist mask 35 is removed typically by ashing, and the resist mask 36 is formed so as to cover the nMOS region 11, which mask 36 having the opening 36a formed in a size capable of protecting the p-type, source-and-drain regions 10b from the tilt-angled ion implantation. The resist mask 36 herein is approx. 120 nm high, and the opening 36a has an edge 80 nm away from the edge of the gate electrode 6b. In alignment of a reticle for forming the opening 36a by photolithography, employing the gate electrode as an alignment mark, in place of a mark formed in the STI process, can successfully reduce mis-alignment. A p-type impurity, which is boron (B) herein, is implanted into the pMOS region 12 at an ion acceleration energy of 2 keV, a dose of $2.5\times10^{14}/cm^2$, and an angle of incidence of 45°. The implantation is repeated four times from directions differing from each other (four different directions inclined by 45° away from the direction of gate length).

A single ion implantation according to the above conditions results in introduction of the impurity over the area extending from the top surface to the upper portion of one side face of the gate electrode 6b in an amount equivalent to that possibly attained by ion implantations at an angle of incidence of 0° repeated twice. On the other hand, a pair of p-type, source-and-drain regions 10b are protected by the resist mask 36 against the ion implantation, and are thus prevented from being implanted with the impurity.

Figure 30D:
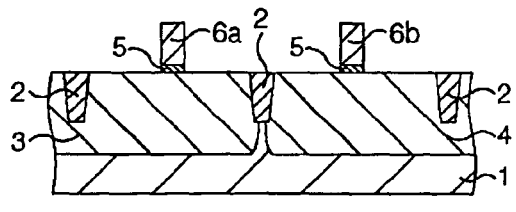

Next, the resist mask 36 is removed typically by ashing, and, as shown in FIG. 30D, the semiconductor substrate 1 is then annealed by RTA (rapid thermal annealing) at 1,050° C. for 1 second to thereby thoroughly diffuse the impurities incorporated into the gate electrodes 6a, 6b.

Figure 31A:
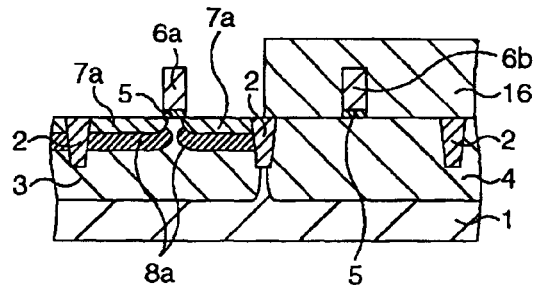
FIGS. 31A to 31D are schematic sectional views sequentially showing process steps as continued from FIG. 30D.

Next, the resist mask 16 is formed so as to cover the pMOS region 12 as shown in FIG. 31A, and an n-type impurity, which is arsenic (As) herein, is introduced by vertical ion implantation into the nMOS region 11 at an ion acceleration energy of 5 keV and a dose of $6\times10^{14}/cm^2$; and a p-type impurity, which is boron (B) herein, is also introduced by ion implantation at an ion acceleration energy of 10 keV, a dose of $8\times10^{12}/cm^2$ and at an angle of incidence of 30° from four directions to thereby form the n-type extension layers 7a and p-type pocket layers 8a, respectively.

Figure 31B:
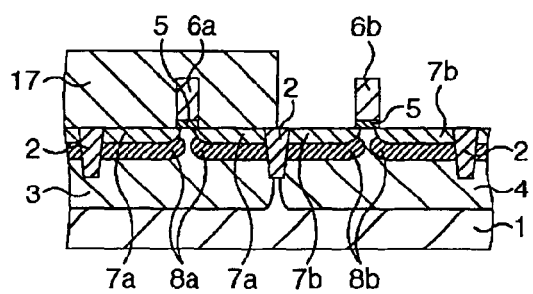

Next, the resist mask 16 is removed typically by ashing, the resist mask 17 is formed so as to cover the nMOS region 11 as shown in FIG. 31B, and a p-type impurity, which is boron (B) herein, is introduced by vertical ion implantation into the pMOS region 12 at an ion acceleration energy of 0.5 keV and a dose of $6\times10^{14}/cm^2$; and an n-type impurity, which is arsenic (As) herein, is also introduced by ion implantation at an ion acceleration energy of 50 keV, a dose of $6\times10^{12}/cm^2$ and at an angle of incidence of 30° from four directions to thereby form the p-type extension layers 7b and n-type pocket layers 8b, respectively.

Figure 31C:
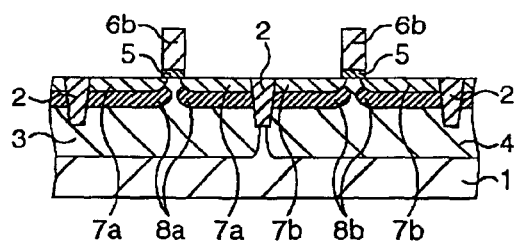

Next, the resist mask 17 is removed typically by ashing, and, as shown in FIG. 31C, the semiconductor substrate 1 is then annealed by RTA (rapid thermal annealing) at 1,000° C. for one second to thereby restore it from damage caused by the ion implantation into the extension layers 7a, 7b and pocket layers 8a, 8b.

Figure 31D:
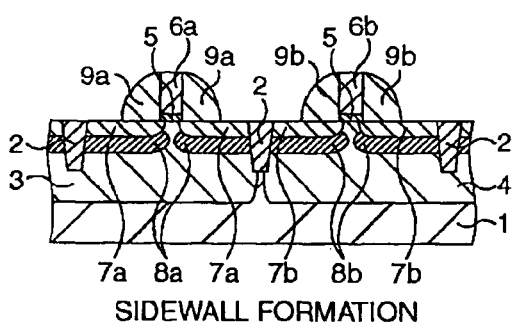

Next, a silicon oxide film (not shown) is deposited on the entire surface by the CVD process, and the film is then anisotropically etched back so as to allow the film to remain only on both side faces of the gate electrodes 6a, 6b, to thereby form sidewalls 9a, 9b having a maximum width of 80 nm or around, as shown in FIG. 31D.

Next, a resist mask 18 is formed so as to cover the pMOS region 12 as shown in FIG. 32A, and an n-type impurity, which is phosphorus (P) herein, is introduced by ion implantation into the nMOS region 11 at an ion acceleration energy of 8 keV, a dose of $6\times10^{15}/cm^2$, and an angle of incidence of 0° (that is, normal to the surface of the substrate), to thereby form the n-type, source-and-drain regions 10a. Phosphorus herein is also implanted into the gate electrode 6a.

In this case, the gate electrode 6a is subjected to four times of the aforementioned tilt-angled ion implantation and a single ion implantation at an angle of incidence of 0°, which results in introduction of the impurity in an amount equivalent to eight times of $5\times10^{14}/cm^2$ plus $6\times10^{15}/cm^2$, total $1\times10^{16}/cm^2$ of phosphorus. On the contrary, each n-type, source-and-drain region 10a will have introduced therein the impurity only in an amount of $6\times10^{15}/cm^2$, which will be at the same level with that of general source-and-drain region.

Next, a resist mask 18 is removed typically by ashing, and the resist mask 19 is formed so as to cover the nMOS region 11 as shown in FIG. 32B, and a p-type impurity, which is boron (B) herein, is introduced by ion implantation into the pMOS region 12 at an ion acceleration energy of 4 keV, a dose of $3\times10^{15}/cm^2$, and an angle of incidence of 0°, to thereby form the p-type, source-and-drain regions 10b. Boron herein is also implanted into the gate electrode 6b.

In this case, the gate electrode 6b is subjected to four times of the aforementioned tilt-angled ion implantation and a single ion implantation at an angle of incidence of 0°, which results in introduction of the impurity in an amount equivalent to eight times of $2.5\times10^{14}/cm^2$ plus $3\times10^{15}/cm^2$, total $5\times10^{15}/cm^2$ of boron. On the contrary, each p-type, source-and-drain region 10b will have introduced therein the impurity only in an amount of $3\times10^{15}/cm^2$, which will be at the same level with that of general source-and-drain region.

Next, the resist mask 19 is removed typically by ashing, and, as shown in FIG. 32C, the semiconductor substrate 1 is then annealed by RTA (rapid thermal annealing) at 1,020° C. for one second to thereby restore it from damage caused by ion implantation into the gate electrodes 6a, 6b and source-and-drain regions 10a, 10b, and to thereby activate the impurities. As described in the above, annealing temperature herein in the eighth embodiment can be reduced from 1,030° C. to 1,020° C. since the impurities introduced into the gate electrode 6a, 6b have already been activated in the process step shown in FIG. 30D, which is advantageous in further suppressing diffusion of the impurities in the extension layers 7a, 7b and pocket layers 8a, 8b, and thus suppressing the short-channel effect.

Next, a silicide-forming metal, which is cobalt (Co) herein, is deposited over the entire surface, annealed so as to proceed silicidation, and unreacted Co is removed, to thereby form $CoSi_2$ layers 23 on the exposed surface of the gate electrodes 6a, 6b and on the surface of the source-and-drain region 10a, 10b as shown in FIG. 32D.

An interlayer insulating film 24 is deposited over the entire surface, wirings 26 are formed so as to make contact through contact holes 25, and a CMOS transistor is completed after some additional post-processes.

As has been described in the above, the eighth embodiment is successful in controlling the impurity concentration of the gate electrodes 6a, 6b higher than that of the source-and-drain regions 10a, 10b by carrying out the ion implantation from four inclined directions at an angle of incidence of 45°. In the eighth embodiment, the impurity concentration of the gate electrodes 6a, 6b becomes higher than that of the source-and-drain regions 10a, 10b by approx. 66%, where the impurity concentration of the gate electrodes 6a, 6b can be raised while keeping the general impurity concentration of the source-and-drain regions 10a, 10b unchanged. The eighth embodiment is thus to provide a highly-reliable CMOS transistor having an improved gate capacitance and short-channel resistance without anticipating fluctuation in the threshold voltage due to variation in shape of the gate electrode.

Moreover, in the tilt-angled ion implantation, the source-and-drain regions 10a, 10b are successfully prevented from being implanted with the impurities by virtue of the resist masks 35, 36, and only the gate electrodes 6a, 6b are implanted with impurity ions. This strongly ensures the gate electrodes 6a, 6b to have a higher impurity concentration than the source-and-drain regions 10a, 10b have.

The eighth embodiment is also advantageous in reducing the production cost of CMOS transistor, since a process step of thinning the sidewalls 20a, 20b by over-etching is omissible, although the amounts of dose of impurities in the source-and-drain regions 10a, 10b and gate electrodes 6a, 6b are attainable at the same level with those in the fifth embodiment. Still another advantage resides in that the impurity concentration of the gate electrodes 6a, 6b can be raised in the vicinity of the gate insulating film 5, since the semiconductor substrate 1 is once annealed immediately after the gate electrodes 6a, 6b are subjected to the tilt-angled ion implantation.

(Ninth Embodiment)

FIGS. 33A through 34C are schematic sectional views sequentially showing major process steps of a method of fabricating a CMOS transistor according to a ninth embodiment.

In the ninth embodiment, the individual process steps previously shown in FIGS. 4A through 5C are executed similarly to as described in the first embodiment, to thereby pattern the gate electrodes 6a, 6b (FIG. 33A).

Next, as shown in FIG. 33B, an n-type impurity is implanted along a direction inclined into the nMOS region 11 to thereby introduce the impurity to the exposed surface of the gate electrode 6a (the top surface of 50 nm wide).

More specifically, the resist mask 35 is formed so as to cover the pMOS region 12, which mask 35 having the opening 35a formed in a size capable of protecting the n-type, source-and-drain regions 10a from the tilt-angled ion implantation. The resist mask 35 herein is approx. 120 nm high, and the opening 35a has an edge 80 nm away from the edge of the gate electrode 6a. In alignment of a reticle for forming the opening 35a by photolithography, employing the gate electrode as an alignment mark, in place of a mark formed in the STI process, can successfully reduce mis-alignment. An n-type impurity, which is phosphorus (P) herein, is implanted into the nMOS region 11 at an ion acceleration energy of 4 keV, a dose of $5 \times 10^{14}/cm^2$, and an angle of incidence of 45°. The implantation is repeated four times from directions differing from each other (four different directions inclined by 45° away from the direction of gate length).

Since the top surface and the upper portion of one side face of the gate electrode 6a herein have almost equivalent exposed areas, a single ion implantation according to the above conditions results in introduction of the impurity over the area extending from the top surface to the upper portion of one side face of the gate electrode 6a in an amount equivalent to that possibly attained by ion implantations at an angle of incidence of 0° repeated twice. On the other hand, a pair of n-type, source-and-drain regions 10a are protected by the resist mask 35 against the ion implantation, and are thus prevented from being implanted with the impurity.

Next, as shown in FIG. 33C, a p-type impurity is implanted along a direction inclined into the pMOS region 12 to thereby introduce the impurity to the exposed surface of the gate electrode 6b (the top surface of 50 nm wide).

More specifically, the resist mask 35 is removed typically by ashing, and the resist mask 36 is formed so as to cover the nMOS region 11, which mask 36 having the opening 36a formed in a size capable of protecting the p-type, source-and-drain regions 10b from the tilt-angled ion implantation. The resist mask 36 herein is approx. 120 nm high, and the opening 36a has an edge 80 nm away from the edge of the gate electrode 6b. In alignment of a reticle for forming the opening 36a by photolithography, employing the gate electrode as an alignment mark, in place of a mark formed in the STI process, can successfully reduce mis-alignment. A p-type impurity, which is boron (B) herein, is implanted into the pMOS region 12 at an ion acceleration energy of 2 keV, a dose of $2.5 \times 10^{14}/cm^2$, and an angle of incidence of 45°. The implantation is repeated four times from directions differing from each other (four different directions inclined by 45° away from the direction of gate length).

A single ion implantation according to the above conditions results in introduction of the impurity over the area extending from the top surface to the upper portion of one side face of the gate electrode 6b in an amount equivalent to that possibly attained by ion implantations at an angle of incidence of 0° repeated twice. On the other hand, a pair of p-type, source-and-drain regions 10b are protected by the resist mask 36 against the ion implantation, and are thus prevented from being implanted with the impurity.

Next, the resist mask 36 is removed typically by ashing, and, as shown in FIG. 33D, a resist mask 41 is formed so as to cover the pMOS region 12, and an n-type impurity, which is phosphorus (P) herein, is introduced by ion implantation into the nMOS region 11 at an ion acceleration energy of 8 keV and a dose of $6 \times 10^{15}/cm^2$, to thereby form n-type, source-and-drain regions 43a.

Figure 34A:
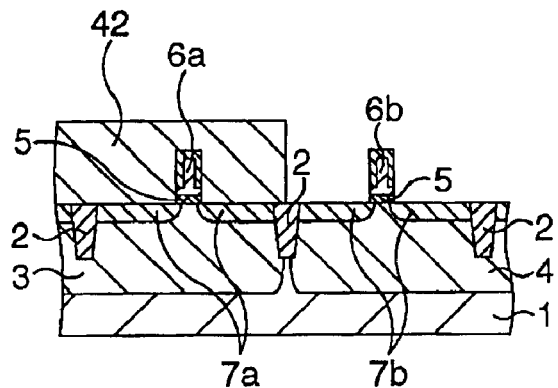
FIGS. 34A to 34C are schematic sectional views sequentially showing process steps as continued from FIG. 33D.

Next, the resist mask 41 is removed typically by ashing, and, as shown in FIG. 34A, a resist mask 42 is formed so as to cover the nMOS region 11, and an p-type impurity, which is boron (B) herein, is introduced by ion implantation into the pMOS region 12 at an ion acceleration energy of 4 keV and a dose of $3 \times 10^{15}/cm^2$, to thereby form p-type, source-and-drain regions 43b.

Figure 34B:
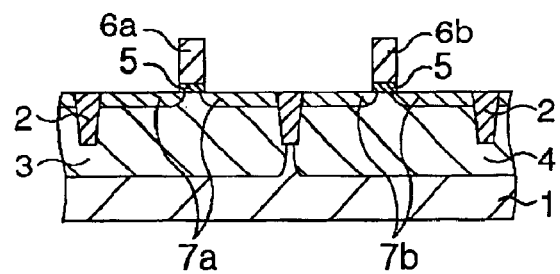
Figure 34C:
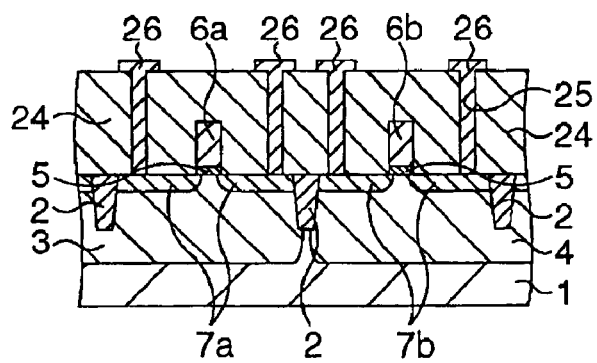

Next, the resist mask 42 is removed typically by ashing, and, as shown in FIG. 34B, the semiconductor substrate 1 is then annealed by RTA (rapid thermal annealing) at 1,030° C. for 1 second to thereby thoroughly activate the impurities incorporated into the gate electrodes 6a, 6b and the source-and-drain regions 43a, 43b.

An interlayer insulating film 24 is deposited over the entire surface, wirings 26 are formed so as to make contact through contact holes 25, and a CMOS transistor is completed after some additional post-processes.

As has been described in the above, the ninth embodiment is successful in controlling the impurity concentration of the gate electrodes 6a, 6b higher than that of the source-and-drain regions 10a, 10b by carrying out the ion implantation from four inclined directions at an angle of incidence of 45°. In the ninth embodiment, the impurity concentration of the gate electrodes 6a, 6b can be raised without altering the general impurity concentration of the source-and-drain regions 10a, 10b. The ninth embodiment is thus to provide a highly-reliable CMOS transistor having an improved gate capacitance and short-channel resistance without anticipating fluctuation in the threshold voltage due to variation in shape of the gate electrode, by a less number of process steps.

Moreover, in the tilt-angled ion implantation, the source-and-drain regions 10a, 10b are successfully prevented from being implanted with the impurities by virtue of the resist masks 35, 36, and only the gate electrodes 6a, 6b are implanted with impurity ions. This strongly ensures the gate electrodes 6a, 6b to have a higher impurity concentration than the source-and-drain regions 10a, 10b have.

The amount of dose in the gate electrodes and source-and-drain regions according to the first through ninth embodiments are now listed in Table 1 below.

First, L2' is determined so that the projection range of the impurity implanted along a direction inclined in the over-etched sidewall will be longer than Rp1 based on the shape of the over-etched sidewall. Next, L2''' is determined so as to allow the projection range of the impurity implanted along a direction inclined in the gate electrode impurity will be longer than Rp3. L2' and L2''' are then compared, and the shorter one of which is defined as L2. Assuming now a

TABLE 1

|  | nMOS | | pMOS | |
| --- | --- | --- | --- | --- |
|  | Dose in gate | Dose in S/D | Dose in gate | Dose in S/D |
| Prior art | $6 \times 10^{15}$ (1/cm$^2$) | $6 \times 10^{15}$ | $3 \times 10^{15}$ | $3 \times 10^{15}$ |
| 1st embodiment | $7.5 \times 10^{15}$(1a) | $6 \times 10^{15}$(1b) | $3.75 \times 10^{15}$(1c) | $3 \times 10^{15}$(1d) |
| Modified example | $7.5 \times 10^{15}$(2a) | $6 \times 10^{15}$(2b) | $3.75 \times 10^{15}$(2c) | $3 \times 10^{15}$(2d) |
| 3rd embodiment | $9 \times 10^{15}$(3a) | $6 \times 10^{15}$(3b) | $4.5 \times 10^{15}$(3c) | $3 \times 10^{15}$(3d) |
| 4th embodiment | $8 \times 10^{15}$(4a) | $6 \times 10^{15}$(4b) | $4 \times 10^{15}$(4c) | $3 \times 10^{15}$(4d) |
| Modified example | $8 \times 10^{15}$(5a) | $6 \times 10^{15}$(5b) | $4 \times 10^{15}$(5c) | $3 \times 10^{15}$(5d) |
| 5th embodiment | $1 \times 10^{16}$(6a) | $6 \times 10^{15}$(6b) | $5 \times 10^{15}$(6c) | $3 \times 10^{15}$(6d) |

| | | | | |
| --- | --- | --- | --- | --- |
| (1a) | $4.5 \times 10^{15} + 5 \times 10^{14} \times 6$ | (1b) | $4.5 \times 10^{15} + 5 \times 10^{14} \times 3$ | |
| (2a) | $5.5 \times 10^{15} + 5 \times 10^{14} \times 4$ | (2b) | $5.5 \times 10^{15} + 5 \times 10^{14} \times 1$ | |
| (3a) | $5 \times 10^{15} + 5 \times 10^{14} \times 8$ | (3b) | $5 \times 10^{15} + 5 \times 10^{14} \times 2$ | |
| (4a) | $5 \times 10^{15} + 5 \times 10^{14} \times 6$ | (4b) | $5 \times 10^{15} + 5 \times 10^{14} \times 2$ | |
| (5a) | $6 \times 10^{15} + 5 \times 10^{14} \times 4$ | (5b) | $6 \times 10^{15}$ | |
| (6a) | $6 \times 10^{15} + 5 \times 10^{14} \times 8$ | (6b) | $6 \times 10^{15}$ | |
| (1c) | $2.25 \times 10^{15} + 2.5 \times 10^{14} \times 6$ | (1d) | $2.25 \times 10^{15} + 2.5 \times 10^{14} \times 3$ | |
| (2c) | $2.75 \times 10^{15} + 2.5 \times 10^{14} \times 4$ | (1d) | $2.75 \times 10^{15} + 2.5 \times 10^{14} \times 1$ | |
| (3c) | $2.5 \times 10^{15} + 2.5 \times 10^{14} \times 8$ | (1d) | $2.5 \times 10^{15} + 2.5 \times 10^{14} \times 2$ | |
| (4c) | $2.5 \times 10^{15} + 2.5 \times 10^{14} \times 6$ | (1d) | $2.5 \times 10^{15} + 2.5 \times 10^{14} \times 2$ | |
| (5c) | $3 \times 10^{15} + 2.5 \times 10^{14} \times 4$ | (1d) | $3 \times 10^{15}$ | |
| (6c) | $3 \times 10^{15} + 2.5 \times 10^{14} \times 8$ | (1d) | $3 \times 10^{15}$ | |

Specific Alignment Conditions for Resist Mask and Gate Electrode Suitable for Tilt-angled Ion Implantation Next paragraphs will describe alignment rules for the resist mask for the tilt-angled ion implantation, and alignment rules for the gate electrode taking the tilt-angled ion implantation into account, which are applicable to the fourth through ninth embodiments.

[Fourth and Fifth Embodiments]

FIG. 35 shows a method of determining an alignment rule of a resist masks 31 through 34 with respect to the gate electrodes 6a, 6b (simply referred to as "gate electrode", hereinafter), which is applicable to the fourth and fifth embodiments. Rp1 represents the length of the sidewalls 9a, 9b (simply referred to as "sidewall" hereinafter) sufficient for shielding impurity implanted along direction inclined, and Rp2 represents the length of the resist mask sufficient for shielding impurity implanted along direction inclined.

First, L1' is determined so that the projection range of the impurity implanted along a direction inclined in the sidewall will be longer than Rp1 based on the shape of the over-etched sidewall. Next, L1'' is determined so that the projection range of the impurity implanted along a direction inclined in the resist mask will be longer than Rp2. L1' and L1'' are then compared, the shorter one of which is defined as L1, and a rule for the distance between the gate electrode and resist mask can be given as L1-ΔL, where ΔL is an alignment error between the gate electrode and resist pattern.

Figure 36:
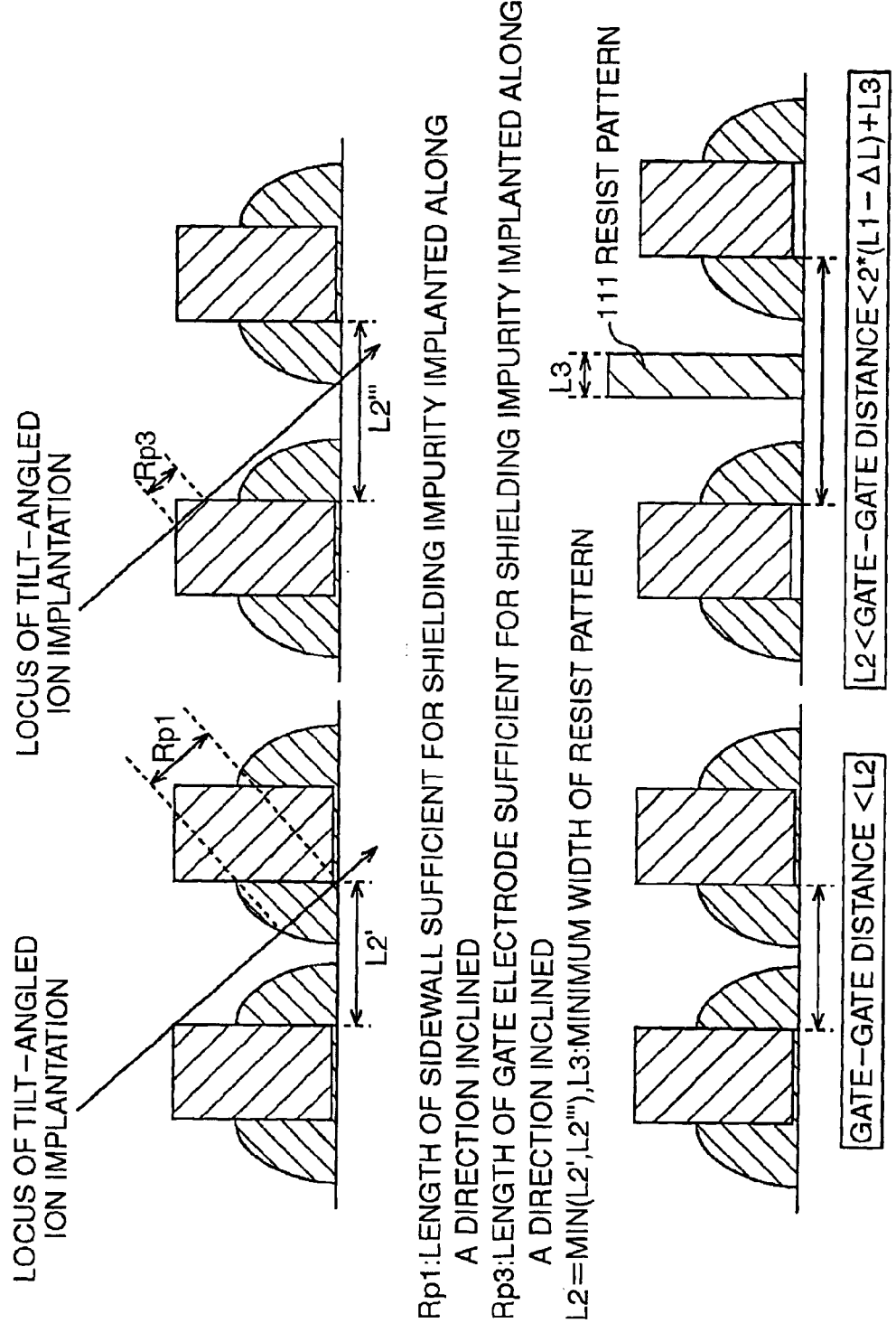
FIG. 36 is a schematic drawing for explaining a method of determining an alignment rule of a resist mask with respect to the aligned gate electrodes in the fourth and fifth embodiments.
Figure 37:
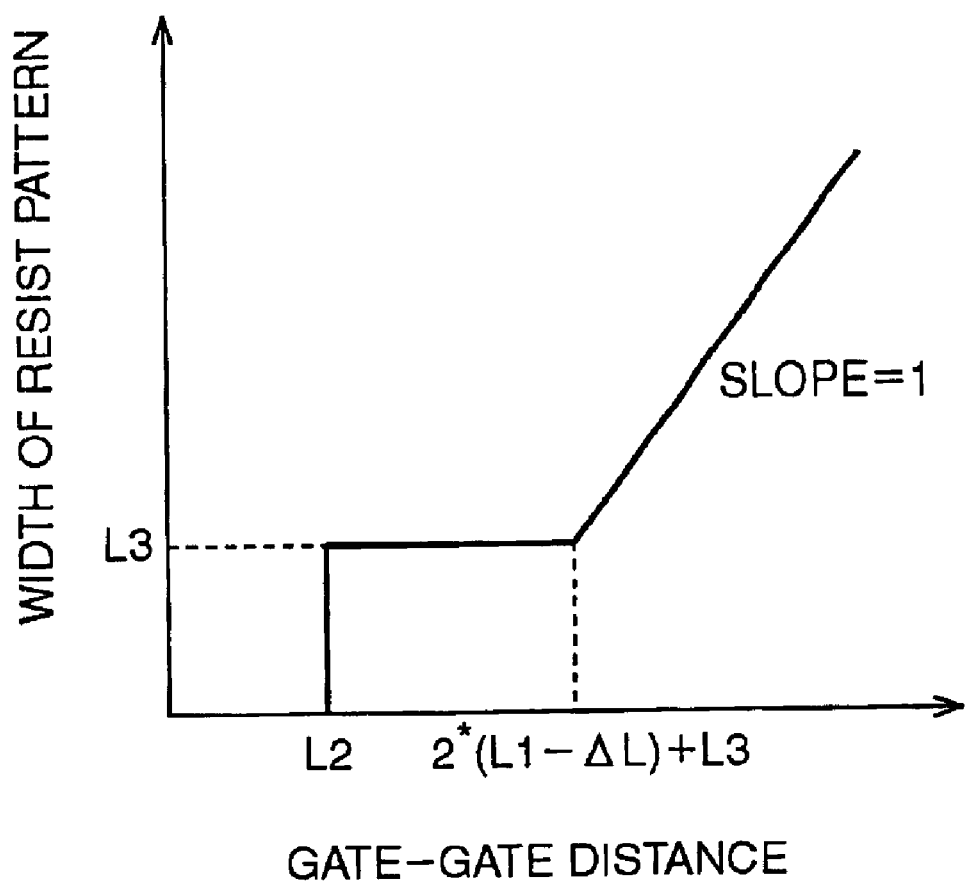
FIG. 37 is a characteristic chart showing a method of determining an alignment rule of a resist mask with respect to the aligned gate electrodes in the fourth and fifth embodiments.

FIGS. 36 and 37 show a method of determining an alignment rule for the case with aligned gate electrodes in the fourth and fifth embodiments.

Rp3 herein represents the length of the gate electrode sufficient for shielding impurity implanted along direction inclined.

minimum formable width of a resist pattern 111 as L3. If the distance between the adjacent gate electrodes is longer than 2(L1-ΔL)+L3, the resist pattern 111 can be formed between the adjacent gate electrodes according to the rule shown in FIG. 37.

On the other hand, if the distance between the adjacent gate electrodes is shorter than 2(L1-ΔL)+L3 but longer than L2, it is necessary to fill the space between the adjacent gate electrodes with a resist pattern 111 having a width of L3. If the distance between the adjacent gate electrodes is shorter than L2, there is no need to form the resist pattern 111 between the adjacent gate electrodes.

[Sixth through Ninth Embodiments]

FIG. 38 shows a method of determining an alignment rule of a resist masks 35 through 38, 41 and 42 with respect to the gate electrode, which is applicable to the sixth through ninth embodiments. Rp2 represents the length of the resist mask sufficient for shielding impurity implanted along direction inclined, and Rp3 represents the length of the gate electrode sufficient for shielding impurity implanted along direction inclined.

First, L1' is determined so that the projection range of the impurity implanted along a direction inclined in the resist mask will be longer than Rp2. Next, L1''' is determined so that the projection range of the impurity implanted along a direction inclined in the gate electrode will be longer than Rp3. L1'' and L1''' are then compared, the shorter one of which is defined as L1, and a rule for the distance between the gate electrode and resist mask can be given as L1-ΔL, where ΔL is an alignment error between the ate electrode and resist pattern.

Figure 40:
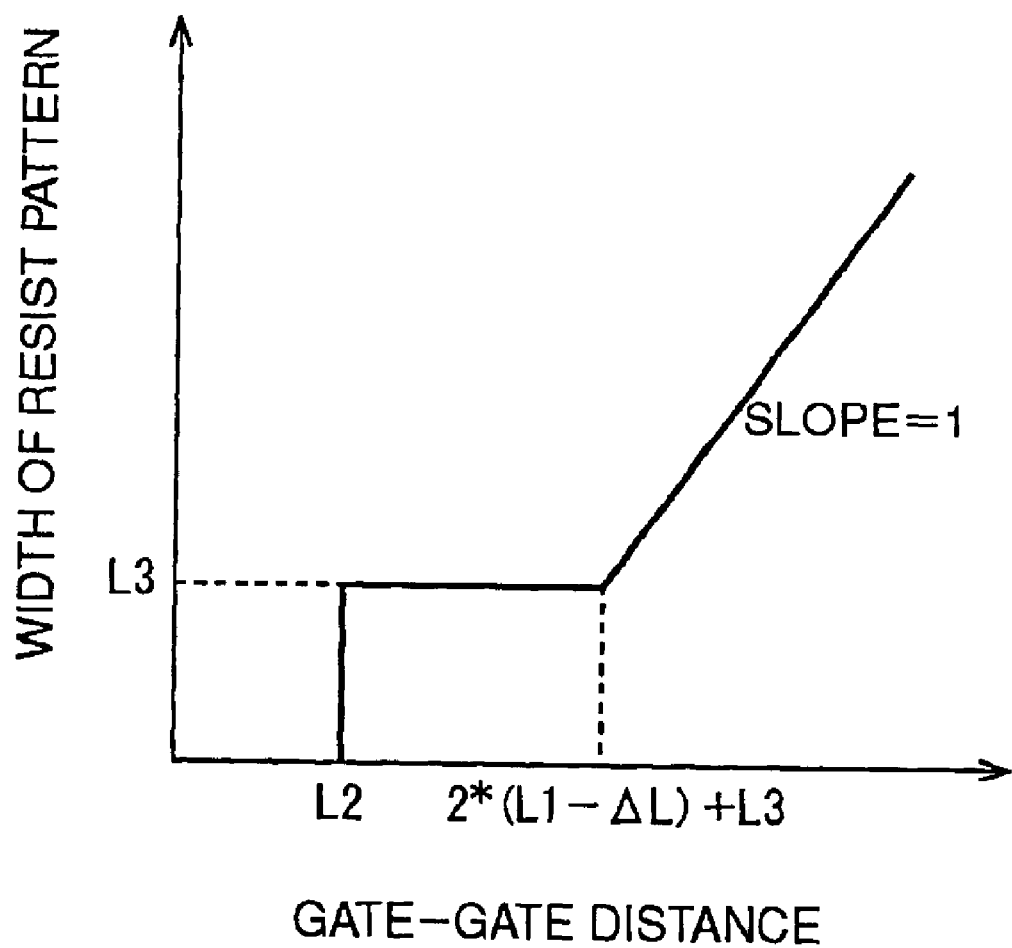
FIG. 40 is a characteristic chart showing a method of determining an alignment rule of a resist mask with respect to the aligned gate electrodes in the sixth through ninth embodiments.

FIGS. 39 and 40 show a method of determining a rule for the case with aligned gate electrodes in the sixth through ninth embodiments. Rp3 herein represents the length of the gate electrode sufficient for shielding impurity implanted along direction inclined.

First, L2 is determined so that the projection range of the impurity implanted along a direction inclined in the gate electrode will be longer than Rp3. If the distance between the adjacent gate electrodes is longer than 2(L1-ΔL)+L3, the resist pattern 111 as a part of the resist mask can be formed between the adjacent gate electrodes according to the rule shown in FIG. 40, where L3 is a minimum formable width of the resist pattern 111.

On the other hand, if the distance between the adjacent gate electrodes is shorter than 2(L1-ΔL)+L3 but longer than L2, it is necessary to fill the space between the adjacent gate electrodes with a resist pattern 111 having a width of L3. If the distance between the adjacent gate electrodes is shorter than L2, there is no need to form the resist pattern 111 between the adjacent gate electrodes.

(Other Embodiments)

This embodiment materializes a CAD software for producing a resist mask according to the rule explained referring to FIGS. 35 to 40. This makes it possible to readily produce a reticle for forming the resist mask which can prevent the impurity introduced along a direction tilt-angled from getting into the source-and-drain region. This can be realized by running a program stored in an RAM or ROM of a computer. Also such program and a computer-readable storage medium having recorded therein such program also fall within a scope of the present invention.

More specifically, the program is provided to a computer while being stored in a recording medium such as CD-ROM, or other various transmission media. The recording media, besides CD-ROM, capable of storing the program include flexible disk, hard disk, magnetic tape, magneto-optical disk and non-volatile memory card. On the other hand, the transmission media for the program include a communication medium (such as connected line such as using optical fiber, or radio line) in a computer network system (e.g., LAN, WAN such as the Internet, radio communication network), whereby program information is transmitted as being modulated by a carrier wave.

The aforementioned program fall within a scope of the present invention not only for the case where the functions of the above-described embodiments are materialized by the supplied program run on a computer, but also for the case where the functions of the above-described embodiments are realized by the program in cooperation with an OS (operating system) run on the computer or with any other application software, and for the case where the functions of the above-described embodiments are realized by the whole or a part of the program executed on a function expansion board or function expansion unit of the computer.

For example, FIG. 41 shows a block diagram of an internal constitution of a general personal user terminal device. In FIG. 41, reference numeral 1200 denotes computer PC. The PC 1200 has a CPU 1201, which is designed to execute a device control software stored in a ROM 1202 or a hard disk (HD) 1211, or supplied from a flexible disk drive (FD) 1212, so as to totally control the individual devices connected to a system bus.

What is claimed is:

1. A method of fabricating a semiconductor device comprising:

a first step of patterning a gate electrode above a semiconductor substrate having an element isolation structure previously formed therein;

a second step of forming sidewalls covering only on both side faces of said gate electrode;

a third step of removing the upper portion of said sidewalls to thereby expose a part of both side faces of said gate electrode; and a fourth step for introducing an impurity into said gate electrode along a direction tilt-angled to the surface of said semiconductor substrate.

2. The method of fabricating a semiconductor device according to claim 1, wherein, in said fourth step, the tilt-angle introduction of the impurity is carried out a plural number of times while varying the direction thereof.

3. The method of fabricating a semiconductor device according to claim 1, wherein said sidewalls and the element isolation structure formed in said semiconductor substrate are formed using different materials so as to allow said sidewalls and said element isolation structure to exhibit different etch rates in the removal of the upper portion of said sidewalls in said third step.

4. The method of fabricating a semiconductor device according to claim 1, wherein, after said fourth step, additional sidewalls are again formed so as to entirely cover both side faces of said gate electrode.

5. The method of fabricating a semiconductor device according to claim 3, wherein, after said fourth step, additional sidewalls are again formed so as to entirely cover both side faces of said gate electrode.

6. The method of fabricating a semiconductor device according to claim 1, wherein, in said fourth step, the tilt-angle introduction of the impurity is carried out in the presence of a resist mask having an opening formed in a size which ensures protection of areas for forming source-and-drain regions on both sides of said gate electrode from the tilt-angle introduction of the impurity.

7. The method of fabricating a semiconductor device according to claim 3, wherein, in said fourth step, the tilt-angle introduction of the impurity is carried out in the presence of a resist mask having an opening formed in a size which ensures protection of areas for forming source-and-drain regions on both sides of said gate electrode from the tilt-angle introduction of the impurity.

8. The method of fabricating a semiconductor device according to claim 1, further comprising:

a fifth step of introducing an impurity to a smaller depth into said areas for forming source-and-drain regions on both sides of said gate electrode, said fifth step being provided after said first step and before said second step; and a sixth step of introducing an impurity to a larger depth into said areas for forming source-and-drain regions, said sixth step being provided after said second step.

9. The method of fabricating a semiconductor device according to claim 4, further comprising:

a fifth step of introducing an impurity to a smaller depth into said areas for forming source-and-drain regions on both sides of said gate electrode, said fifth step being provided after said first step and before said second step; and a sixth step of introducing an impurity to a larger depth into said areas for forming source-and-drain regions, said sixth step being provided after said second step.

10. The method of fabricating a semiconductor device according to claim 6, further comprising:

a fifth step of introducing an impurity to a smaller depth into said areas for forming source-and-drain regions on both sides of said gate electrode, said fifth step being provided after said first step and before said second step; and a sixth step of introducing an impurity to a larger depth into said areas for forming source-and-drain regions, said sixth step being provided after said second step.

11. The method of fabricating a semiconductor device according to claim 8, wherein the tilt-angle introduction of the impurity in said fourth step is carried out at an ion acceleration energy lower than that in the introduction of the impurity in said sixth step.

12. The method of fabricating a semiconductor device according to claim 9, wherein the tilt-angle introduction of the impurity in said fourth step is carried out at an ion acceleration energy lower than that in the introduction of the impurity in said sixth step.

13. The method of fabricating a semiconductor device according to claim 10, wherein the tilt-angle introduction of the impurity in said fourth step is carried out at an ion acceleration energy lower than that in the introduction of the impurity in said sixth step.

14. The method of fabricating a semiconductor device according to claim 1, wherein, in said fourth step, said tilt-angle introduction of the impurity is carried out at an angle of 45°.

15. A method of fabricating a semiconductor device comprising:

a first step of patterning a gate electrode above a semiconductor substrate;

a second step of forming a mask having an opening which allows said gate electrode to be exposed therein; and a third step of introducing an impurity into said gate electrode along a direction tilt-angled to the surface of said semiconductor substrate, wherein in said second step, said opening of said mask is formed in a size which ensures protection of areas for forming source-and-drain regions on both sides of said gate electrode from the tilt-angle introduction of the impurity.

16. The method of fabricating a semiconductor device according to claim 15, further comprising:

a fourth step of introducing an impurity to a smaller depth into said areas for forming source-and-drain regions on both sides of said gate electrode, said fourth step being provided after the tilt-angle introduction of the impurity in the third step and is carried out in the presence of said mask used in said third step; and a fifth step of forming sidewalls only on both side faces of said gate electrode and introducing an impurity to a larger depth into said areas for forming source-and-drain regions.

17. The method of fabricating a semiconductor device according to claim 16, wherein the tilt-angle introduction of the impurity in said third step is carried out at an ion acceleration energy lower than that in the introduction of the impurity in said fifth step.

18. The method of fabricating a semiconductor device according to claim 15, wherein, in said third step, the tilt-angle introduction of the impurity is carried out at an angle of 45°.

* * * * *

UNITED STATES PATENT AND TRADEMARK OFFICE
CERTIFICATE OF CORRECTION

PATENT NO.       : 7,060,578 B2
APPLICATION NO.  : 10/648487
DATED            : June 13, 2006
INVENTOR(S)      : Shigeo Satoh et al.

It is certified that error appears in the above-identified patent and that said Letters Patent is hereby corrected as shown below:

In the Table 1
Please amend the Table 1 at Column 35 to read as follows

TABLE 1

|  | nMOS | | pMOS | |
|---|---|---|---|---|
|  | Dose in gate | Dose in S/D | Dose in gate | Dose in S/D |
| Prior art | $6 \times 10^{15}$ (1/cm$^2$) | $6 \times 10^{15}$ | $3 \times 10^{15}$ | $3 \times 10^{15}$ |
| 1st embodiment | $7.5 \times 10^{15}$(1a) | $6 \times 10^{15}$(1b) | $3.75 \times 10^{15}$(1c) | $3 \times 10^{15}$(1d) |
| Modified example | $7.5 \times 10^{15}$(2a) | $6 \times 10^{15}$(2b) | $3.75 \times 10^{15}$(2c) | $3 \times 10^{15}$(2d) |
| 3rd embodiment | $9 \times 10^{15}$(3a) | $6 \times 10^{15}$(3b) | $4.5 \times 10^{15}$(3c) | $3 \times 10^{15}$(3d) |
| 4th embodiment | $8 \times 10^{15}$(4a) | $6 \times 10^{15}$(4b) | $4 \times 10^{15}$(4c) | $3 \times 10^{15}$(4d) |
| Modified example | $8 \times 10^{15}$(5a) | $6 \times 10^{15}$(5b) | $4 \times 10^{15}$(5c) | $3 \times 10^{15}$(5d) |
| 5th embodiment | $1 \times 10^{16}$(6a) | $6 \times 10^{15}$(6b) | $5 \times 10^{15}$(6c) | $3 \times 10^{15}$(6d) |

(1a) $4.5 \times 10^{15} + 5 \times 10^{14} \times 6$
(2a) $5.5 \times 10^{15} + 5 \times 10^{14} \times 4$
(3a) $5 \times 10^{15} + 5 \times 10^{14} \times 8$
(4a) $5 \times 10^{15} + 5 \times 10^{14} \times 6$
(5a) $6 \times 10^{15} + 5 \times 10^{14} \times 4$
(6a) $6 \times 10^{15} + 5 \times 10^{14} \times 8$ (1b) $4.5 \times 10^{15} + 5 \times 10^{14} \times 3$
(2b) $5.5 \times 10^{15} + 5 \times 10^{14} \times 1$
(3b) $5 \times 10^{15} + 5 \times 10^{14} \times 2$
(4b) $5 \times 10^{15} + 5 \times 10^{14} \times 2$
(5b) $6 \times 10^{15}$
(6b) $6 \times 10^{15}$ (1c) $2.25 \times 10^{15} + 2.5 \times 10^{14} \times 6$
(2c) $2.75 \times 10^{15} + 2.5 \times 10^{14} \times 4$
(3c) $2.5 \times 10^{15} + 2.5 \times 10^{14} \times 8$
(4c) $2.5 \times 10^{15} + 2.5 \times 10^{14} \times 6$
(5c) $3 \times 10^{15} + 2.5 \times 10^{14} \times 4$
(6c) $3 \times 10^{15} + 2.5 \times 10^{14} \times 8$ (1d) $2.25 \times 10^{15} + 2.5 \times 10^{14} \times 3$
(2d) ~~(1d)~~ $2.75 \times 10^{15} + 2.5 \times 10^{14} \times 1$
(3d) ~~(1d)~~ $2.5 \times 10^{15} + 2.5 \times 10^{14} \times 2$
(4d) ~~(1d)~~ $2.5 \times 10^{15} + 2.5 \times 10^{14} \times 2$
(5d) ~~(1d)~~ $3 \times 10^{15}$
(6d) ~~(1d)~~ $3 \times 10^{15}$ Signed and Sealed this Fourteenth Day of November, 2006

JON W. DUDAS
*Director of the United States Patent and Trademark Office*